US012707787B2

(12) United States Patent
Kim et al.

(10) Patent No.: US 12,707,787 B2
(45) Date of Patent: Aug. 11, 2026

(54) PIXEL AND DISPLAY DEVICE HAVING THE SAME

(71) Applicant: Samsung Display Co., Ltd., Yongin-si (KR)

(72) Inventors: Jin Taek Kim, Yongin-si (KR); Veidhes Basrur, Yongin-si (KR); Ki Nyeng Kang, Yongin-si (KR); Ock Soo Son, Yongin-si (KR); Yong Tae Cho, Yongin-si (KR); Jong Hwan Cha, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 479 days.

(21) Appl. No.: 18/488,705

(22) Filed: Oct. 17, 2023

(65) Prior Publication Data

US 2024/0136488 A1 Apr. 25, 2024
US 2024/0234663 A9 Jul. 11, 2024

(30) Foreign Application Priority Data

Oct. 20, 2022 (KR) ........................ 10-2022-0135970

(51) Int. Cl.
*H10H 20/857* (2025.01)
*H10W 90/00* (2026.01)

(52) U.S. Cl.
CPC .......... *H10H 20/857* (2025.01); *H10W 90/00* (2026.01)

(58) Field of Classification Search
CPC ............. H10H 20/857; H10H 20/8314; H10H 20/851; H10H 29/142; H10W 90/00; H10D 86/441; H10K 59/122
See application file for complete search history.

(56) References Cited

U.S. PATENT DOCUMENTS

2021/0367024 A1* 11/2021 Kim ..................... H10K 59/131
2022/0122956 A1 4/2022 Yun et al.
2022/0190203 A1 6/2022 Kim et al.
2022/0223761 A1 7/2022 Park et al.
2022/0384402 A1 12/2022 Lee et al.

FOREIGN PATENT DOCUMENTS

EP 4075502 A1 10/2022
KR 10-2022-0085930 A 6/2022
WO WO 2021/071148 A1 4/2021

* cited by examiner

*Primary Examiner* — Anne M Hines
*Assistant Examiner* — Jose M Diaz
(74) *Attorney, Agent, or Firm* — Womble Bond Dickinson (US) LLP

(57) ABSTRACT

A pixel may include: an emission area and a non-emission area; a first bank in the non-emission area, the first bank including an opening corresponding to the emission area; a first electrode, a second electrode, and an intermediate electrode that are spaced from each other; light emitting elements in the emission area, each of the light emitting elements including one end portion electrically connected to one of the first electrode, the second electrode, or the intermediate electrode and an other end portion electrically connected to another one of the first electrode, the second electrode, or the intermediate electrode; and a sub-bank located in the opening of the first bank, the sub-bank being spaced from the first bank. The intermediate electrode may be around at least a portion of the sub-bank.

20 Claims, 22 Drawing Sheets

FIG. 12

PIXEL AND DISPLAY DEVICE HAVING THE SAME

CROSS-REFERENCE TO RELATED APPLICATION

This application claims priority to and the benefit of Korean Patent Application No. 10-2022-0135970 filed on Oct. 20, 2022, in the Korean Intellectual Property Office, the entire disclosure of which is incorporated by reference herein.

BACKGROUND

1. Field

The present disclosure generally relates to a pixel and a display device having the same.

2. Description of Related Art

Recently, as interest in information displays is increased, research and development of display devices have been continuously conducted.

SUMMARY

One or more embodiments of the present disclosure provide a pixel capable of improving reliability.

One or more embodiments of the present disclosure also provide a display device having the above-described pixel.

In accordance with one or more embodiments of the present disclosure, there is provided a pixel including: an emission area and a non-emission area; a first bank located in the non-emission area, the first bank including an opening corresponding to the emission area; a first electrode, a second electrode, and an intermediate electrode that are spaced from each other; light emitting elements in the emission area, each of the light emitting elements including one end portion electrically connected one of the first electrode, the second electrode, or the intermediate electrode and an other end portion electrically connected to another one of the first electrode, the second electrode, or the intermediate electrode; and a sub-bank located in the opening of the first bank, the sub-bank being spaced from the first bank. The intermediate electrode is around at least a portion of the sub-bank.

The intermediate electrode may detour around the sub-bank.

The first bank and the sub-bank may include a same material.

The intermediate electrode may include a cavity corresponding to the sub-bank, and entirely surrounds the sub-bank.

In a plan view, the sub-bank may be located in the cavity and is in contact with at least a portion of the intermediate electrode.

The intermediate electrode may be spaced from the sub-bank and does not to overlap with the sub-bank.

The intermediate electrode may include a first intermediate electrode, a second intermediate electrode, and a third intermediate electrode that are spaced from each other.

The light emitting elements may include: a first light emitting element including a first end portion electrically connected to the first electrode and a second end portion electrically connected to the first intermediate electrode; a second light emitting element including a first end portion electrically connected to the first intermediate electrode and a second end portion electrically connected to the second intermediate electrode; a third light emitting element including a first end portion electrically connected to the second intermediate electrode and a second end portion electrically connected to the third intermediate electrode; and a fourth light emitting element including a first end portion electrically connected to the third intermediate electrode and a second end portion electrically connected to the second electrode.

The first intermediate electrode may include a first part facing the first electrode, a second part facing the second intermediate electrode, and a third part connecting the first part and the second part to each other, in a plan view. The second intermediate electrode may include a fourth part facing the second part of the first intermediate electrode, a fifth part facing the third intermediate electrode, and a sixth part connecting the fourth part and the fifth part to each other, in the plan view. The third intermediate electrode may include a seventh part facing the fifth part of the second intermediate electrode, an eighth part facing the second electrode, and a ninth part connecting the seventh part and the eighth part to each other, in the plan view, and wherein each of the third part of the first intermediate electrode and the ninth part of the third intermediate electrode detour around the sub-bank.

The sub-bank may include a first sub-bank that corresponds to the third part of the first intermediate electrode and a second sub-bank that corresponds to the ninth part of the third intermediate electrode. The first sub-bank and the second sub-bank may be spaced from each other, and have a shape isolated in the emission area.

The third part of the first intermediate electrode may include a first cavity corresponding to the first sub-bank, and the ninth part of the third intermediate electrode may include a second cavity corresponding to the second sub-bank.

The sub-bank may correspond to the third part of the first intermediate electrode and the ninth part of the third intermediate electrode. In the plan view, the third part of the first intermediate electrode may detour around one edge of the sub-bank, and the ninth part of the third intermediate electrode may detour around an other edge of the sub-bank.

The pixel may further include: a first alignment electrode overlapping the first electrode, the second part of the first intermediate electrode, one area of the third part of the first intermediate electrode, the fifth part of the second intermediate electrode, the eighth part of the third intermediate electrode, and one area of the ninth part of the third intermediate electrode; a second alignment electrode overlapping the first part of the first intermediate electrode, another area of the third part of the first intermediate electrode, and the fourth part of the second intermediate electrode; and another second alignment electrode overlapping the seventh part of the third intermediate electrode, another area of the ninth part of the third intermediate electrode, and the second electrode.

The pixel may further include: a color conversion layer on the first and second electrodes and the intermediate electrode, the color conversion layer in the emission area corresponds to the light emitting element, the color conversion layer including color conversion particles; a second bank on the first bank in the non-emission area, the second bank surrounding the color conversion layer; and a color filter layer on the color conversion layer, and configured to allow light emitted from the color conversion layer to be selectively transmitted therethrough.

In accordance with one or more embodiments of the present disclosure, there is provided a pixel including: an emission area and a non-emission area; a first bank located in the non-emission area; a protrusion part integrally formed with the first bank, the protrusion part protruding to the emission area from the first bank; a first electrode, a second electrode, and an intermediate electrode that are spaced from each other; and light emitting elements, each of the light emitting elements including one end portion electrically connected one of the first electrode, the second electrode, or the intermediate electrode and an other end portion electrically connected to another one of the first electrode, the second electrode, or the intermediate electrode. The intermediate electrode surrounds at least a portion of the protrusion part.

The intermediate electrode may detour around the protrusion part.

The protrusion part may include a first protrusion part protruding to the emission area from one side of the first bank and a second protrusion part protruding to the emission area from an other side facing the one side of the first bank. The first protrusion part and the second protrusion part may be spaced from each other.

The intermediate electrode may include a first intermediate electrode, a second intermediate electrode, and a third intermediate electrode that are spaced from each other. The first intermediate electrode may include a first part spaced from the first electrode, a second part spaced from the second intermediate electrode, and a third part connecting the first part and the second part to each other, in a plan view. The second intermediate electrode may include a fourth part spaced from the second part of the first intermediate electrode, a fifth part spaced from the third intermediate electrode, and a sixth part connecting the fourth part and the fifth part to each other, in the plan view. The third intermediate electrode may include a seventh part spaced from the fifth part of the second intermediate electrode, an eighth part spaced from the second electrode, and a ninth part connecting the seventh part and the eighth part to each other, in the plan view.

The third part of the first intermediate electrode may detour around the first protrusion part, and the ninth part of the third intermediate electrode may detour around the second protrusion part.

The light emitting elements may include: a first light emitting element including a first end portion electrically connected to the first electrode and a second end portion electrically connected to the first part of the first intermediate electrode; a second light emitting element including a first end portion electrically connected to the second part of the first intermediate electrode and a second end portion electrically connected to the fourth part of the second intermediate electrode; a third light emitting element including a first end portion electrically connected to the fifth part of the second intermediate electrode and a second end portion electrically connected to the seventh part of the third intermediate electrode; and a fourth light emitting element including a first end portion electrically connected to the eighth part of the third intermediate electrode and a second end portion electrically connected to the second electrode.

The pixel may further include: a first sub-electrode at a same layer as the first part of the first intermediate electrode and electrically connected to the first part; a second sub-electrode at a same layer as the fourth part of the second intermediate electrode and electrically connected to the fourth part; a third sub-electrode at a same layer as the seventh part of the third intermediate electrode and electrically connected to the seventh part; and a fourth sub-electrode at a same layer as the second electrode and electrically connected to the second electrode. The first, second, third, and fourth sub-electrodes overlap the first bank.

In accordance with one or more embodiments of the present disclosure, there is provided a display device including: a plurality of pixels on a substrate. Each of the plurality of pixels includes: an emission area and a non-emission area; a first bank located in the non-emission area, the first bank including an opening corresponding to the emission area; a first electrode, a second electrode, and an intermediate electrode that are spaced from each other; light emitting elements in the emission area, each of the light emitting elements including one end portion electrically connected one of the first electrode, the second electrode, and the intermediate electrode and an other end portion electrically connected to another one of the first electrode, the second electrode, and the intermediate electrode; and a sub-bank located in the opening of the first bank and spaced from the first bank. The intermediate electrode may detour around the sub-bank.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that the present disclosure will be thorough and complete, and will fully convey the scope of one or more embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

FIGS. 11 and 12 illustrate a pixel in accordance with one or more embodiments of the present disclosure, and are schematic cross-sectional views corresponding to the line I-I' shown in FIG. 5.

DETAILED DESCRIPTION

Figure 1:
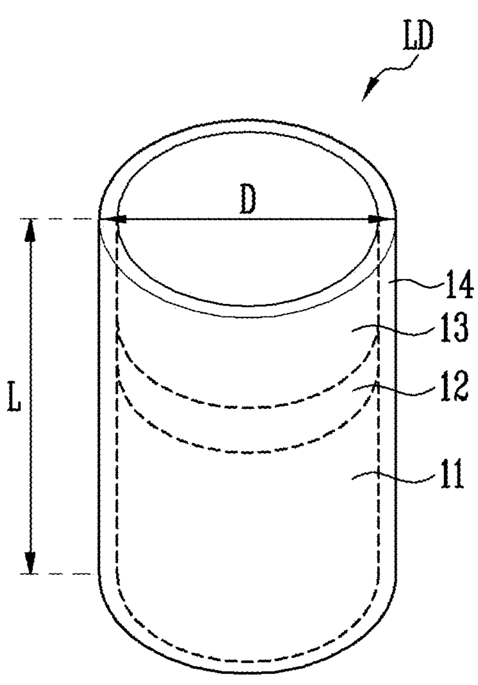
FIG. 1 is a schematic perspective view illustrating a light emitting element in accordance with one or more embodiments of the present disclosure.

The present disclosure may apply various changes and different shape, therefore only illustrate in detail with particular examples. However, the examples do not limit to certain shapes but apply to all the change and equivalent material and replacement. The drawings included are illustrated a fashion where the figures are expanded for the better understanding.

Like numbers refer to like elements throughout. In the drawings, the thickness of certain lines, layers, components, elements or features may be exaggerated for clarity. It will be understood that, although the terms "first," "second," etc. may be used herein to describe various elements, these elements should not be limited by these terms. These terms are only used to distinguish one element from another element. Thus, a "first" element discussed below could also be termed a "second" element without departing from the teachings of the present disclosure. As used herein, the singular forms are intended to include the plural forms as well, unless the context clearly indicates otherwise.

It will be further understood that the terms "includes" and/or "including," when used in this specification, specify the presence of stated features, integers, steps, operations, elements, and/or components, but do not preclude the presence and/or addition of one or more other features, integers, steps, operations, elements, components, and/or groups thereof. Further, an expression that an element such as a layer, region, substrate or plate is placed "on" or "above" another element indicates not only a case where the element is placed "directly on" or "just above" the other element but also a case where a further element is interposed between the element and the other element. On the contrary, an expression that an element such as a layer, region, substrate or plate is placed "beneath" or "below" another element indicates not only a case where the element is placed "directly beneath" or "just below" the other element but also a case where a further element is interposed between the element and the other element.

In this specification, it will be understood that, when an element (for example, a first element) is "(operatively or communicatively) coupled with/to" or "connected to" another element (for example, a second element), the element may be directly coupled with/to another element, and there may be an intervening element (for example, a third element) between the element and another element. Also, in this specification, the term "connection" or "coupling" may inclusively mean connection or physical and/or electrical coupling.

Hereinafter, one or more embodiments of the present disclosure and items required for those skilled in the art to easily understand the content of the present disclosure will be described in detail with reference to the accompanying drawings. In the following description, singular forms in the present disclosure are intended to include the plural forms as well, unless the context clearly indicates otherwise.

Figure 2:
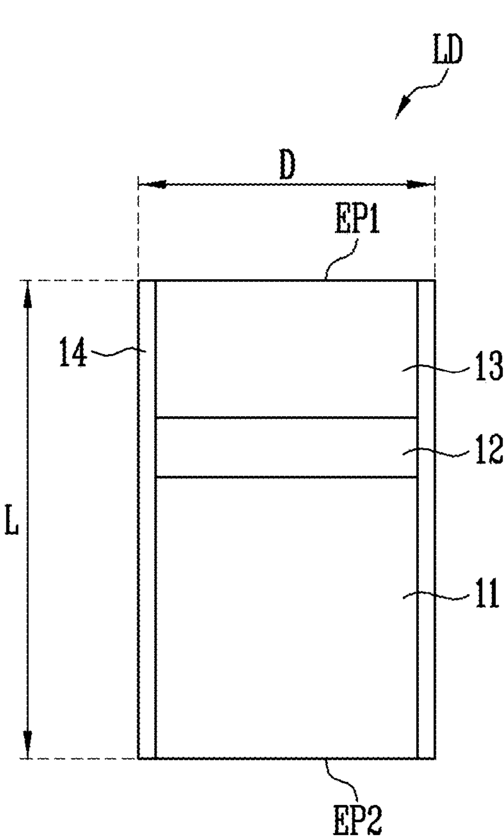
FIG. 2 is a schematic cross-sectional view of the light emitting element shown in FIG. 1.

FIG. 1 is a schematic perspective view illustrating a light emitting element LD in accordance with one or more embodiments of the present disclosure. FIG. 2 is a schematic cross-sectional view of the light emitting element LD shown in FIG. 1.

Referring to FIGS. 1 and 2, the light emitting element LD may include a first semiconductor layer 11, a second semiconductor layer 13, and an active layer 12 interposed between the first and second semiconductor layers 11 and 13. In an example, the light emitting element LD may be implemented with a light emitting stack structure (or stack pattern) in which the first semiconductor layer 11, the active layer 12, and the second semiconductor layer 13 are sequentially stacked. However, the kind and/or shape of the light emitting element LD are not limited to the embodiment shown in FIG. 1.

The light emitting element LD may be provided in a shape extending in one direction. When assuming that an extending direction of the light emitting element LD is a length direction, the light emitting element LD may include a first end portion EP1 and a second end portion EP2, which are opposite each other along the length direction. One semiconductor layer selected from the first semiconductor layer 11 and the second semiconductor layer 13 may be disposed at the first end portion EP1 of the light emitting element LD, and the other semiconductor layer selected from the first semiconductor layer 11 and the second semiconductor layer 13 may be disposed at the second end portion EP2 of the light emitting element LD. In an example, the second semiconductor layer 13 (or a p-type semiconductor layer) may be disposed at the first end portion EP1 of the light emitting element LD, and the first semiconductor layer 11 (or an n-type semiconductor layer) may be disposed at the second end portion EP2 of the light emitting element LD.

The light emitting element LD may be provided in various shapes. In an example, the light emitting element LD may have a rod-like shape, a bar-like shape, a pillar-like shape, or the like, which is long in its length direction (i.e., its aspect ratio is greater than 1) as shown in FIG. 1. In another example, the light emitting element LD may have a rod-like shape, a bar-like shape, a pillar-like shape, or the like, which is short in its length direction (i.e., its aspect ratio is smaller than 1). In still another example, the light emitting element LD may have a rod-like shape, a bar-like shape, a pillar-like shape, or the like, of which aspect ratio is 1.

The light emitting element LD may include, for example, a light emitting diode (LED) manufactured small enough to have a diameter D and/or a length L to a degree of a nano scale (or nanometers) to a micro scale (micrometers).

In case that the light emitting element LD is long in its length direction (e.g., its aspect ratio is greater than 1), the diameter D of the light emitting element LD may be about 0.5 μm to about 6 μm, and the length L of the light emitting element LD may be about 1 μm to about 10 μm. However, the diameter D and the length L of the light emitting element LD are not limited thereto, and the size of the light emitting element LD may be changed to accord with requirement conditions (or design conditions) of a lighting device or a self-luminous display device, to which the light emitting element LD is applied.

The first semiconductor layer 11 may include, for example, at least one n-type semiconductor layer. For example, the first semiconductor layer 11 may include one or more semiconductor materials from among InAlGaN, GaN, AlGaN, InGaN, AlN, and/or InN, and may include an n-type semiconductor layer doped with a first conductive dopant (or n-type dopant) such as Si, Ge, or Sn. However, the material constituting the first semiconductor layer 11 is not limited thereto. In addition, the first semiconductor layer 11 may be configured with various materials.

The active layer 12 is formed on the first semiconductor layer 11, and may be formed in a single or multiple quantum well structure. In an example, when the active layer 12 is formed in the multiple quantum well structure, a barrier layer, a strain reinforcing layer, and a well layer, which constitute one unit, may be periodically and repeatedly stacked in the active layer 12. However, the structure of the active layer 12 is not limited to the above-described embodiment.

The active layer 12 may emit light having a wavelength of 400 nm to 900 nm, and use a double hetero structure. In one or more embodiments, a clad layer doped with a conductive dopant may be formed on the top and/or the bottom of the active layer 12 along the length direction of the light emitting element LD. In an example, the clad layer may be formed as an AlGaN layer or InAlGaN layer. In some embodiments, a material such as AlGaN or AlInGaN may be used to form the active layer 12. In addition, the active layer 12 may be configured with various materials. The active layer 12 may include a first surface in contact with the first semiconductor layer 11 and a second surface in contact with the second semiconductor layer 13.

In case that an electric field having a suitable voltage (e.g., a predetermined voltage) or more is applied between both the end portions of the light emitting element LD, the light emitting element LD emits light as electron-hole pairs are combined in the active layer 12. The light emission of the light emitting element LD is controlled by using such a principle, so that the light emitting element LD can be used as a light source (or light emitting source) for various light emitting devices, including a pixel of a display device.

The second semiconductor layer 13 is formed on the second surface of the active layer 12, and may include a semiconductor layer having a type different from that of the first semiconductor layer 11. In an example, the second semiconductor layer 13 may include at least one p-type semiconductor material. For example, the second semiconductor layer 13 may include at least one semiconductor material from among InAlGaN, GaN, AlGaN, InGaN, AlN, and InN, and include a p-type semiconductor layer doped with a second conductive dopant (or p-type dopant) such as Mg, Zn, Ca, Sr, or Ba. However, the material constituting the second semiconductor layer 13 is not limited thereto. In addition, the second semiconductor layer 13 may be configured with various materials.

The first semiconductor layer 11 and the second semiconductor layer 13 may have different thicknesses in the length direction of the light emitting element LD. In an example, the first semiconductor layer 11 may have a thickness relatively thicker than that of the second semiconductor layer 13 along the length direction of the light emitting element LD. Accordingly, the active layer 12 of the light emitting element LD may be located more adjacent to an upper surface of the second semiconductor layer 12 than a lower surface of the first semiconductor layer 11. The above-described first semiconductor layer 11 may be located at the second end portion EP2 of the light emitting element LD, and the second semiconductor layer 13 may be located at the first end portion EP1 of the corresponding light emitting element LD.

Although a case where each of the first semiconductor layer 11 and the second semiconductor layer 13 is configured with one layer is illustrated in FIGS. 1 and 2, the present disclosure is not limited thereto. In one or more embodiments, each of the first semiconductor layer 11 and the second semiconductor layer 13 may further include at least one layer, e.g., a clad layer and/or a Tensile Strain Barrier Reducing (TSBR) layer according to the material of the active layer 12. The TSBR layer may be a strain reducing layer disposed between semiconductor layers having different lattice structures to perform a buffering function for reducing a lattice constant difference, but the present disclosure is not limited thereto. The TSBR may be configured with a p-type semiconductor layer such as p-GAInP, p-AlInP or p-AlGaInP, but the present disclosure is not limited thereto.

In one or more embodiments, the light emitting element LD may further include a contact electrode (hereinafter, referred to as a "first contact electrode") disposed on the top of the second semiconductor layer 13, in addition to the first semiconductor layer 11, the active layer 12, and the second semiconductor layer 13, which are described above. In other embodiments, the light emitting element LD may further include another contact electrode (hereinafter, referred to as a "second contact electrode") disposed at one end of the first semiconductor layer 11.

Each of the first and second contact electrodes may be an ohmic contact electrode, but the present disclosure is not limited thereto. In one or more embodiments, each of the first and second contact electrodes may be a Schottky contact electrode. The first and second contact electrodes may include a conductive material. For example, the first and second contact electrodes may include an opaque metal using one or mixture of chromium (Cr), titanium (Ti), aluminum (Al), gold (Au), nickel (Ni), and any oxide or alloy thereof, but the present disclosure is not limited thereto. In one or more embodiments, the first and second contact electrodes may include a transparent conductive oxide such as indium tin oxide (ITO), indium zinc oxide (IZO), zinc oxide ($ZnO_x$), indium gallium zinc oxide (IGZO), or indium tin zinc oxide (ITZO). The zinc oxide ($ZnO_x$) may be zinc oxide (ZnO) and/or zinc peroxide ($ZnO_2$).

Materials respectively included in the first and second contact electrodes may be identical to or different from each other. The first and second contact electrodes may be substantially transparent or translucent.

In one or more embodiments, the light emitting element LD may further include an insulating film 14. However, in one or more embodiments, the insulating film 14 may be omitted, and may be provided to cover only portions of the first semiconductor layer 11, the active layer 12, and the second semiconductor layer 13.

The insulating film 14 may prevent an electrical short circuit that may occur when the active layer 12 is in contact with a conductive material in addition to the first semiconductor layer 11 and the second semiconductor layer 13. Also, the insulating film 14 reduces or minimizes a surface defect of the light emitting element LD, thereby improving the lifetime and light emission efficiency of the light emitting element LD. Also, when a plurality of light emitting elements LD are densely disposed, the insulating film 14 can prevent an unwanted short circuit that may occur between the light emitting elements LD. Whether the insulating film is provided is not limited as long as the active layer 12 can prevent occurrence of a short circuit with external conductive material.

The insulating film 14 may be provided in a shape entirely surrounding the outer surface (e.g., the outer peripheral or circumferential surface) of the light emitting stack structure including the first semiconductor layer 11, the active layer 12, and the second semiconductor layer 13. As can be seen in FIG. 1, the insulating film 14 does not cover the top and bottom surfaces of the light emitting element LD. However, the present disclosure is not limited thereto.

Although a case where the insulating film 14 is provided in a shape entirely surrounding the outer surface (e.g., the outer peripheral or circumferential surface) of each of the first semiconductor layer 11, the active layer 12, and the second semiconductor layer 13 is described in the above-described embodiment, the present disclosure is not limited thereto. In one or more embodiments, when the light emitting element LD includes the first contact electrode, the insulating film 14 may entirely surround the outer surface (e.g., the outer peripheral or circumferential surface) of each of the first semiconductor layer 11, the active layer 12, the second semiconductor layer 13, and the first contact electrode. In other embodiments, the insulating film 14 may not entirely surround the outer surface (e.g., the outer peripheral or circumferential surface) of the first contact electrode, or may be around (e.g., may surround) only a portion of the outer surface (e.g., the outer peripheral or circumferential surface) of the first contact electrode and may not be around (e.g., may not surround) the other portion of the outer surface (e.g., the outer peripheral or circumferential surface) of the first contact electrode. In one or more embodiments, when the first contact electrode is disposed at the first end portion EP1 of the light emitting element LD and the second contact electrode is disposed at the second end portion EP2 of the light emitting element LD, the insulating film 14 may expose at least one area of each of the first and second contact electrodes.

The insulating film 14 may include a transparent insulating material. Various materials having insulating properties may be used as the material of the insulating film 14.

The insulating film 14 may be provided in the form of a single layer or be provided in the form of a multi-layer including at least two layers. In an example, when the insulating film 14 may be configured as a double layer including a first insulating layer and a second insulating layer, which are sequentially stacked, the first insulating layer and the second insulating layer may be made of different materials (or substances), and may be formed through different processes. In one or more embodiments, the first insulating layer and the second insulating layer may be formed of the same material through a continuous process.

In one or more embodiments, the light emitting element LD may be implemented with a light emitting pattern having a core-shell structure.

The above-described light emitting element LD may be used as a light emitting source (or light source) for various display devices. The light emitting element LD may be manufactured through a surface treatment process.

An emission component (e.g., a light emitting device or a light emitting part) including the above-described light emitting element LD may be used for various types of electronic devices that require a light source, including a display device.

Figure 3:
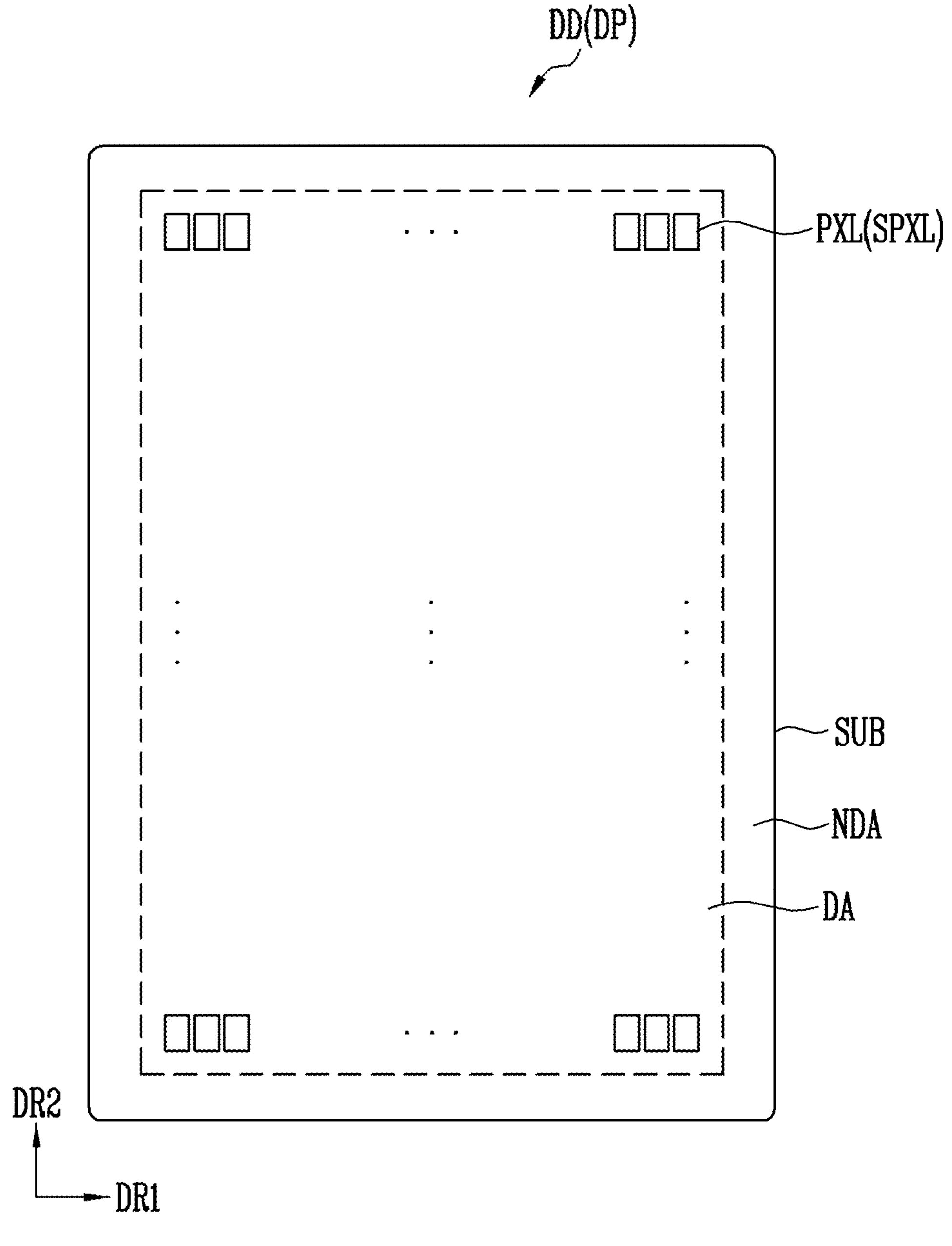
FIG. 3 is a schematic plan view illustrating a display device in accordance with one or more embodiments of the present disclosure.

FIG. 3 is a schematic plan view illustrating a display device DD in accordance with one or more embodiments of the present disclosure.

In FIG. 3, for convenience of description, a structure of the display device DD, e.g., a display panel DP provided in the display device DD is briefly illustrated based on a display area DA in which an image is displayed.

Referring to FIGS. 1 to 3, the display device DD may be classified into a passive matrix type display device and an active matrix type display device according to a method of driving a light emitting element LD. In an example, when the display device DD is implemented as the active matrix type display device, each of pixels PXL may include a driving transistor for controlling an amount of current supplied to the light emitting element LD, a switching transistor for transferring a data signal to the driving transistor, and the like.

The display panel DP (or the display device DD) may include a substrate SUB and the pixels PXL provided on the substrate SUB. Each of the pixels PXL may include a plurality of sub-pixels SPXL. Each sub-pixel SPXL may include at least one light emitting element LD.

The substrate SUB may include the display area DA and a non-display area NDA along an edge or periphery of the display area DA.

The display area DA may be an area in which the pixels PXL for displaying an image are provided. The non-display area NDA may be an area in which a driver for driving each pixel PXL (or each sub-pixel SPXL) and a portion of a line part connecting each pixel PXL and the driver to each other are provided.

The non-display area NDA may be located adjacent to the display area DA. The non-display area NDA may be provided at at least one side of the display area DA. In an example, the non-display area NDA may be around (e.g., may surround) a periphery (or edge) of the display area DA. A line part connected to each pixel PXL and a driver that is connected to the line part and drives the pixel PXL may be provided in the non-display area NDA.

The line part may electrically connect the driver and each pixel PXL to each other. The line part may include a fan-out line connected to signal lines, e.g., a scan line, a data line, and the like, which provide signals to each pixel PXL and are connected to each pixel PXL. In one or more embodiments, the line part may include a fan-out line connected to signal lines, e.g., a control line, a sensing line, and the like, which are connected to each pixel PXL so as to compensate for an electrical characteristic change of each pixel PXL in real time. The line part may include a fan-out line that supplies a suitable voltage (e.g., a predetermined voltage) to each pixel PXL and is connected to power lines connected to each pixel PXL.

The substrate SUB may include a transparent insulating material to enable light to be transmitted therethrough. The substrate SUB may be a rigid substrate or a flexible substrate.

The rigid substrate may be, for example, one of a glass substrate, a quartz substrate, a glass ceramic substrate, and a crystalline glass substrate.

The flexible substrate may be one of a film substrate and a plastic substrate, which may include a polymer organic material. For example, the flexible substrate may include at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and/or cellulose acetate propionate.

One area of the substrate SUB may be provided as the display area, so that the pixels PXL are disposed therein, and the other area on the substrate SUB may be provided as the non-display area NDA. In an example, the substrate SUB may include the display area DA including pixel areas in which the respective pixels PXL are disposed and the non-display area NDA disposed at the periphery of the display area DA (or adjacent to the display area DA).

Each of the pixels PXL may be provided in the display area DA of the substrate SUB. The pixels PXL may be arranged in a stripe arrangement structure or the like in the display area DA, but the present disclosure is not limited thereto.

Each pixel PXL may include a pixel circuit layer (see "PCL" shown in FIG. 7) and a display element layer (see "DPL" shown in FIG. 7), which are located on the substrate SUB.

A pixel circuit (see "PXC" shown in FIG. 4) that is provided on the substrate SUB and includes a plurality of transistors and signal lines electrically connected to the transistors may be disposed in the pixel circuit layer PCL. Each transistor may have, for example, a form in which a semiconductor layer, a gate electrode, a first terminal, and a second terminal are sequentially stacked with an insulating layer interposed therebetween. The semiconductor layer may include amorphous silicon, poly-silicon, low temperature poly-silicon, an organic semiconductor, and/or an oxide semiconductor. The gate electrode, the first terminal (or source electrode), and the second terminal (or drain electrode) may include one of aluminum (Al), copper (Cu), titanium (Ti), and molybdenum (Mo), but the present disclosure is not limited thereto. Also, the pixel circuit layer PCL may include at least one insulating layer.

The display element layer DPL may be disposed on the pixel circuit layer PCL. An emission component (see "EMU" shown in FIG. 4) including at least one light emitting element LD configured to emit light may be located in the display element layer DPL. A first alignment electrode (or first alignment line) and a second alignment electrode (or second alignment line), which are spaced from each other, may be disposed in the emission component EMU. The light emitting element LD may be disposed between the first alignment electrode and the second alignment electrode. Components of each pixel PXL will be described in detail later.

Each pixel PXL may include at least one light emitting element LD driven by a corresponding scan signal and a corresponding data signal. The light emitting element LD may have a size small to a degree of nano scale (or nanometer) to micro scale (or micrometer), and may be connected in parallel to light emitting elements disposed adjacent thereto. However, the present disclosure is not limited thereto. The light emitting element LD may constitute a light source of each pixel PXL.

Figure 4:
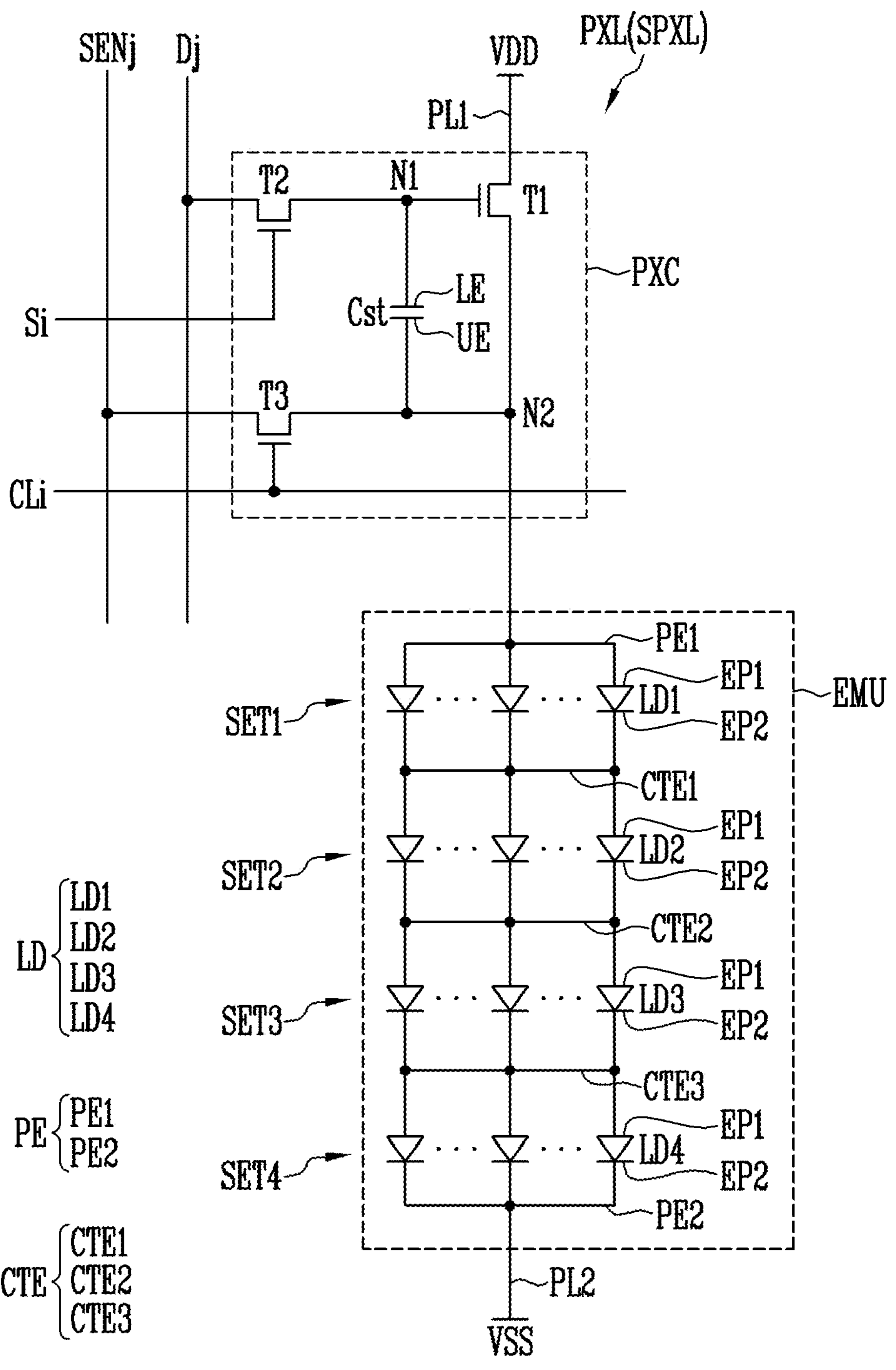
FIG. 4 is a schematic circuit diagram illustrating an electrical connection relationship of components included in each of pixels shown in FIG. 3.

FIG. 4 is a schematic circuit diagram illustrating an electrical connection relationship of components included in each of the pixels PXL shown in FIG. 3.

For example, FIG. 4 illustrates an electrical connection relationship of components included in a pixel PXL (or sub-pixel SPXL) applicable to an active matrix type display device in accordance with one or more embodiments of the present disclosure. However, the connection relationship of the components of each pixel PXL is not limited thereto.

Referring to FIGS. 1 to 4, the pixel PXL may include an emission component EMU that generates light with a luminance corresponding to a data signal. Also, the pixel PXL may selectively further include a pixel circuit PXC for driving the emission component EMU.

For example, the emission component EMU may include a first electrode PE1 (or first pixel electrode) electrically connected to a first driving power source VDD through a first power line PL1, a second electrode PE2 (or second pixel electrode) electrically connected to a second driving power source VSS through a second power line PL2, and a plurality of light emitting elements LD connected between the first and second electrodes PE1 and PE2. The first driving power source VDD and the second driving power source VSS may have different potentials such that the light emitting elements LD can emit light. In an example, the first driving power source VDD may be set as a high-potential power source, and the second driving power source VSS may be set as a low-potential power source.

In one or more embodiments, the emission component EMU may include at least one serial stage. Each serial stage may include a pair of electrodes (e.g., "two electrodes," "a corresponding electrode PE and a corresponding intermediate electrode CTE," or "a corresponding intermediate electrode CTE and another corresponding intermediate electrode CTE") and at least one light emitting element LD connected in a forward direction between the pair of electrodes. The number of serial stages constituting the emission component EMU and the number of light emitting elements LD constituting each serial stage are not particularly limited. In an example, numbers of light emitting elements LD constituting the respective serial stages may be equal to or different from each other, and a number of light emitting elements LD is not particularly limited.

For example, the emission component EMU may include a first serial stage SET1 including at least one first light emitting element LD1, a second serial stage SET2 including at least one second light emitting element LD2, a third serial stage SET3 including at least one third light emitting element LD3, and a fourth serial stage SET4 including at least one fourth light emitting element LD4.

The first serial stage SET1 may include the first electrode PE1 (or first pixel electrode), a first intermediate electrode CTE1 (or first bridge electrode), and at least one first light emitting element LD1 connected between the first electrode PE1 and the first intermediate electrode CTE1. Each first light emitting element LD1 may be connected in the forward direction between the first electrode PE1 and the first intermediate electrode CTE1. For example, a first end portion EP1 of the first light emitting element LD1 may be electrically connected to the first electrode PE1, and a second end portion EP2 of the first light emitting element LD1 may be electrically connected to the first intermediate electrode CTE1.

The second serial stage SET2 may include the first intermediate electrode CTE1, a second intermediate electrode CTE2 (or second bridge electrode), and at least one second light emitting element LD2 connected between the first and second intermediate electrodes CTE1 and CTE2. Each second light emitting element LD2 may be connected in the forward direction between the first and second intermediate electrodes CTE1 and CTE2. For example, a first end portion EP1 of the second light emitting element LD2 may be electrically connected to the first intermediate electrode CTE1, and a second end portion EP2 of the second light emitting element LD2 may be electrically connected to the second intermediate electrode CTE2.

The third serial stage SET3 may include the second intermediate electrode CTE2, a third intermediate electrode CTE3 (or third bridge electrode), and at least one third light emitting element LD3 connected between the second and third intermediate electrodes CTE2 and CTE3. Each third light emitting element LD3 may be connected in the forward direction between the second and third intermediate electrodes CTE2 and CTE3. For example, a first end portion EP1 of the third light emitting element LD3 may be electrically connected to the second intermediate electrode CTE2, and a second end portion EP2 of the third light emitting element LD3 may be electrically connected to the third intermediate electrode CTE3.

The fourth serial stage SET4 may include the third intermediate electrode CTE3, the second electrode PE2 (or second pixel electrode), and at least one fourth light emitting element LD4 connected between the third intermediate electrode CTE3 and the second electrode PE2. Each fourth light emitting element LD4 may be connected in the forward direction between the third intermediate electrode CTE3 and the second electrode PE2. For example, a first end portion EP1 of the fourth light emitting element LD4 may be electrically connected to the third intermediate electrode CTE3, and a second end portion EP2 of the fourth light emitting element LD4 may be electrically connected to the second electrode PE2.

A first electrode, e.g., the first electrode PE1 of the emission component EMU may be an anode of the emission component EMU. A last electrode, e.g., the second electrode PE2 of the emission component EMU may be a cathode of the emission component EMU.

When light emitting elements LD are connected in a series/parallel structure, power efficiency can be improved as compared with when light emitting elements LD of which number is equal to that of the above-described light emitting elements LD are connected only in parallel. In addition, in the pixel PXL in which the light emitting elements LD are connected in the series/parallel structure, although a short defect or the like occurs in some serial stages, a desired luminance (e.g., a predetermined luminance) can be expressed through light emitting elements LD of the other serial stage. Hence, the probability that a dark spot defect will occur in the pixel PXL can be reduced. However, the present disclosure is not limited thereto, and the emission component EMU may be configured by connecting the light emitting elements LD only in series or by connecting the light emitting elements LD only in parallel.

Each of the light emitting element LD may include a first end portion EP1 (e.g., a p-type end portion) electrically connected to the first driving power source VDD via at least one electrode (e.g., the first electrode PE1), the pixel circuit PXC, and/or the first power line PL1, and a second end portion EP2 (e.g., an n-type end portion) electrically connected to the second driving power source VSS via at least another electrode (e.g., the second electrode PE2) and the second power line PL2. For example, the light emitting elements LD may be electrically connected in the forward direction between the first driving power source VDD and the second driving power source VSS. The light emitting elements LD connected in the forward direction may constitute effective light sources of the emission component EMU.

The light emitting elements LD may emit light with a luminance corresponding to a driving current when the driving current is supplied through the corresponding pixel circuit PXC. For example, during each frame period, the pixel circuit PXC may supply, to the emission component EMU, a driving current corresponding to a grayscale value to be expressed in a corresponding frame. The driving current supplied to the emission component EMU may be divided to flow through each of the light emitting elements LD. Accordingly, while the light emitting elements LD emit light with a luminance corresponding to the driving current, the emission component unit EMU can express the luminance corresponding to the driving current.

The pixel circuit PXC may be connected to a scan line Si and a data line Dj of the corresponding pixel PXL. In an example, when a pixel PXL is disposed on an ith row and a jth column of the display area DA, a pixel circuit PXC of the pixel PXL may be connected to an ith scan line Si and a jth data line Dj of the display area DA. Also, the pixel circuit PXC may be connected to an ith control line CLi and a jth sensing line SENj.

The above-described pixel circuit PXC may include first to third transistors T1, T2, and T3 and a storage capacitor Cst.

The first transistor T1 is a driving transistor for controlling a driving current applied to the emission component EMU, and may be electrically connected between the first driving power source VDD and the emission component EMU. Specifically, a first terminal of the first transistor T1 may be electrically connected to the first driving power source VDD through the first power line PL1, a second terminal of the first transistor T1 may be electrically connected to a second node N2, and a gate electrode of the first transistor T1 may be electrically connected to a first node N1. The first transistor T1 may control an amount of driving current applied from the first driving power source VDD to the emission component EMU through the second node N2 according to a voltage applied to the first node N1. In one or more embodiments, the first terminal of the first transistor T1 may be a drain electrode, and the second terminal of the first transistor T1 may be a source electrode. However, the present disclosure is not limited thereto. In one or more embodiments, the first terminal may be the source electrode, and the second terminal may be the drain electrode.

The second transistor T2 is a switching transistor that selects a pixel PXL in response to a scan signal and activates the pixel PXL, and may be electrically connected between the data line Dj (e.g., the jth data line) and the first node N1. A first terminal of the second transistor T2 may be electrically connected to the data line Dj, a second terminal of the second transistor T2 may be electrically connected to the first node N1, and a gate electrode of the second transistor T2 may be electrically connected to the scan line Si (e.g., the ith scan line). The first terminal and the second terminal of the second transistor T2 are different terminals. For example, when the first terminal is a drain electrode, and the second terminal may be a source electrode.

The second transistor T2 may be turned on when the scan signal having a gate-on voltage (e.g., a high level voltage) is supplied from the scan line Si, to electrically connect the data line Dj and the first node N1 to each other. The first node N1 is a point at which the second terminal of the second transistor T2 and the gate electrode of the first transistor T1 are electrically connected to each other, and the second transistor T2 may transfer a data signal to the gate electrode of the first transistor T1.

The third transistor T3 may electrically connect the first transistor T1 to the sensing line SENj (e.g., the jth sensing line), to acquire a sensing signal through the sensing line SENj and to detect characteristics of the pixel PXL, including a threshold voltage of the first transistor T1, and the like, by using the sensing signal. Information on the characteristics of the pixel PXL may be used to convert image data such that a characteristic deviation between pixels PXL can be compensated. A second terminal of the third transistor T3 may be electrically connected to the second terminal of the first transistor T1, a first terminal of the third transistor T3 may be electrically connected to the sensing line SENj, and a gate electrode of the third transistor T3 may be electrically connected to the control line CLi (e.g., the ith control line). In addition, the first terminal of the third transistor T3 may be electrically connected to an initialization power source. The third transistor T3 is an initialization transistor capable of initializing the second node N2, and may be turned on when a sensing control signal is supplied from the control line CLi, to transfer a voltage of the initialization power source to the second node N2. Accordingly, the storage capacitor Cst electrically connected to the second node N2 can be initialized.

The storage capacitor Cst may include a first storage electrode LE (or lower electrode) and a second storage electrode UE (or upper electrode). The first storage electrode LE may be electrically connected to the first node N1, and the second storage electrode UE may be electrically connected to the second node N2. The storage capacitor Cst charges a data voltage corresponding to the data signal supplied to the first node N1 during one frame period. Accordingly, the storage capacitor Cst can store a voltage corresponding to a difference between a voltage of the gate electrode of the first transistor T1 and a voltage of the second node N2.

Although one or more embodiments in which the first to third transistors T1, T2, and T3 are all N-type transistors is disclosed in FIG. 4, the present disclosure is not limited thereto. For example, at least one of the first to third transistors T1, T2, and T3 may be replaced with a P-type transistor. Also, although one or more embodiments in which the emission component EMU is connected between the pixel circuit PXC and the second driving power source VSS is disclosed in FIG. 4, the emission component EMU may be connected between the first driving power source VDD and the pixel circuit PXC.

The structure of the pixel circuit PXC may be variously modified and embodied. In an example, the pixel circuit PXC ma additionally further include at least one transistor element such as a transistor element for initializing the first node N1 and/or a transistor element for controlling an emission time of the light emitting elements LD, or other circuit elements such as a boosting capacitor for boosting a voltage of the first node N1.

In the following embodiment, for convenience of description, a lateral direction (or X-axis direction) on a plane is represented as a first direction DR1, a longitudinal direction (or Y-axis direction) on the plane is represented as a second direction DR2, and a longitudinal direction on a section is represented as a third direction DR3.

Figure 5:
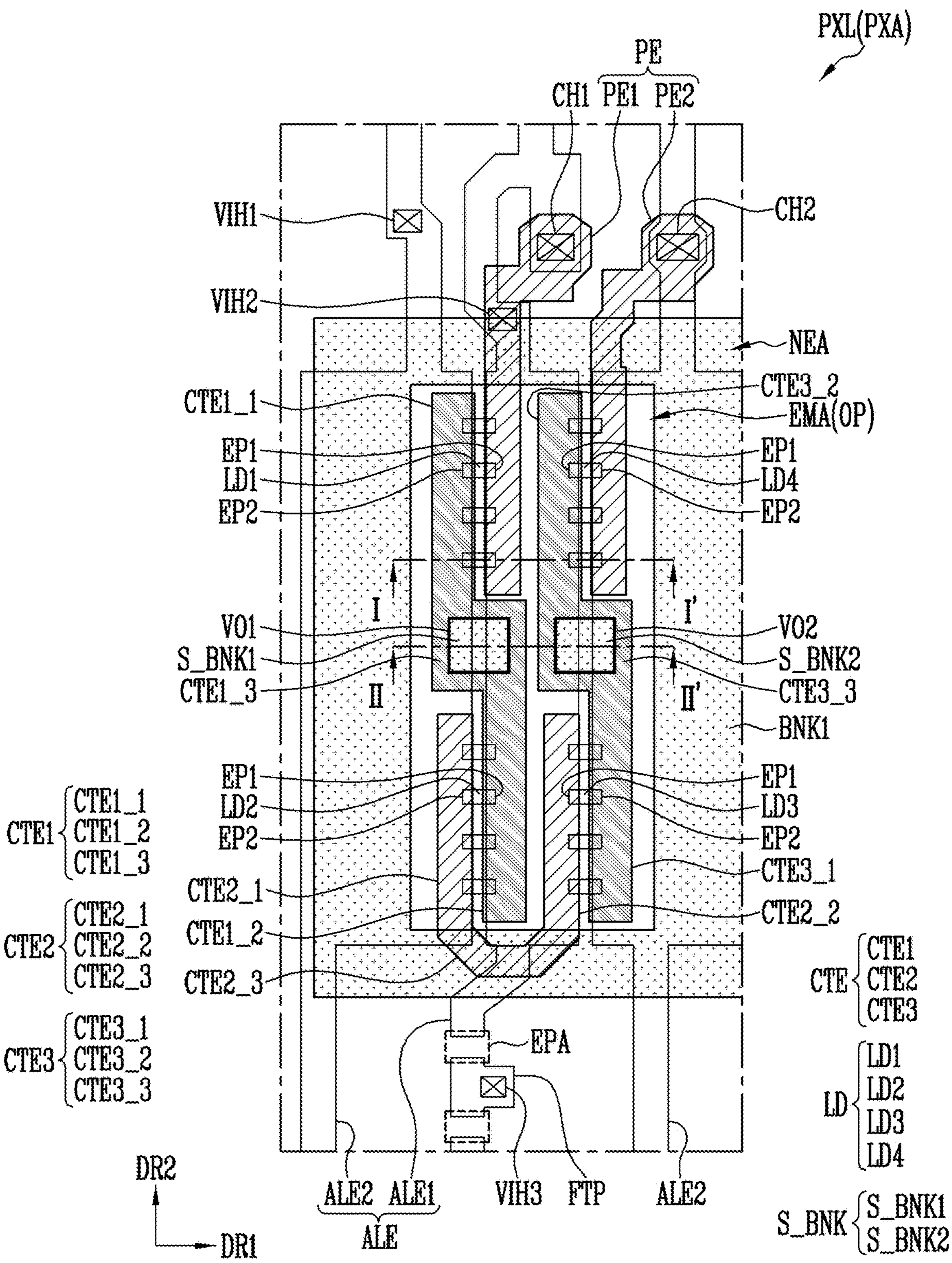
FIG. 5 is a schematic plan view illustrating a display element layer of a pixel in accordance with one or more embodiments of the present disclosure.
Figure 6A:
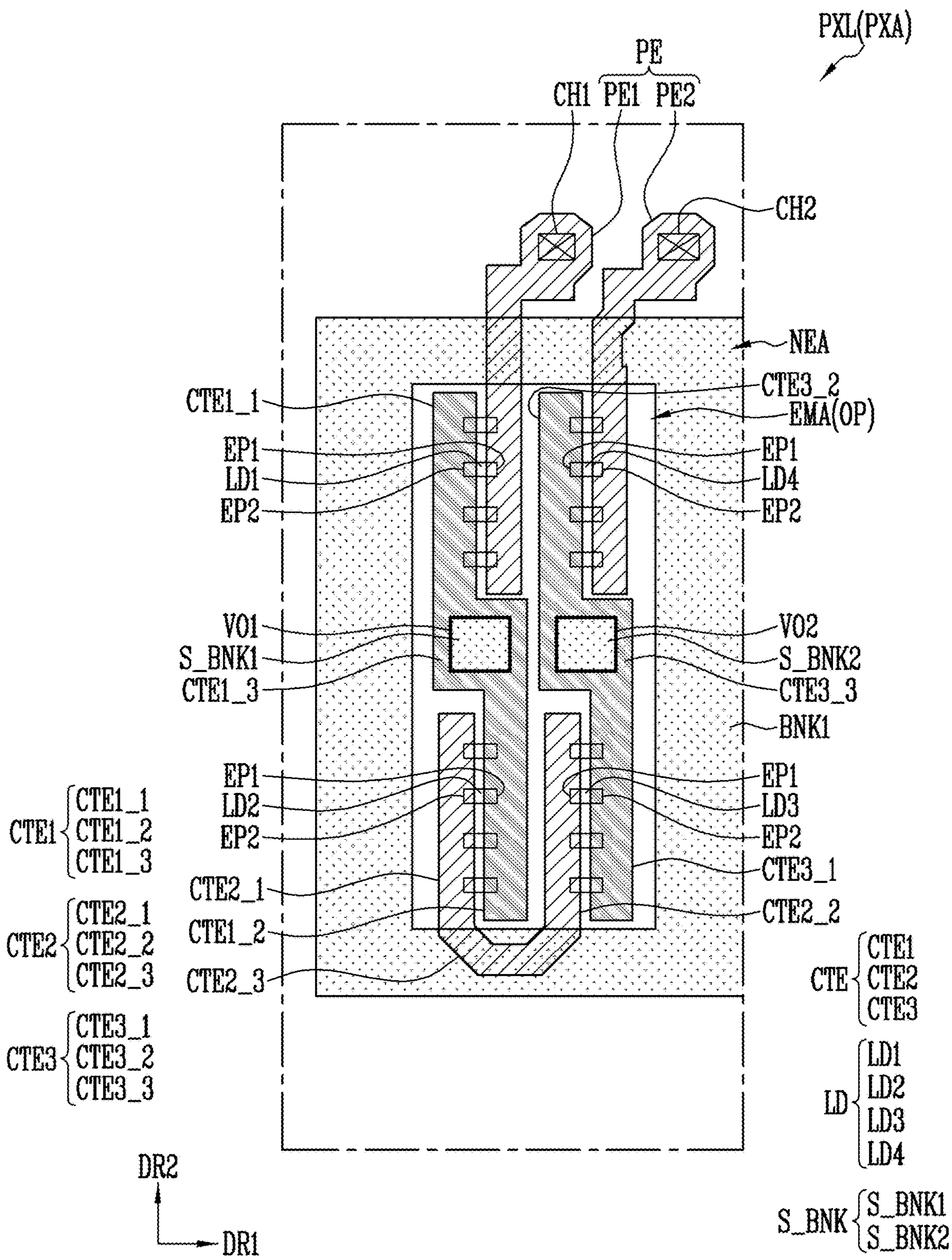
FIG. 6A is a schematic plan view illustrating a first bank, a sub-bank, first and second electrodes, intermediate electrodes, and light emitting elements, which are included in the pixel shown in FIG. 5.
Figure 6B:
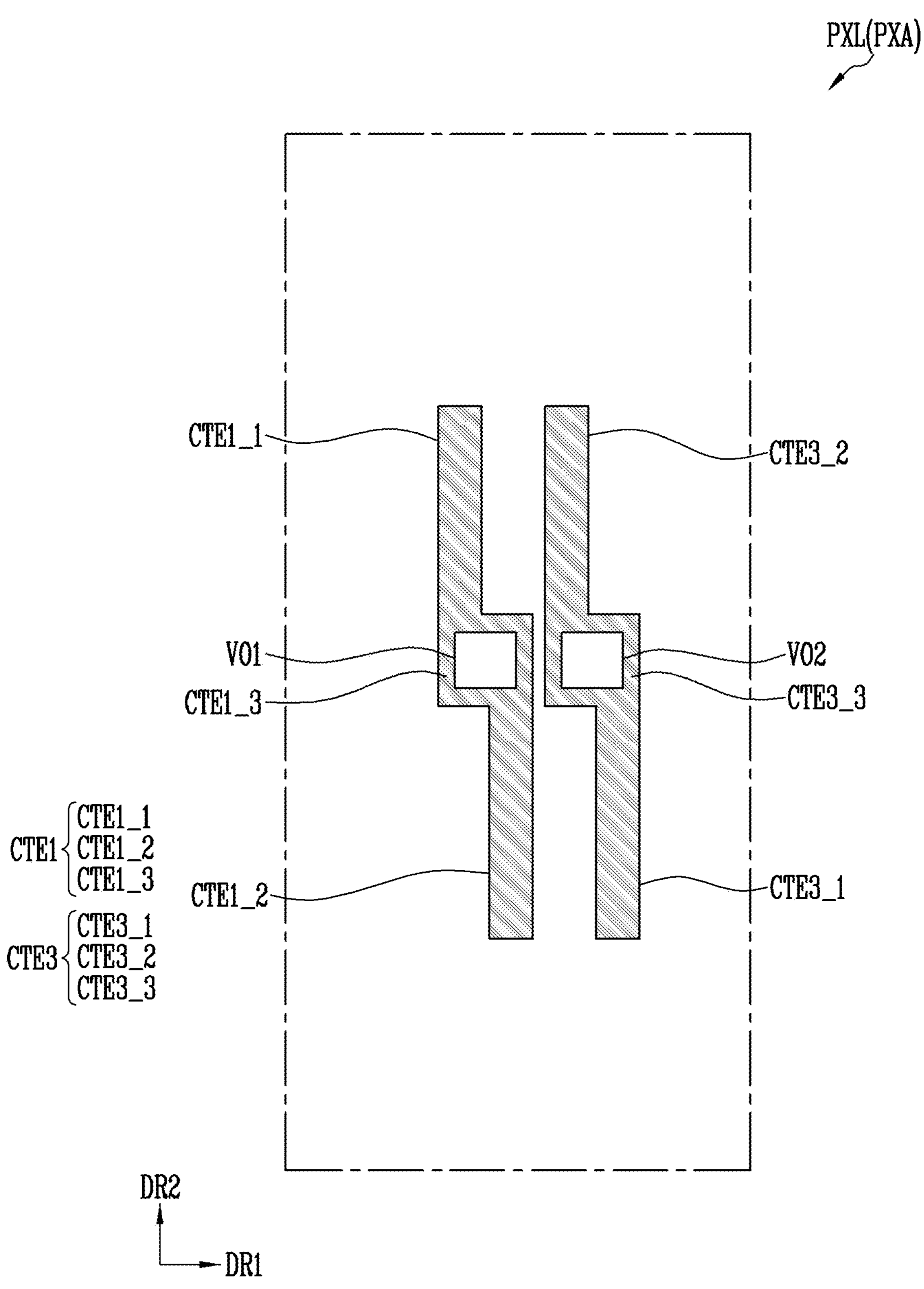
FIG. 6B is a schematic plan view illustrating first and third intermediate electrodes included in the pixel shown in FIG. 6A.

FIG. 5 is a schematic plan view illustrating a display element layer of a pixel PXL in accordance with one or more embodiments of the present disclosure. FIG. 6A is a schematic plan view illustrating a first bank BNK1, a sub-bank S_BNK, first and second electrodes PE1 and PE2, intermediate electrodes CTE, and light emitting elements LD, which are included in the pixel PXL shown in FIG. 5. FIG. 6B is a schematic plan view illustrating first and third intermediate electrodes CTE1 and CTE3 included in the pixel PXL shown in FIG. 6A.

Referring to FIGS. 1 to 6B, the pixel PXL may be located in a pixel area PXA prepared (or provided) in the display area DA of the substrate SUB.

The pixel PXL may include a first bank BNK1 located in a non-emission area NEA and light emitting elements LD located in an emission area EMA.

The first bank BNK1 is a structure defining an emission area EMA of each of the pixel PXL and adjacent pixels PXL adjacent thereto, and may be, for example, a pixel defining layer.

The first bank BNK1 may be a pixel defining layer or a dam structure, which defines each emission area EMA to which light emitting elements LD are to be supplied in a process of supplying (or inputting) the light emitting elements LD. In an example, the emission area EMA of the pixel PXL is partitioned by the first bank BNK1, so that a mixed liquor (e.g., ink) including a desired quantity and/or a desired kind of light emitting elements LD can be supplied (or input) to the emission area EMA.

The first bank BNK1 may include at least one light blocking material and/or at least one reflective material (or light scattering material), to prevent a light leakage defect in which light is leaked between the pixel PXL and adjacent pixels PXL adjacent thereto. In some embodiments, the first bank BNK1 may include a transparent material (or substance). The transparent material may include, for example, polyamide resin, polyimide resin, and the like, but the present disclosure is not limited thereto. In one or more embodiments, a reflective material layer may be separately provided and/or formed on the first bank BNK1 so as to further improve the efficiency of light emitted from the pixel PXL.

The first bank BNK1 may include at least one opening OP exposing components located thereunder in the pixel area PXA. In one or more embodiments, the emission area EMA of the pixel PXL and the opening OP of the first bank BNK1 may correspond to each other.

An electrode separation area EPA may be located in a non-emission area NEA of each pixel PXL. The electrode separation area EPA may be an area in which a first alignment electrode ALE1 in each pixel PXL is separated from a first alignment electrode ALE1 provided in a pixel PXL adjacent in the second direction DR2.

The pixel PXL may include electrodes PE (or pixel electrodes) and intermediate electrodes CTE, which are provided in the emission area EMA, light emitting elements LD electrically connected to the electrodes PE and the intermediate electrodes CTE, and alignment electrodes ALE provided at positions corresponding to the electrodes PE and the intermediate electrodes CTE. In an example, a first electrode PE1 (or first pixel electrode), a second electrode PE2 (or second pixel electrode), a first intermediate electrode CTE1 (or first bridge electrode), a second intermediate electrode CTE2 (or second bridge electrode), a third intermediate electrode CTE3 (or third bridge electrode), the light emitting elements LD, and first and second alignment electrodes ALE1 and ALE2 may be disposed in the emission area EMA. The number, shape, size, arrangement structure, and the like of each of the electrodes PE, the intermediate electrodes CTE, and/or the alignment electrodes ALE may be variously changed according to a structure of the pixel PXL (e.g., an emission component EMU).

In one or more embodiments, the alignment electrodes ALE, the light emitting elements LD, the electrodes PE, and/or the intermediate electrodes CTE may be sequentially provided with respect to one surface of the substrate SUB, on which the pixel PXL is provided, but the present disclosure is not limited thereto. In one or more embodiments, the positions and formation order of electrode patterns constituting the pixel PXL (or the emission component EMU) may be variously changed. A stacked structure (or sectional structure) of the pixel PXL will be described later with reference to FIGS. 7 to 10.

The alignment electrodes ALE may be located in at least the emission area EMA, and may be spaced from each other along the first direction DR1 in the emission area EMA. Each of the alignment electrodes ALE may extend in the second direction DR2. The alignment electrodes ALE may include a second alignment electrode ALE2, a first alignment electrode ALE1, and another second alignment electrode ALE2, which are disposed to be spaced from each other in the first direction DR1.

At least one of the second alignment electrode ALE2, the first alignment electrode ALE1, and the another second alignment electrode ALE2 may be separated from another electrode (e.g., an alignment electrode ALE provided in an adjacent pixel adjacent to each pixel PXL in the second direction DR2) after the light emitting elements LD are supplied and aligned in the emission area EMA in a manufacturing process of the display device DD. In an example, the first alignment electrode ALE1 may be separated from a first alignment electrode ALE1 provided in an adjacent pixel PXL adjacent to the corresponding pixel PXL after the light emitting elements LD are supplied and aligned in the emission area EMA in the manufacturing process of the display device DD.

First alignment electrodes ALE1 provided in the display area DA may be formed to be connected to each other in the manufacturing process of the display device DD (or the pixel PXL). For example, the first alignment electrodes ALE1 may be formed to be integrally connected to a floating pattern FTP, thereby constituting a first alignment line. The floating pattern FTP may be electrically connected to a partial component of the pixel circuit layer PCL, e.g., the first power line (see "PL1" shown in FIG. 4) through a third via hole VIH3. In an alignment process of the light emitting elements LD, a first alignment signal may be supplied to the first alignment line through the first power line PL1. After the alignment process of the light emitting elements LD is completed, a portion of the first alignment line may be removed (or the first alignment line may be cut off) at the periphery of the third via hole VIH3 located in the non-emission area NEA, so that electrical connection between the first alignment electrode ALE1 and the first power line PL1 is cut off. For example, the first alignment line may be cut off in the electrode separation area EPA located at the periphery of the floating pattern FTP, to be separated into first alignment electrodes ALE1 and the floating patterns FTP. Accordingly, first alignment electrodes ALE of pixels PXL located on the same pixel column are electrically separated from each other, so that the pixels PX can be individually driven.

In a plan view, the second alignment electrode ALE2, the first alignment electrode ALE1, and the another second alignment electrode ALE2 may be sequentially arranged along the first direction DR1 in the emission area EMA. The second alignment electrode ALE2 may be located adjacent to one side (e.g., a left side) of the first alignment electrode ALE1, and the another second alignment electrode ALE2 may be located adjacent to the other side (e.g., a right side) of the first alignment electrode ALE1.

The first alignment electrode ALE1 may be electrically connected to a partial component of the pixel circuit PXC, e.g., the second storage electrode (see "UE" shown in FIG. 4) (or upper electrode) of the storage capacitor (see "Cst" shown in FIG. 4) through a second via hole VIH2. The second via hole VIH2 may be formed as one area of an insulating layer located between the first alignment electrode ALE1 and the second storage electrode UE is opened.

The second alignment electrode ALE2 may be electrically connected to a partial component of the pixel circuit PXC, e.g., the second power line (see "PL2" shown in FIG. 4) through a first via hole VIH1. The first via hole VIH1 may be formed as one area of an insulating layer located between the second alignment electrode ALE2 and the second power line PL2 is opened.

Each of the second alignment electrode ALE2, the first alignment electrode ALE1, and the other second alignment electrode ALE2 in the emission area EMA may be disposed to be spaced from an alignment electrode ALE adjacent in the first direction DR1. The second alignment electrodes ALE2 may be non-integrally or integrally formed with second alignment electrodes ALE2 located in an adjacent pixel PXL, to be electrically connected to each other. In an example, the second alignment electrode ALE2 may be non-integrally or integrally formed with another second alignment electrode ALE2 of the adjacent pixel PXL, to be electrically connected to each other. The another second alignment electrode ALE2 may be non-integrally or integrally formed with a second alignment electrode ALE2 of the adjacent pixel PXL, to be electrically connected to each other.

Each of a second alignment electrode ALE2, a first alignment electrode ALE1, and anther second alignment electrode ALE2 may receive a signal (e.g., an alignment signal) transferred before light emitting elements in an emission area EMA of each pixel PXL are aligned, to be used as an alignment line for aligning the light emitting elements LD.

The first alignment electrode ALE1 may be supplied with a first alignment signal in the alignment process of the light emitting elements LD, and the second alignment electrode ALE2 and the other second alignment electrode ALE2 may be supplied with a second alignment signal in the alignment process of the light emitting elements LD. The above-described first and second alignment signals may be signals having a voltage difference and/or a phase difference to a degree to which the light emitting elements LD can be aligned between the alignment electrodes ALE. At least one of the first and second alignment signals may be an AC signal, but the present disclosure is not limited thereto.

The second alignment electrode ALE2, the first alignment electrode ALE1, and the other second alignment electrode ALE2 may be provided in a bar-like shape having a constant width in at least the emission area EMA, but the present disclosure is not limited thereto. The second alignment electrode ALE2, the first alignment electrode ALE1, and the other second alignment electrode ALE2 may have or may not have a bending part in the non-emission area NEA. The shape and/or size of each of the second alignment electrode ALE2, the first alignment electrode ALE1, and the other second alignment electrode ALE2 in the other area except the emission area EMA are/is particularly limited, and may be variously changed.

At least two to tens of light emitting elements LD may be aligned and/or provided in the emission area EMA (or the pixel area PXA), but the number of the light emitting elements LD is not limited thereto. In one or more embodiments, the number of light emitting elements LD aligned and/or provided in the emission area EMA (or the pixel area PXA) may be variously changed.

Light emitting elements LD may be disposed each of between the second alignment electrode ALE2 and the first alignment electrode ALE1 and between the first alignment electrode ALE1 and the another second alignment electrode ALE2. In a plan view, each of the light emitting elements LD may include a first end portion EP1 and a second end portion EP2, which are located at both ends (or opposite each other) in a length direction thereof, e.g., the first direction DR1. In one or more embodiments, a second semiconductor layer (see "13" shown in FIG. 1) including a p-type semiconductor layer may be located at the first end portion EP1 (or p-type end portion), and a first semiconductor layer (see "11" shown in FIG. 1) including an n-type semiconductor layer may be located at the second end portion EP2 (or n-type end portion). The light emitting elements LD may be electrically connected in parallel to each other each of between the second alignment electrode ALE2 and the first alignment electrode ALE1 and between the first alignment electrode ALE1 and the another second alignment electrode ALE2.

The light emitting elements LD may be disposed to be spaced from each other, and may be aligned in substantially parallel to each other. The distance at which the light emitting elements LD are spaced from each other is not particularly limited. In one or more embodiments, a plurality of light emitting elements LD may disposed adjacent to each other to form a group, and another plurality of light emitting elements LD may form a group in a state in which the another plurality of light emitting elements LD are spaced from each other at a certain distance. The light emitting elements LD have a density which is not uniform, but may be aligned in one direction.

The light emitting elements LD may be input (or supplied) to the pixel area PXA (or the emission area EMA) through an inkjet printing process, a slit coating process, or other various processes. In an example, the light emitting elements LD may be mixed in a volatile solvent to be input (or supplied) to the pixel area PXA through the inkjet printing process or the slit coating process.

In one or more embodiments, the light emitting elements LD may include a first light emitting element LD1, a second light emitting element LD2, a third light emitting element LD3, and a fourth light emitting element LD4.

The first light emitting element LD1 may be aligned between a left upper end area of the first alignment electrode ALE1 and the second alignment electrode ALE2 to be electrically connected to a first electrode PE1 and the first intermediate electrode CTE1. The first light emitting element LD1 may include a first end portion EP1 located adjacent to the first alignment electrode ALE1 and a second end portion EP2 located adjacent to the second alignment electrode ALE2. The first end portion EP1 of the first light emitting element LD1 may be electrically connected to the first electrode PE1, and the second end portion EP2 of the first light emitting element LD1 may be electrically connected to the first intermediate electrode CTE1.

The second light emitting element LD2 may be aligned between a left lower end area of the first alignment electrode ALE1 and the second alignment electrode ALE2 to be electrically connected to the first intermediate electrode CTE1 and the second intermediate electrode CTE2. The second light emitting element LD2 may include a first end portion EP1 located adjacent to the first alignment electrode ALE1 and a second end portion EP2 located adjacent to the second alignment electrode ALE2. The first end portion EP1 of the second light emitting element LD2 may be electrically connected to the first intermediate electrode CTE1, and the second end portion EP2 of the second light emitting element LD2 may be electrically connected to the second intermediate electrode CTE2.

The third light emitting element LD3 may be aligned between a right lower end area of the first alignment electrode ALE1 and the another second alignment electrode ALE2 to be electrically connected to the second intermediate electrode CTE2 and the third intermediate electrode CTE3. The third light emitting element LD3 may include a first end portion EP1 located adjacent to the first alignment electrode ALE1 and a second end portion EP2 located adjacent to the another second alignment electrode ALE2. The first end portion EP1 of the third light emitting element LD3 may be electrically connected to the second intermediate electrode CTE2, and the second end portion EP2 of the third light emitting element LD3 may be electrically connected to the third intermediate electrode CTE3.

The fourth light emitting element LD4 may be aligned between a right upper end area of the first alignment electrode ALE1 and the another second alignment electrode ALE2 to be electrically connected to the third intermediate electrode CTE3 and the second electrode PE2. The fourth light emitting element LD4 may include a first end portion EP1 located adjacent to the first alignment electrode ALE1 and a second end portion EP2 located adjacent to the another second alignment electrode ALE2. The first end portion EP1 of the fourth light emitting element LD4 may be electrically connected to the third intermediate electrode CTE3, and the second end portion EP2 of the fourth light emitting element LD4 may be electrically connected to the second electrode PE2.

As described above, the first end portion EP1 of each of the first, second, third, and fourth light emitting elements LD1, LD2, LD3, and LD4 may be located adjacent to a corresponding first alignment electrode ALE1, and the second end portion EP2 of each of the first, second, third, and fourth light emitting elements LD1, LD2, LD3, and LD4 may be located adjacent to a corresponding second alignment electrode ALE2.

In a plan view, the first light emitting element LD1 may be located in a left upper end area of the emission area EMA, the second light emitting element LD2 may be located in a left lower end area of the emission area EMA, the third light emitting element LD3 may be located at a right lower end area of the emission area EMA, and the fourth light emitting element LD4 may be located in a right upper end area of the emission area EMA. However, the arrangement and/or connection structure of the light emitting elements LD may be variously changed according to a structure of the pixel PXL (or the emission component EMU) and/or a number of serial stages. In one or more embodiments, the light emitting elements LD may not be located in the middle (between the left upper end area of the emission area EMA and the left lower end area of the emission area EMA and between the right upper end area of the emission area EMA and the right lower end area of the emission area EMA) of the emission area EMA.

Each of the first, second, third, and fourth light emitting elements LD1, LD2, LD3, and LD4 may be a light emitting diode having a subminiature size, e.g., a size small to a degree of nano scale (or nanometer) to micro scale (or micrometer), which is manufactured by using a material having an inorganic crystalline structure.

The electrodes PE and the intermediate electrodes CTE may be provided in at least the emission area EMA, and each of the electrodes PE and the intermediate electrodes CTE may be provided at a position corresponding to at least one alignment electrode ALE and light emitting elements LD.

The electrodes PE may include the first electrode PE1 and the second electrode PE2, which are disposed to be spaced from each other. The intermediate electrode CTE may include the first intermediate electrode CTE1, the second intermediate electrode CTE2, and the third intermediate electrode CTE3, which are disposed to be spaced from each other.

The first electrode PE1 (e.g., "first pixel electrode" or "anode") may be formed on a first area (e.g., a left upper end area) of the first alignment electrode ALE1 and first end portions EP1 of the first light emitting elements LD1, to be electrically connected to the first end portions EP1 of the first light emitting elements LD1. The first electrode PE1 may have a bar-like shape having a constant width along an extending direction thereof, e.g., the second direction DR2.

The first intermediate electrode CTE1 may be disposed on a first area (e.g., an upper end area) of the second alignment electrode ALE2, which faces (e.g., opposes) the first area of the first alignment electrode ALE1, and second end portions EP2 of the first light emitting elements LD1, to be electrically connected to the second end portions EP2 of the first light emitting elements LD1. Also, the first intermediate electrode CTE1 may be disposed on a second area (e.g., a left lower end area) of the first alignment electrode ALE1 and first end portions EP1 of second light emitting elements LD2, to be electrically connected to the first end portions EP1 of the second light emitting elements LD2. For example, the first intermediate electrode CTE1 may be a first bridge electrode that electrically connects the second end portions EP2 of the first light emitting elements LD1 to the first end portions EP1 of the second light emitting elements LD2. To this end, the first intermediate electrode CTE1 may have a bent shape. For example, the first intermediate electrode CTE1 may have a bent or curved structure at a boundary between an area in which at least one first light emitting element LD1 is arranged and an area in which at least one second light emitting element LD2 is arranged.

In one or more embodiments, the first intermediate electrode CTE1 may include a first part CTE1_1 that faces (e.g., opposes) the first electrode PE1 and is electrically connected to the second end portions EP2 of the first light emitting elements LD1, a second part CTE1_2 that faces (e.g., opposes) the second intermediate electrode CTE2 and is electrically connected to the first end portions of the second light emitting elements LD2, and a third part CTE1_3 connecting the first part CTE1_1 and the second part CTE1_2 to each other. The first part CTE1_1 may be located in an area (hereinafter, referred to as a "first alignment area") in which at least one first light emitting element LD1 is arranged, the second part CTE1_2 may be located in an area (hereinafter, referred to as a "second alignment area") in which at least one second light emitting element LD2 is arranged, and the third part CTE1_3 may be located between the first alignment area and the second alignment area (e.g., between the left upper end area of the emission area EMA and the left lower end area of the emission area EMA). The first part CTE1_1 may have a bar-like shape extending in the second direction DR2, and overlap with the first area of the second alignment electrode ALE2. The second part CTE1_2 may have a bar-like shape extending in the second direction DR2, and overlap with the second area of the first alignment electrode ALE1. The third part CTE1_3 may have a shape including a first cavity VO1 surrounding a first sub-bank S_BNK1. For example, the third part CTE1_3 may include the first cavity VO1 surrounding the first sub-bank S_BNK1.

The second intermediate electrode CTE2 may be disposed on a second area (e.g., a lower end area) of the second alignment electrode ALE2 and second end portions EP2 of the second light emitting elements LD2, to be electrically connected to the second end portions EP2 of the second light emitting elements LD2. Also, the second intermediate electrode CTE2 may be disposed on a third area (e.g., a right lower end area) of the first alignment electrode ALE1 and first end portions EP1 of the third light emitting elements LD3, to be electrically connected to the first end portions EP1 of the third light emitting elements LD3. For example, the second intermediate electrode CTE2 may electrically connect the second end portions EP2 of the second light emitting elements LD2 to the first end portions EP1 of the third light emitting elements LD3 in the emission area EMA. To this end, the second intermediate electrode CTE2 may have a bent shape. For example, the second intermediate electrode CTE2 may have a bent or curved structure at a boundary between an area in which at least one second light emitting element LD2 is arranged and an area in which at least one third light emitting element LD3 is arranged.

In one or more embodiments, the second intermediate electrode CTE2 may include a fourth part CTE2_1 that faces (e.g., opposes) the second part CTE1_2 of the first intermediate electrode CTE1 and is electrically connected to the second end portions EP2 of the second light emitting elements LD2, a fifth part CTE2_2 that faces (e.g., opposes) the third intermediate electrode CTE3 and is electrically connected to the first end portions EP1 of the third light emitting elements LD3, and a sixth part CTE2_3 connecting the fourth part CTE2_1 and the fifth part CTE2_2 to each other. The fourth part CTE2_1 may be located in the second alignment area, the fifth part CTE2_2 may be located in an area (hereinafter, referred to as a "third alignment area") in which at least one third light emitting element LD3 is arranged, and the sixth part CTE2_3 may be located between the second alignment area and the third alignment area. The fourth part CTE2_1 may have a bar-like shape extending along the second direction DR2, and overlap with the second area of the second alignment electrode ALE2. The fifth part CTE2_2 may have a bar-like shape extending along the second direction DR2, and overlap with the third area of the first alignment electrode ALE1. The sixth part CTE2_3 may overlap with the first bank BNK1.

The third intermediate electrode CTE3 may be disposed on a second area (e.g., a lower end area) of the another second alignment electrode ALE2, which faces (e.g., opposes) the third area of the first alignment electrode ALE1, and second end portions EP2 of the third light emitting elements LD3, to be electrically connected to the second end portions EP2 of the third light emitting elements LD3. Also, the third intermediate electrode CTE3 may be disposed on a fourth area (e.g., a right upper end area) of the first alignment electrode ALE1 and first end portions EP1 of the fourth light emitting elements LD4, to be electrically connected to the first end portions EP1 of the fourth light emitting elements LD4. For example, the third intermediate electrode CTE3 may electrically connect the second end portions EP2 of the third light emitting elements LD3 to the first end portions EP1 of the fourth light emitting elements LD4 in the emission area EMA. To this end, the third intermediate electrode CTE3 may have a bent shape. For example, the third intermediate electrode CTE3 may have a bent or curved structure at a boundary between an area in which at least one third light emitting element LD3 is arranged and an area in which at least one fourth light emitting element LD4 is arranged.

In one or more embodiments, the third intermediate electrode CTE3 may include a seventh part CTE3_1 that faces (e.g., opposes) the fifth part CTE2_2 of the second intermediate electrode CTE2 and is electrically connected to the second end portions of the third light emitting elements LD3, an eighth part CTE3_2 that faces (e.g., opposes) the second electrode PE2 and is electrically connected to the first end portions EP1 of the fourth light emitting elements LD4, and a ninth part CTE3_3 connecting the seventh part CTE3_1 and the eighth part CTE3_2 to each other. The seventh part CTE3_1 may be located in the third alignment area, the eighth part CTE3_2 may be located in an area (hereinafter, referred to as a "fourth alignment area") in which at least one fourth light emitting element LD4 is arranged, and the ninth part CTE3_3 may be located between the third alignment area and the fourth alignment area (e.g., between the right lower end area of the emission area EMA and the right upper end area of the emission area EMA). The seventh part CTE3_1 may have a bar-like shape extending along the second direction DR2, and overlap with the second area of the another second alignment electrode ALE2. The eighth part CTE3_2 may have a bar-like shape extending along the second direction DR2, and overlap with the fourth area of the first alignment electrode ALE1. The ninth part CTE3_3 may have a shape including a second cavity VO2 surrounding a second sub-bank S_BNK2. For example, the ninth part CTE3_3 may include the second cavity VO2 surrounding the second sub-bank S_BNK2.

The second electrode PE2 (e.g., "second pixel electrode" or "cathode") may be disposed on a first area (e.g., an upper end area) of the another second alignment electrode ALE2 and second end portions EP2 of the fourth light emitting elements LD4, to be electrically connected to the second end portion EP2 of each of the fourth light emitting elements LD. The second electrode PE2 may have a bar-like shape having a constant width along an extending direction thereof, e.g., the second direction DR2.

The first electrode PE1, the first intermediate electrode CTE1, the second intermediate electrode CTE2, the third intermediate electrode CTE3, and the second electrode PE2 may be disposed to be spaced from each other in the emission area EMA.

In the above-described manner, the light emitting elements aligned between the alignment electrodes ALE may be connected in a desired form by using the electrodes PE and the intermediate electrodes CTE. For example, the first light emitting elements LD1, the second light emitting elements LD2, the third light emitting elements LD3, and the fourth light emitting elements LD4 may be sequentially connected in series by using the electrodes PE and the intermediate electrodes CTE.

In one or more embodiments, the first electrode PE1 may be an anode of the emission component EMU, and the second electrode PE2 may be a cathode of the emission component EMU.

The first electrode PE1 may be in contact with the first alignment electrode ALE1 through a first contact hole CH1 in the non-emission area NEA, thereby being electrically connected to the first alignment electrode ALE1. The first contact hole CH1 may be formed as a portion of at least one insulating layer located between the first electrode PE1 and the first alignment electrode ALE1 is opened, and a portion of the first alignment electrode ALE1 may be exposed by the first contact hole CH1. Although a case where the first contact hole CH1 is located in the non-emission area NEA has been described, the present disclosure is not limited thereto. In one or more embodiments, the first contact hole CH1 may be located in the emission area EMA of the pixel PXL.

The pixel circuit PXC, the first alignment electrode ALE1, and the first electrode PE1 may be electrically connected to each other through the second via hole VIH2 and the first contact hole CH1. Although a case where the first alignment electrode ALE1 and the first electrode PE1 are connected to each other while being in direct contact with each other through the first contact hole CH1 has been described in the above-described embodiment, the present disclosure is not limited thereto. In one or more embodiments, in order to prevent a failure caused by a material characteristic of the first alignment ALE, the first electrode PE1 is not in direct contact with the first alignment electrode ALE1 but may be in direct contact with the pixel circuit ("PXC" shown in FIG. 4), thereby being electrically connected to the pixel circuit PXC.

The second electrode PE2 may be in direct contact with the second alignment electrode ALE2 through a second contact hole CH2, thereby being electrically and/or physically connected to the second alignment electrode ALE2. The second contact hole CH2 may be formed as a portion of at least one insulating layer located between the second electrode PE2 and the second alignment electrode ALE2 is opened, and a portion of the second alignment electrode ALE2 may be exposed by the second contact hole CH2. In one or more embodiments, the second contact hole CH2 may be located in the emission area EMA of the pixel PXL.

The second power line PL2, the second alignment electrode ALE2, and the second electrode PE2 may be electrically connected to each other through the first via hole VIH1 and the second contact hole CH2. Although a case where the second alignment electrode ALE2 and the second electrode PE2 may be connected to each other while being in direct contact with each other through the second contact hole CH2 has been described in the above-described embodiment, the present disclosure is not limited thereto. In one or more embodiments, in order to prevent a failure caused by a material characteristic of the second alignment electrode ALE2, the second electrode PE2 is not in direct contact with the second alignment electrode ALE2 but may be in direct contact with the second power line PL2, thereby being electrically connected to the second power line PL2.

In one or more embodiments, a sub-bank S_BNK may be disposed in the emission area EMA.

The sub-bank S_BNK may include the same material as the first bank BNK1, and may be formed with the first bank BNK1 through the same process. The sub-bank S_BNK may be a structure that controls spreading of an ink including light emitting elements LD such that the ink is not supplied to only a specific area of a pixel PXL in a process of supplying the ink to the corresponding pixel PXL. In an example, the sub-bank S_BNK and the first bank BNK1 may be surface-treated to have hydrophobicity. Examples of the above-described surface treatment may include a surface treatment using a surface modifier as a hydrophobic treatment agent, a treatment by various kinds of energy rays, a treatment by chemical absorption, a treatment by graft polymerization on a material surface, and the like. In one or more embodiments, the hydrophobicity (e.g., "lipophilicity" or "liquid repellency") may mean a property that is not easily bonded to water molecules, a property that bounces an organic solvent or the like as a liquid derived from an inkjet ink, or the like. The sub-bank S_BNK that is surface-treated to have hydrophobicity is not connected to the first bank BNK1 but may be provided in an opened shape (e.g., an island shape) such that the ink can be uniformly spread in the emission area EMA. In an example, the sub-bank S_BNK may be provided in a separated pattern or an isolated island shape in the emission area EMA (or the opening OP of the first bank BNK1).

The sub-bank S_BNK may include the first sub-bank S_BNK1 and the second sub-bank S_BNK2, which are disposed to be spaced from each other.

The first sub-bank S_BNK1 may be disposed to correspond to an area in which the third part CTE1_3 of the first intermediate electrode CTE1 is located in the emission area EMA (or the opening (OP) of the first bank BNK1). In an example, the first sub-bank S_BNK1 may be located to correspond to the first cavity VO1 of the third part CTE1_3. In a plan view, the first sub-bank S_BNK1 may be located in the first cavity VO1, and the third part CTE1_3 of the first intermediate electrode CTE1 may be around (e.g., may surround) an edge of the first sub-bank S_BNK1. The third part CTE1_3 of the first intermediate electrode CTE1 and the first sub-bank S_BNK1 may in contact with each other. In one or more embodiments, the first intermediate electrode CTE1 may be provided in a shape detouring around the first sub-bank S_BNK1. The first sub-bank S_BNK1 may be located between the first alignment area (e.g., an area in which the first light emitting elements LD1 are located) and the second alignment area (e.g., an area in which the second light emitting elements LD2 are located). In an example, the first sub-bank S_BNK1 may be located between the left upper end area of the emission area EMA and the left lower end area of the emission area EMA.

In a plan view, the first sub-bank S_BNK1 may be located in the first cavity VO1, and may be in contact with the third part CTE1_3 of the first intermediate electrode CTE1. However, the present disclosure is not limited thereto. In one or more embodiments, the first sub-bank S_BNK1 may be spaced from the third part CTE1_3 of the first intermediate electrode CTE1, or at least partially overlap with the third part CTE1_3.

The second sub-bank S_BNK2 may be disposed to correspond to an area in which the ninth part CTE3_3 of the third intermediate electrode CTE3 is located in the emission area EMA (or the opening OP of the first bank BNK1). In an example, the second sub-bank S_BNK2 may be located to correspond to the second cavity VO2 of the ninth part CTE3_3. In a plan view, the second sub-bank S_BNK2 may be located in the second cavity VO2, and the ninth part CTE3_3 of the third intermediate electrode CTE3 may surround an edge of the second sub-bank S_BNK2. The ninth part CTE3_3 of the third intermediate electrode CTE3 and the second sub-bank S_BNK2 may be in contact with each other. In one or more embodiments, the third intermediate electrode CTE3 may be provided in a shape detouring around the second sub-bank S_BNK2. The second sub-bank S_BNK2 may be located between the third alignment area (e.g., an area in which the third light emitting elements LD3 are located) and the fourth alignment area (e.g., an area in which the fourth light emitting elements LD4 are located). In an example, the second sub-bank S_BNK2 may be located between the right lower end area of the emission area EMA and the right upper end area of the emission area EMA.

In a plan view, the second sub-bank S_BNK2 may be located in the second cavity VO2, and may be in contact with the ninth part CTE3_3 of the third intermediate electrode CTE3. However, the present disclosure is not limited thereto. In one or more embodiments, the second sub-bank S_BNK2 may be spaced from the ninth part CTE3_3 of the third intermediate electrode CTE3, or at least partially overlap with the ninth part CTE3_3.

As described above, the sub-bank S_BNK that is not connected to the first bank BNK1 but has an isolated island shape may be located in the emission area. When the ink is distributed in only one area (e.g., an upper end area) of the emission area EMA in a process of spraying the ink onto the pixel PXL, the ink is moved to another area (e.g., a lower end area) of the emission area EMA through an area in which the sub-bank S_BNK is not located, e.g., between the first sub-bank S_BNK1 and the second sub-bank S_BNK2, between the first bank BNK1 and the first sub-bank S_BNK1, and between the first bank BNK1 and the second sub-bank S_BNK2, thereby being uniformly distributed throughout the whole of the emission area EMA. Accordingly, a portion at which the ink is not discharged in the emission area EMA is reduced, thereby reducing or minimizing a dark spot defect or the like because of the light emitting elements LD not being located uniformly in the emission area EMA.

In addition, as the sub-bank S_BNK is hydrophobically surface-treated, the light emitting elements LD may not be aligned in one area of the emission area EMA, in which the sub-bank S_BNK is located. For example, the sub-bank S_BNK may be induced to be located only in a desired area (e.g., between the first alignment electrode ALE1 overlapping with the first electrode PE1 and the second alignment electrode ALE2 overlapping with the first part CTE1_1 of the first intermediate electrode CTE1, between the first alignment electrode ALE1 overlapping with the second part CTE1_2 of the first intermediate electrode CTE1 and the second alignment electrode ALE2 overlapping with the fourth part CTE2_1 of the second intermediate electrode CTE2, between the first alignment electrode ALE1 overlapping with the fifth part CTE2_2 of the second intermediate electrode CTE2 and the another second alignment electrode ALE2 overlapping with the seventh part CTE3_1 of the third intermediate electrode CTE3, and between the first alignment electrode ALE1 overlapping with the eighth part CTE3_2 of the third intermediate electrode CTE3 and the another second alignment electrode ALE2 overlapping with the second electrode PE2), thereby reducing or preventing that the light emitting elements LD are aligned in an unwanted area. Accordingly, loss of the light emitting elements LD is reduced or minimized, and a number of effective light sources provided per unit area in a desired area of the emission area EMA is further secured, so that the light emission efficiency of the pixel PXL can be improved.

Hereinafter, a stacked structure (or sectional structure) of the pixel PXL in accordance with the above-described embodiment will be mainly described with reference to FIGS. 7 to 10.

Figure 7:
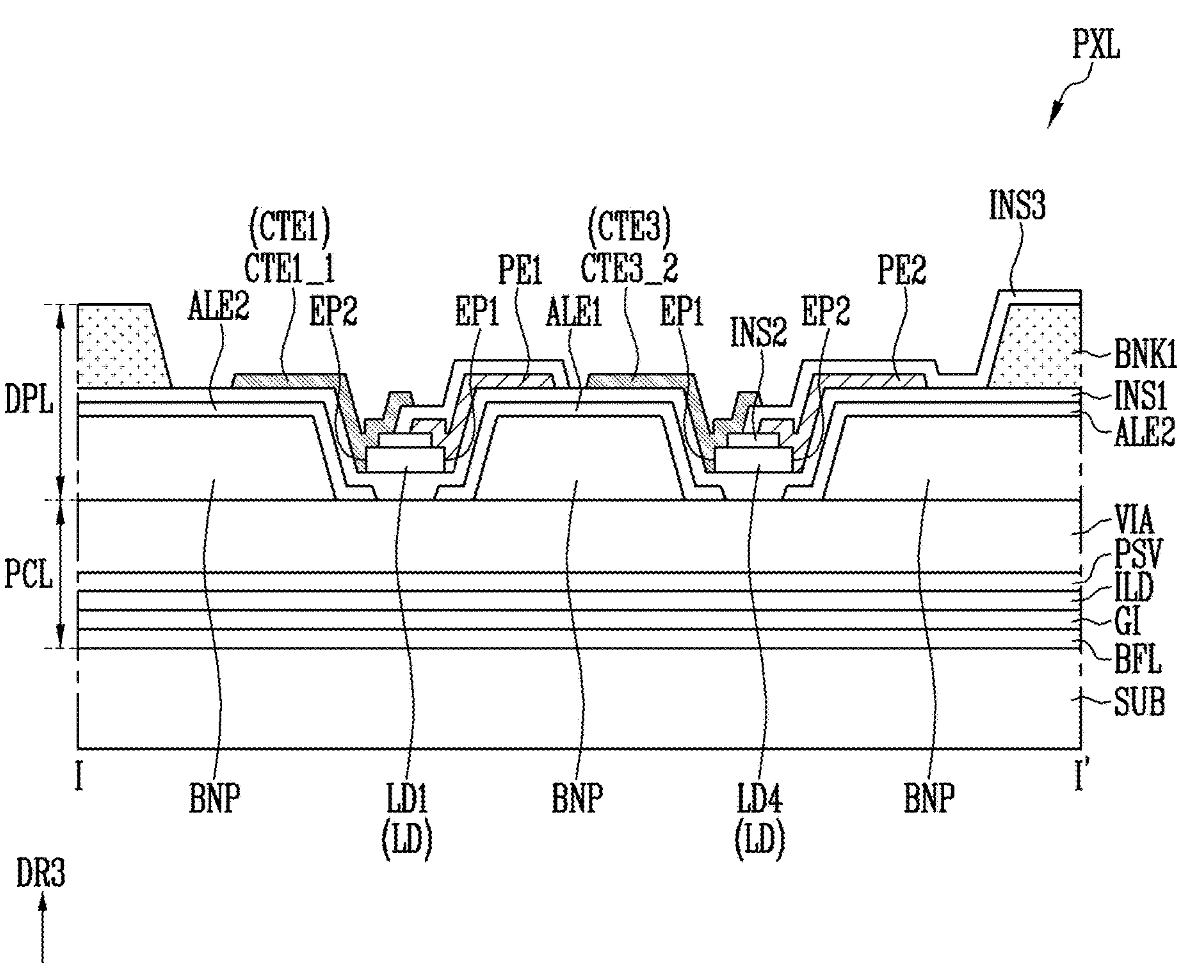
FIGS. 7 to 9 are cross-schematic sectional views taken along the line I-I' shown in FIG. 5.
Figure 8:
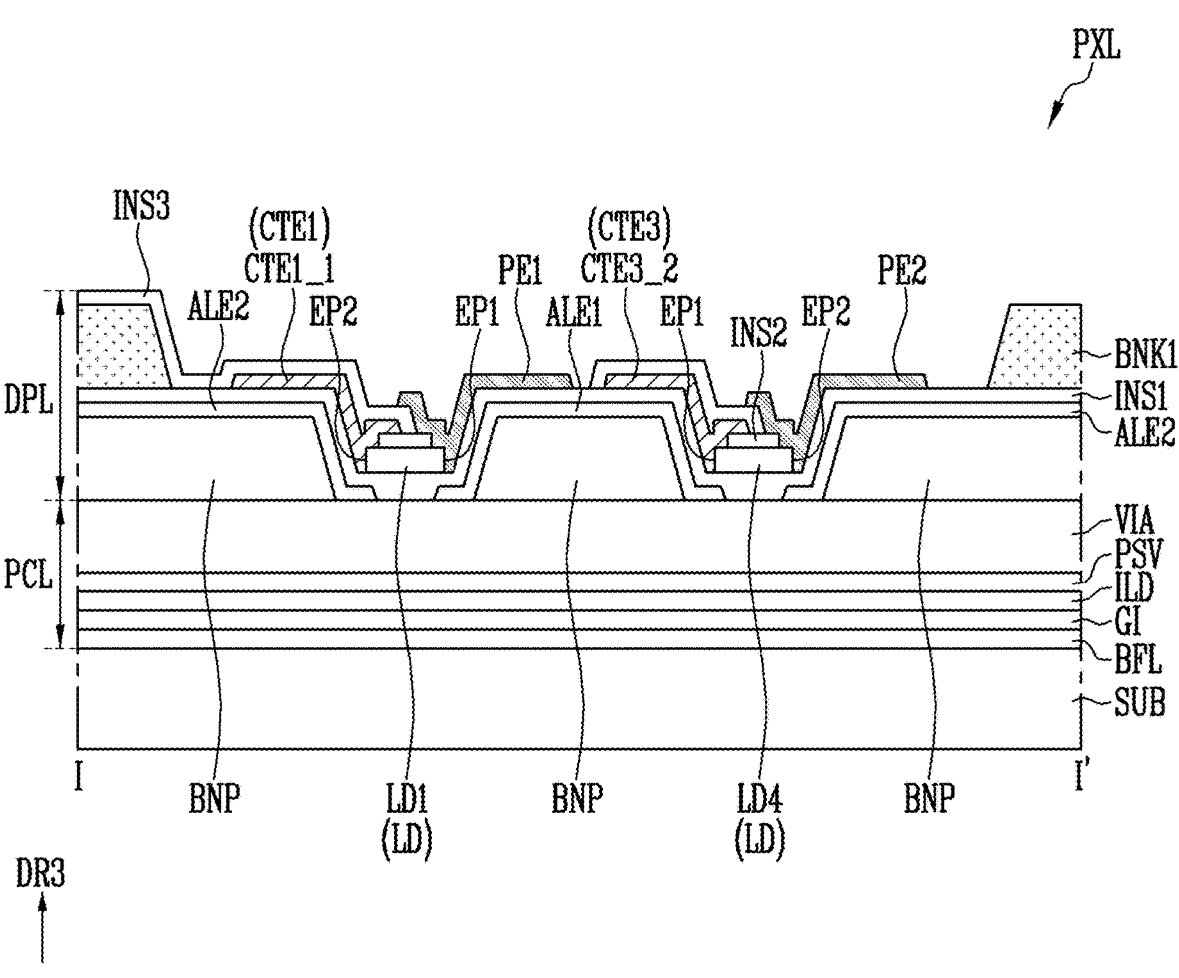
Figure 9:
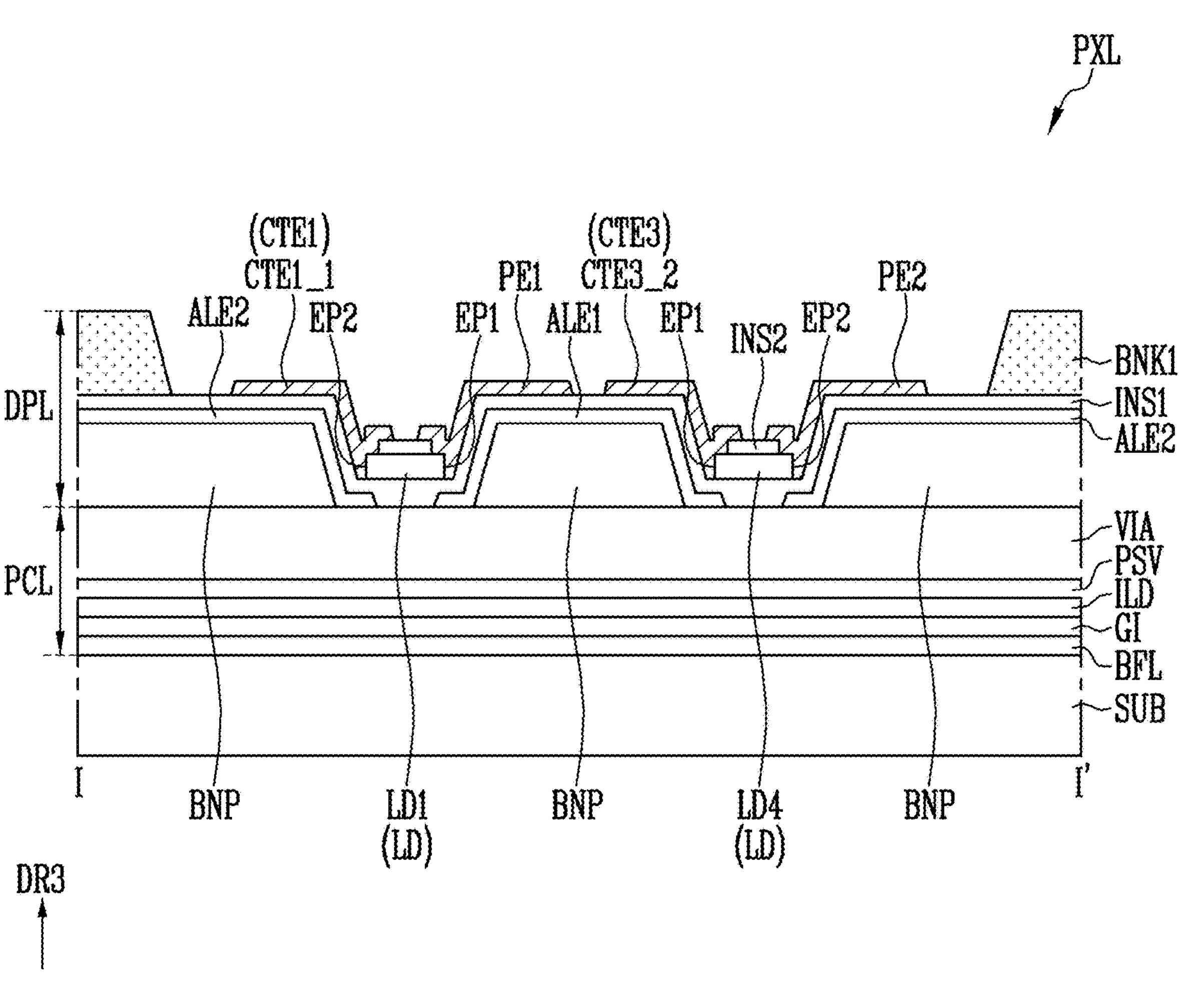
Figure 10:
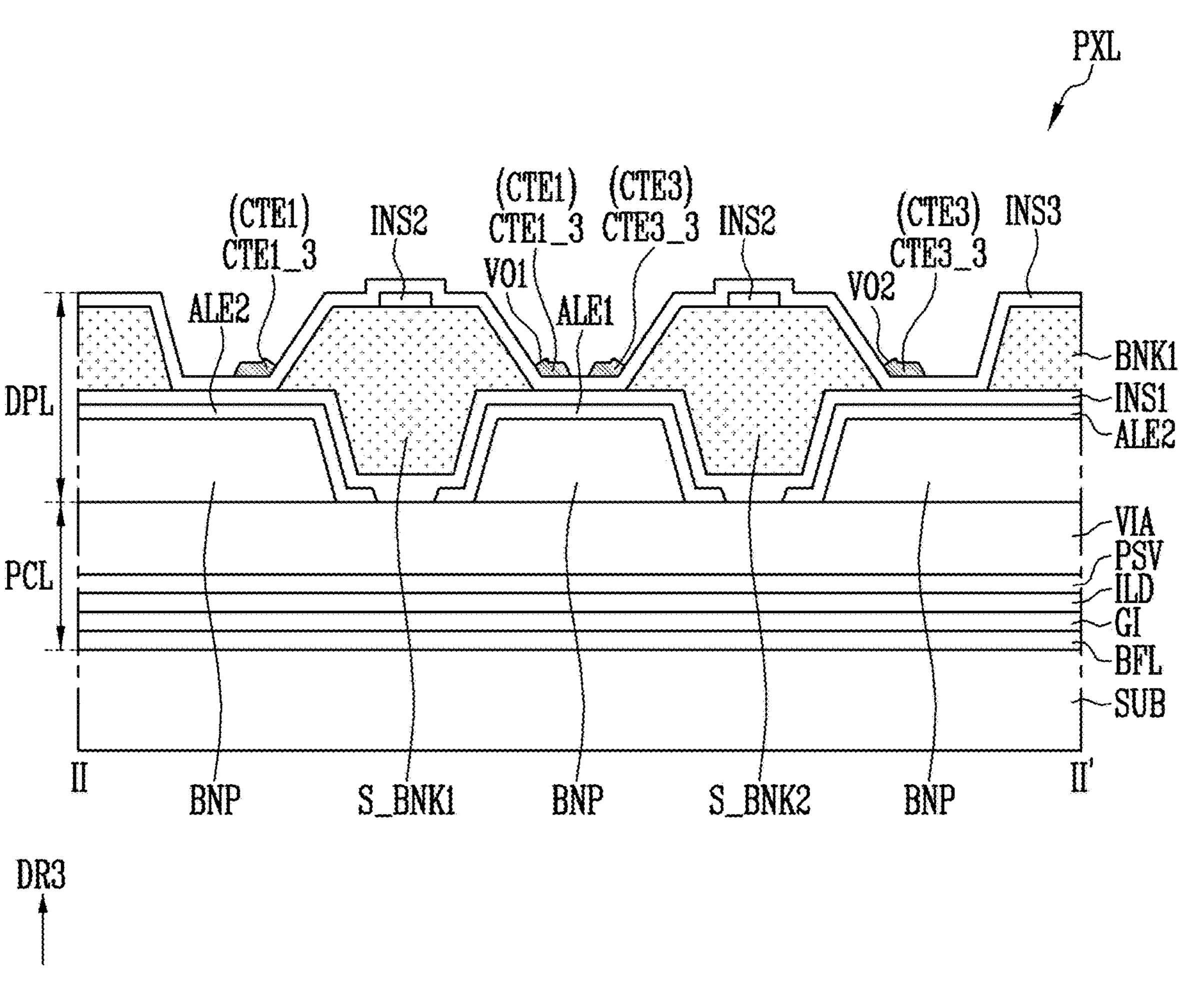
FIG. 10 is a schematic cross-sectional view taken along the line II-II' shown in FIG. 5.

FIGS. 7 to 9 are schematic cross-sectional views taken along the line I-I' shown in FIG. 5. FIG. 10 is a schematic cross-sectional view taken along the line II-II' shown in FIG. 5.

Embodiments shown in FIGS. 8 and 9 illustrate modified examples of one or more embodiments shown in FIG. 7 in relation to a forming process of the first and second electrodes PE1 and PE2 and the intermediate electrodes CTE and existence of a third insulating layer INS3. For example, one or more embodiments in which the first and second electrodes PE1 and PE2 are formed after the first and third intermediate electrodes CTE1 and CTE3 and the third insulating layer INS3 are formed is illustrated in FIG. 8, and one or more embodiments in which the first and second electrodes PE1 and PE2 and the first and third intermediate electrodes CTE1 and CTE3 are formed through the same process is illustrated in FIG. 9.

In embodiments shown in FIGS. 7 to 10, the stacked structure (or sectional structure) of the pixel PXL is simplified and illustrated, such as that each electrode is illustrated as an electrode having a signal layer and each insulating layer is illustrated as an insulating layer provided as a single layer, but the present disclosure is not limited thereto.

Referring to FIGS. 1 to 10, the pixel PXL may include the substrate SUB, a pixel circuit layer PCL, and a display element layer DPL.

The pixel circuit layer PCL and the display element layer DPL may be disposed on one surface of the substrate SUB to overlap with each other. In an example, the display area DA of the substrate SUB may include the pixel circuit layer PCL disposed on the one surface of the substrate SUB and the display element layer DPL disposed on the pixel circuit layer PCL. However, the mutual positions of the pixel circuit layer PCL and the display element DPL on the substrate SUB may vary in one or more embodiments. When the pixel circuit layer PCL and the display element layer DPL are provided as separate layers and overlap with each other, a layout space for forming each of the pixel circuit (see "PXC" shown in FIG. 4) and the emission component (see "EMU" shown in FIG. 4) on a plane can be sufficiently secured.

The substrate SUB may include a transparent insulating material to allow light to be transmitted therethrough. The substrate SUB may be a rigid substrate or a flexible substrate.

Circuit elements constituting a pixel circuit PXC of a corresponding pixel PXL and suitable signal lines (e.g., predetermined signal lines) electrically connected to the circuit elements may be disposed in each pixel area PXA of the pixel circuit layer PCL. In addition, alignment electrodes ALE, light emitting elements LD, electrodes PE, and/or intermediate electrodes CTE, which constitute an emission component EMU of the corresponding pixel PXL may be disposed in each pixel area PXA of the display element layer DPL.

The pixel circuit layer PCL may include at least one insulating layer in addition to the circuit elements and the signal lines. For example, the pixel circuit layer PCL may include a buffer layer BFL, a gate insulating layer GI, an interlayer insulating layer ILD, a passivation layer PSV, and a via layer VIA, which are sequentially stacked on the substrate SUB along the third direction DR3.

The buffer layer BFL may be entirely disposed on the substrate SUB. The buffer layer BFL may prevent an impurity from being diffused into transistors T included in the pixel circuit PXC. The buffer layer BFL may be an inorganic insulating layer including an inorganic material. The buffer layer BFL may include at least one of silicon nitride ($SiN_x$), silicon oxide ($SiO_x$), silicon oxynitride ($SiO_xN_y$), and/or aluminum oxide ($AlO_x$), but the present disclosure is not limited thereto. The buffer layer BFL may be provided as a single layer, but may be provided as a multi-layer including at least two layers. When the buffer layer BFL is provided as the multi-layer, the layers may be formed of the same material or may be formed of different materials. The buffer layer BFL may be omitted according to a material of the substrate SUB, a process condition, and the like.

The gate insulating layer GI may be entirely disposed on the buffer layer BFL. The gate insulating layer GI may include the same material as the above-described buffer layer BFL, or include a suitable (or selected) material from among the materials exemplified as the material constituting the buffer layer BFL. In an example, the gate insulating layer GI may be an inorganic insulting layer including an inorganic material.

The interlayer insulating layer ILD may be entirely provided and/or formed on the gate insulating layer GI. The interlayer insulating layer ILD may include the same material as the buffer layer BFL, or include a suitable (or selected) material from among the materials exemplified as the material constituting the buffer layer BFL.

The passivation layer PSV may be entirely provided and/or formed on the interlayer insulating layer ILD. The passivation layer PSV may include the same material as the buffer layer BFL, or include a suitable (or selected) material from among the materials exemplified as the material constituting the buffer layer BFL.

The via layer VIA may be entirely provided and/or formed on the passivation layer PSV. The via layer VIA may be an inorganic insulating layer including an inorganic material or an organic insulating layer including an organic material. The inorganic insulating layer may include, for example, at least one of silicon oxide ($SiO_x$), silicon nitride ($SiN_x$), silicon oxynitride ($SiO_xN_y$), and/or aluminum oxide ($AlO_x$). The organic insulating layer may include, for example, at least one of acrylic resin, epoxy resin, phenolic resin, polyamide resin, polyimide resin, unsaturated polyester resin, poly-phenylene ether resin, poly-phenylene sulfide resin, and/or benzocyclobutene resin.

The via layer VIA may include a plurality of via holes. In an example, the via layer VIA may be partially opened to include the first, second, and third via holes VIH1, VIH2, and VIH3.

The pixel circuit may include at least one transistor disposed on the buffer layer BFL. The transistor may include the first, second, and third transistors T1, T2, and T3 described with reference to FIG. 4. The pixel circuit PXC may be covered by the via layer VIA.

The display element layer DPL may be disposed on the via layer VIA.

The display element layer DPL may include a bank pattern BNP, the alignment electrodes ALE, the first bank BNK, the sub-bank S_BNK, the light emitting elements LD, the electrodes PE, and the intermediate electrodes CTE.

The bank pattern BNP may be located on the via layer VIA. In an example, the bank pattern BNP may protrude in the third direction DR3 on one surface of the via layer VIA. One area of each of the alignment electrodes ALE disposed on the bank pattern BNP may protrude in the third direction DR3 (or a thickness direction of the substrate SUB).

The bank pattern BNP may include an inorganic insulating layer including an inorganic material or an organic insulating layer including an organic material. In one or more embodiments, the bank pattern BNP may include a single-layered organic insulating layer and/or a single-layered inorganic insulating layer, but the present disclosure is not limited thereto. In one or more embodiments, the bank pattern BNP may be provided in the form of a multi-layer in which at least one organic insulating layer and at least one inorganic insulating layer are stacked. However, the material of the bank pattern BNP is not limited to the above-described embodiment. In one or more embodiments, the bank pattern BNP may include a conductive material (or substance).

The bank pattern BNP may be located on the bottom of each of the first and second alignment electrodes ALE1 and ALE2 in at least the emission area EMA, thereby overlapping with a corresponding alignment electrode ALE.

The bank pattern BNK may have a section of a trapezoid of which width is narrowed as approaching the top thereof along a third direction (Z-axis direction) from the one surface (or upper surface) of the via layer VIA, but the present disclosure is not limited thereto.

The bank pattern BNP may be used as a reflective member. In an example, the bank pattern BNP along with the alignment electrode ALE disposed on the top thereof may be used as a reflective member that guides light emitted from the light emitting element LD in an image display direction of the display device DD, thereby improving the light emission efficiency of the pixel PXL.

The first and second alignment electrodes ALE1 and ALE2 may be located on the bank pattern BNP.

The first and second alignment electrodes ALE1 and ALE2 may be disposed on (or at) the same plane, and have the same thickness in the third direction DR3. The first and second alignment electrodes ALE1 and ALE2 may be concurrently (e.g., simultaneously) formed through the same process or may be formed consecutively.

The first and second alignment electrodes ALE1 and ALE2 may be configured with a material having reflexibility to allow light emitted from the light emitting elements LD to advance in the image display direction (or front direction) of the display device DD. In an example, the first and second alignment electrodes ALE1 and ALE2 may be made of a conductive material (or substance). The conductive material may include an opaque metal suitable for reflecting light emitted from the light emitting elements LD in the image display direction of the display device DD.

Each of the first and second alignment electrodes ALE1 and ALE2 may be formed as a single layer, but the present disclosure is not limited thereto. In one or more embodiments, each of the first and second alignment electrodes ALE1 and ALE2 may be provided and/or formed as a multi-layer in which at least two materials from among metals, alloys, conductive oxide, and conductive polymers are stacked. Each of the first and second alignment electrodes ALE1 and ALE2 may be formed as a multi-layer including at least two layers so as to reduce or minimize distortion caused by a signal delay when a signal (or voltage) is transferred to both end portions, e.g., first and second end portions EP1 and EP2 of each of the light emitting elements LD.

When the first and second alignment electrodes ALE1 and ALE2 are configured with a conductive material having reflexibility, light emitted from the first and second end portions EP1 and EP2 of each of the light emitting elements LD may further advance in the image display direction of the display device DD (e.g., the third direction DR3).

A first insulating layer INS1 may be disposed over the first and second alignment electrodes ALE1 and ALE2.

The first insulating layer INS1 may be disposed on the alignment electrodes ALE and the via layer VIA. The first insulating layer INS1 may be partially opened to expose components located thereunder in at least the non-emission area NEA. In an example, the first insulating layer INS1 may be partially opened to include the first contact hole CH1 exposing one area of the first alignment electrode ALE1 as one area is removed in at least the non-emission area NEA and the second contact hole CH2 exposing one area of the second alignment electrode ALE2 as another area is removed in at least the non-emission area.

The first insulating layer INS1 may be formed as an inorganic insulating layer made of an inorganic material. The first insulating layer INS1 may be provided as a single layer or a multi-layer. When the first insulating layer INS1 is provided as the multi-layer, the first insulating layer INS1 may be provided in a distributed Bragg reflector structure in which a first inorganic layer and a second inorganic layer, which have different refractive indices, are alternately stacked.

The first bank BNK1, the first sub-bank S_BNK1, and the second sub-bank S_BNK2 may be located on the first insulating layer INS1.

The first bank BNK1 may be disposed on the first insulating layer INS1 in at least the non-emission area NEA, but the present disclosure is not limited thereto. The first bank BNK1 may be formed between adjacent pixels PXL to surround an emission area EMA of each pixel PXL, thereby constituting a pixel defining layer partitioning (or defining) the emission area EMA of the corresponding pixel PXL. The first bank BNK1 may be a dam structure that prevents a solution (or ink) in which light emitting element LD are mixed from being introduced into emission areas EMA of adjacent pixels PXL or controls a certain amount of solution to be supplied to each emission area EMA, in a process of supplying the light emitting element LD to the emission area EMA.

The first and second sub-banks S_BNK1 and S_BNK2 may be disposed on the first insulating layer INS1 in at least the emission area EMA. Each of the first and second sub-banks S_BNK1 and S_BNK2 may be disposed to be spaced from the first bank BNK1. Also, the first sub-bank S_BNK1 and the second sub-bank S_BNK2 may be located in the emission area EMA to be spaced from each other. The first and second sub-banks S_BNK1 and S_BNK2 may be structures that allow an ink in which light emitting elements LD are dispersed to be uniformly spread through the whole of the emission area EMA in a process of aligning the light emitting elements LD in the pixel PXL. In an example, the first and second sub-banks S_BNK1 and S_BNK2 may be structures that control the ink spreading.

Each of the first and second sub-banks S_BNK1 and S_BNK2 may be designed to have a gentle side inclination. In an example, the first and second sub-banks S_BNK1 and S_BNK2 may have a side slope angle smaller than 80 degrees. In one or more embodiments, the first and second sub-banks S_BNK1 and S_BNK2 may be designed to have various side slope angles within a range in which step coverage of the first and third intermediate electrodes CTE1 and CTE3 can be improved such that a defect (e.g., disconnection) or the like, in which the first and third intermediate electrodes CTE1 and CTE3 are cut off by a profile of the first and second sub-banks S_BNK1 and S_BNK2, does not occur when the first and third intermediate electrodes CTE1 and CTE3 are located on the top of the first and second sub-banks S_BNK1 and S_BNK2, thereby overlapping with the first and second sub-banks S_BNK1 and S_BNK2 for a reason of process margin security or the like.

The first bank BNK1, the first sub-bank S_BNK1, and the second sub-bank S_BNK2, which are described above, may include the same material and may be formed through the same process to be provided in the same layer. However, the present disclosure is not limited thereto. In an example, the first bank BNK1, the first sub-bank S_BNK1, and the second sub-bank S_BNK2 may be configured with an organic layer.

The first bank BNK1 and the bank pattern BNP may be formed through different processes to be provided in different layer, but the present disclosure is not limited thereto. In one or more embodiments, the first bank BNK1 and the bank pattern BNP are formed through different processes but may be provided in the same layer. Alternatively, the first bank BNK1 and the bank pattern BNP may be formed through the same process to be provided in the same layer.

Light emitting elements LD may be supplied and aligned in the emission area EMA of the pixel PXL, in which the first insulating layer INS1, the first bank BNK1, and the first and second sub-bank S_BNK1 and S_BNK2 are formed. In an example, the light emitting elements LD may be supplied (or input) to the emission area EMA through an inkjet printing process or the like, and may be aligned between the alignment electrodes ALE by an electric field formed by a signal (or alignment signal) applied to each of the alignment electrodes ALE. In an example, the light emitting elements LD may be aligned on the first insulating layer INS1 between the first alignment electrode ALE1 and the second alignment electrode ALE2 and the first insulating layer INS1 between the first alignment electrode ALE1 and the another alignment electrode ALE2.

The light emitting elements LD may include a first light emitting element LD1, a second light emitting element LD2, a third light emitting element LD3, and a fourth light emitting element LD4.

The first light emitting element LD1 may be arranged between a left upper end area of the first alignment electrode ALE1 and the second alignment electrode ALE2 adjacent to the left upper end area of the first alignment electrode ALE1. The first light emitting element LD1 may include a first end portion EP1 overlapping with the first alignment electrode ALE1 and a second end portion EP2 overlapping with the second alignment electrode ALE2.

The second light emitting element LD2 may be arranged between a left lower end area of the first alignment electrode ALE1 and the second alignment electrode ALE2 adjacent to the left lower end area of the first alignment electrode ALE1. The second light emitting element LD2 may include a first end portion EP1 overlapping with the first alignment electrode ALE1 and a second end portion EP2 overlapping with the second alignment electrode ALE2.

The third light emitting element LD3 may be arranged between a right lower end area of the first alignment electrode ALE1 and the another second alignment electrode ALE2 adjacent to the right lower end area of the first alignment electrode ALE1. The third light emitting element LD3 may include a first end portion EP1 overlapping with the first alignment electrode ALE1 and a second end portion EP2 overlapping with the another second alignment electrode ALE2.

The fourth light emitting element LD4 may be arranged between a right upper end area of the first alignment electrode ALE1 and the another second alignment electrode ALE2 adjacent to the right upper end area of the first alignment electrode ALE1. The fourth light emitting element LD4 may include a first end portion EP1 overlapping with the first alignment electrode ALE1 and a second end portion EP2 of the another second alignment electrode ALE2.

A second insulating layer INS2 (or insulating pattern) may be disposed on each of the first, second, third, and fourth light emitting elements LD1, LD2, LD3, and LD4.

The second insulating layer INS2 may be located on each of the first, second, third, and fourth light emitting elements LD1, LD2, LD3, and LD4, and partially cover an outer surface (e.g., an outer peripheral or circumferential surface or surface) of each of the first, second, third, and fourth light emitting elements LD1, LD2, LD3, and LD4, thereby exposing, to the outside, the first end portion EP1 and the second end portion EP2 of each of the first, second, third, and fourth light emitting elements LD1, LD2, LD3, and LD4.

The second insulating layer INS2 may include an inorganic insulating layer including an inorganic material or an organic insulating layer. In an example, the second insulating layer INS2 may include an inorganic insulating layer suitable for protecting an active layer (see "12" shown in FIG. 1) of each of the first, second, third, and fourth light emitting elements LD1, LD2, LD3, and LD4 from external oxygen, moisture, and the like. However, the present disclosure is not limited thereto, and the second insulating layer INS2 may be configured with an organic insulating layer including an organic material according to a design condition or the like of the display device DD (or the display panel DP) to which the first, second, third, and fourth light emitting elements LD1, LD2, LD3, and LD4 are applied. The second insulating layer INS2 may be configured as a single layer or a multi-layer.

When an empty gap exists between the first, second, third, and fourth light emitting elements LD1, LD2, LD3, and LD4 and the first insulating layer INS1 before the second insulating layer INS2 is formed, the empty gap may be filled with the second insulating layer INS2 in a process of forming the second insulating layer INS2. The second insulating layer INS2 may be formed on each of the first and second sub-banks S_BNK1 and S_BNK2, but the present disclosure is not limited thereto.

The second insulating layer INS2 is formed on light emitting elements LD that have been completely aligned in the emission area EMA of each pixel PXL, so that the light emitting elements LD can be prevented from being separated from positions at which the light emitting elements LD are aligned.

Different electrodes from among the first electrode PE1, the second electrode PE2, the first intermediate electrode CTE1, the second intermediate electrode CTE2, and the third intermediate electrode CTE3 may be formed on the first and second end portions EP1 and EP2 of the light emitting elements LD, which are not covered by the second insulating layer INS2. For example, the first electrode PE1 may be formed on the first end portion of the first light emitting element LD1, and the first intermediate electrode CTE1 may be formed on the second end portion EP2 of the first light emitting element LD1. The first intermediate electrode CTE1 may be formed on the first end portion EP1 of the second light emitting element LD2, and the second intermediate electrode CTE2 may be formed on the second end portion EP2 of the second light emitting element LD2. The second intermediate electrode CTE2 may be formed on the first end portion EP1 of the third light emitting element LD3, and the third intermediate electrode CTE3 may be formed on the second end portion EP2 of the third light emitting element LD3. The third intermediate electrode CTE3 may be formed on the first end portion EP1 of the fourth light emitting element LD4, and the second electrode PE2 may be formed on the second end portion EP2 of the fourth light emitting element LD4.

The first electrode PE1 may be disposed on the top of the first alignment electrode ALE1 to overlap with the left upper end area of the first alignment electrode ALE1, and the second electrode PE2 may be disposed on the top of the another second alignment electrode ALE2 to overlap with an upper end area of the another second alignment electrode ALE2.

The first intermediate electrode CTE1 may include a first part CTE1_1 disposed on the top of the second alignment electrode ALE2 to overlap with the second alignment electrode ALE2 facing (e.g., opposing) the left upper end area of the first alignment electrode ALE1, a second part CTE1_2 disposed on the first alignment electrode ALE1 to overlap with the left lower end area of the first alignment electrode ALE1, and a third part CTE1_3 connecting the first part CTE1_1 and the second part CTE1_2 to each other. In one or more embodiments, the third part CTE1_3 may be around (e.g., may surround) an edge of the first sub-bank S_BNK1. In an example, the third part CTE1_3 may include a first cavity VO1 corresponding to the first sub-bank S_BNK1, and have a shape detouring around the first sub-bank S_BNK1. In a sectional view, the third part CTE1_3 may be located adjacent to each of both sides of the first sub-bank S_BNK1 located to correspond to the first cavity VO1 with the first sub-bank S_BNK1 interposed therebetween. In an example, the third part CTE1_3 may be located adjacent to each of one side of the first sub-bank S_BNK1 and the other side facing (e.g., opposing) the one side.

The second intermediate electrode CTE2 may include a fourth part CTE2_1 disposed on the top of the second alignment electrode ALE2 to overlap with the second alignment electrode ALE2 facing (e.g., opposing) the left lower end area of the first alignment electrode ALE1, a fifth part CTE2_2 disposed on the top of the first alignment electrode ALE1 to overlap with the right lower end area of the first alignment electrode ALE1, and a sixth part CTE2_3 connecting the fourth part CTE2_1 and the fifth part CTE2_2 to each other. In one or more embodiments, the sixth part CTE2_3 may be located in the non-emission area NEA, thereby overlapping with the first bank BNK1.

The third intermediate electrode CTE3 may include a seventh part CTE3_1 disposed on the top of the another second alignment electrode ALE2 to overlap with the another second alignment electrode ALE2 facing (e.g., opposing) the right lower end area of the first alignment electrode ALE1, an eighth part CTE3_2 disposed on the top of the first alignment electrode ALE1 to overlap with the right upper end area of the first alignment electrode ALE1, and a ninth part CTE3_3 connecting the seventh part CTE3_1 and the eighth part CTE3_2 to each other. In one or more embodiments, the ninth part CTE3_3 may be around (e.g., may surround) an edge of the second sub-bank S_BNK2. In an example, the ninth part CTE3_3 may include a second cavity VO2 corresponding to the second sub-bank S_BNK2, and have a shape detouring around the second sub-bank S_BNK2. In a sectional view, the ninth part CTE3_3 may be located adjacent to each of both sides of the second sub-bank S_BNK2 located to correspond to the second cavity VO2. In an example, the ninth part CTE3_3 may be located adjacent to one side of the second sub-bank S_BNK2 and the other side facing (e.g., opposing) the one side.

In the embodiment shown in FIG. 7, the first electrode PE1 and the second electrode PE2 may be first formed on the second insulating layer INS2. The first electrode PE1 may be electrically connected to first light emitting elements LD while being in direct contact with a first end of each of the first light emitting elements LD1. The second electrode PE2 may be electrically connected to fourth light emitting elements LD4 while being in direct contact with a second end portion EP2 of each of the fourth light emitting elements LD4. In one or more embodiments, the second intermediate electrode CTE2 may be formed with the first and second electrodes PE1 and PE2 through the same process. The second intermediate electrode CTE2 may be electrically connected between second light emitting elements LD2 and third light emitting elements LD3 while being in direct contact with a second end portion EP2 of each of the second light emitting elements LD2 and a first end portion of each of the third light emitting elements LD3. Subsequently, the third insulating layer INS3 may be formed to cover the first electrode PE1, the second electrode PE2, and the second intermediate electrode CTE2.

The third insulating layer INS3 may be located over the first electrode PE1, the second electrode PE2, and the second intermediate electrode CTE2, and cover the first electrode PE1, the second electrode PE2, and the second intermediate electrode CTE2 (or allow the first electrode PE1, the second electrode PE2, and the second intermediate electrode CTE2 not to be exposed to the outside), thereby protecting the first electrode PE1, the second electrode PE2, and the second intermediate electrode CTE2.

The third insulating layer INS3 may include an inorganic insulating layer made of an inorganic material or an organic insulating layer made of an organic material. Also, the third insulating layer INS3 may be formed as a single layer or a multi-layer.

The first and third intermediate electrodes CTE1 and CTE3 may be formed on the third insulating layer INS3. The first intermediate electrode CTE1 may be electrically connected between the first light emitting elements LD1 and the second light emitting elements LD2 while being in direct contact with a second end portion EP2 of each of the first light emitting elements LD1 and a first end portion EP1 of each of the second light emitting element LD2. The third intermediate electrode CTE3 may be electrically connected between the third light emitting elements LD3 and the fourth light emitting elements LD while being in direct contact with a second end portion EP2 of each of the third light emitting elements LD3 and a first end portion EP1 of each of the fourth light emitting elements LD4.

In the embodiment shown in FIG. 8, the first and third intermediate electrodes CTE1 and CTE3 may be first formed on the second insulating layer INS2. Subsequently, the third insulating layer INS3 may be formed to cover the first and third intermediate electrodes CTE1 and CTE3, and the first electrode PE1, the second electrode PE2, and the second intermediate electrode CTE2 may be formed in the emission area EMA on the third insulating layer INS3.

When electrodes disposed on a first end portion EP1 and a second end portion EP2 of each light emitting element LD are disposed in different layers as illustrated in the embodiments shown in FIGS. 7 and 8, the electrodes can be stably separated from each other, so that electrical stability between the first and second end portions EP1 and EP2 of the light emitting elements LD can be ensured.

In the embodiment shown in FIG. 9, the first electrode PE1, the second electrode PE2, the first intermediate electrode CTE1, the second intermediate electrode CTE2, and the third intermediate electrode CTE3 may be disposed in the same layer, and may be (e.g, concurrently (e.g, simultaneously) or sequentially) formed. The third insulating layer INS3 may be omitted, but the present disclosure is not limited thereto. In one or more embodiments, the third insulating layer INS3 may be formed over the first electrode PE1, the second electrode PE2, the first intermediate electrode CTE1, the second intermediate electrode CTE2, and the third intermediate electrode CTE3 to cover the first electrode PE1, the second electrode PE2, the first intermediate electrode CTE1, the second intermediate electrode CTE2, and the third intermediate electrode CTE3. In the embodiment shown in FIG. 9, when electrodes disposed on the first end portion EP1 and the second end portion EP2 of each light emitting elements LD are disposed in the same layer and are concurrently (e.g., simultaneously) formed, a manufacturing process of the pixel PXL can be simplified, and process efficiency can be improved.

Each of the first electrode PE1, the second electrode PE2, the first intermediate electrode CTE1, the second intermediate electrode CTE2, and the third intermediate electrode CTE3 may be configured with various transparent conductive materials. In an example, each of the first electrode PE1, the second electrode PE2, the first intermediate electrode CTE1, the second intermediate electrode CTE2, and the third intermediate electrode CTE3 may include at least one of various transparent conductive materials including Indium Tin Oxide (ITO), Indium Zinc Oxide (IZO), Indium Tin Zinc Oxide (ITZO), Aluminum doped Zinc Oxide (AZO), Gallium doped Zinc Oxide (GZO), Zinc Tin Oxide (ZTO), and/or Gallium Tin Oxide (GTO), and may be implemented substantially transparently or translucently to satisfy a desired transmittance (e.g., a predetermined transmittance). Accordingly, light emitted from the first and second end portions EP1 and EP2 of the light emitting elements LD can be emitted to the outside of the display device DD (or the display panel DP) while passing through the electrodes PE and the intermediate electrodes CTE.

At least one overcoat layer (e.g., a layer for planarizing a top surface of the display element layer DPL) may be further disposed on the top of the electrodes PE and the intermediate electrodes CTE.

In accordance with one or more embodiments, an optical layer may be selectively disposed on the top of the display element layer DPL. In an example, the optical layer may include a color conversion layer and a color filter layer, which convert light emitted from the light emitting elements LD into light having excellent color reproducibility and release the converted light. The optical layer will be described in detail later with reference to FIGS. 11 and 12.

In accordance with the above-described embodiment, as the third part CTE1_3 of the first intermediate electrode CTE1 detours around the first sub-bank S_BNK1 in the emission area EMA, a cutting defect (e.g., disconnection) of the first intermediate electrode CTE1 is reduced or prevented, which may occur as the first intermediate electrode CTE1 is located on the top of the first sub-bank S_BNK1, thereby overlapping with the first sub-bank S_BNK1. Thus, step coverage of the first intermediate electrode CTE1 can be improved. In addition, as the ninth part CTE3_3 of the third intermediate electrode CTE3 detours around the second sub-bank S_BNK2 in the emission area EMA, a cutting defect (e.g., disconnection) of the third intermediate electrode CTE3 is reduced or prevented, which may occur as the third intermediate electrode CTE3 is located on the top of the second sub-bank S_BNK2, thereby overlapping with the second sub-bank S_BNK2. Thus, step coverage of the third intermediate electrode CTE3 can be improved. Accordingly, the reliability of the first and third intermediate electrodes CTE1 and CTE3 can be improved.

In accordance with the above-described embodiment, as the first sub-bank S_BNK1 is located to correspond to the first cavity VO1 of the third part CTE1_3 of the first intermediate electrode CTE1, and the second sub-bank S_BNK2 is located to correspond to the second cavity VO2 of the ninth part CTE3_3 of the third intermediate electrode CTE3, the light emitting elements LD may not be aligned in areas in which the third and ninth parts CTE1_3 and CTE3_3 are located. Accordingly, disconnection of the first and third intermediate electrodes CTE1 and CTE3 can be reduced or prevented, which may occur as the third and ninth parts CTE1_3 and CTE3_3 are located on the top of the light emitting elements LD, thereby overlapping with the light emitting elements LD. Accordingly, the step coverage of the first and third intermediate electrodes CTE1 and CTE3 can be further improved.

Figure 11:
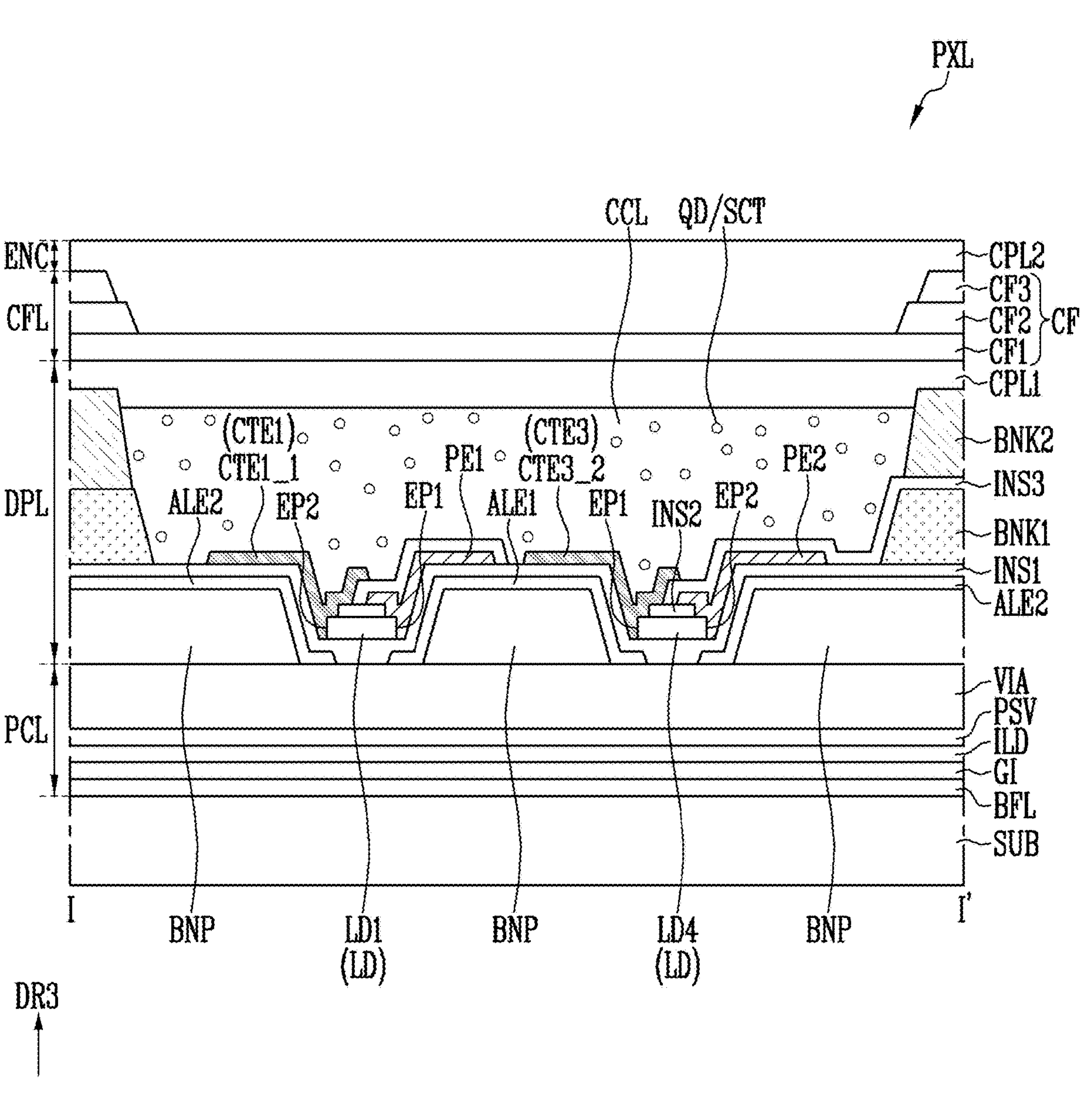
Figure 12:
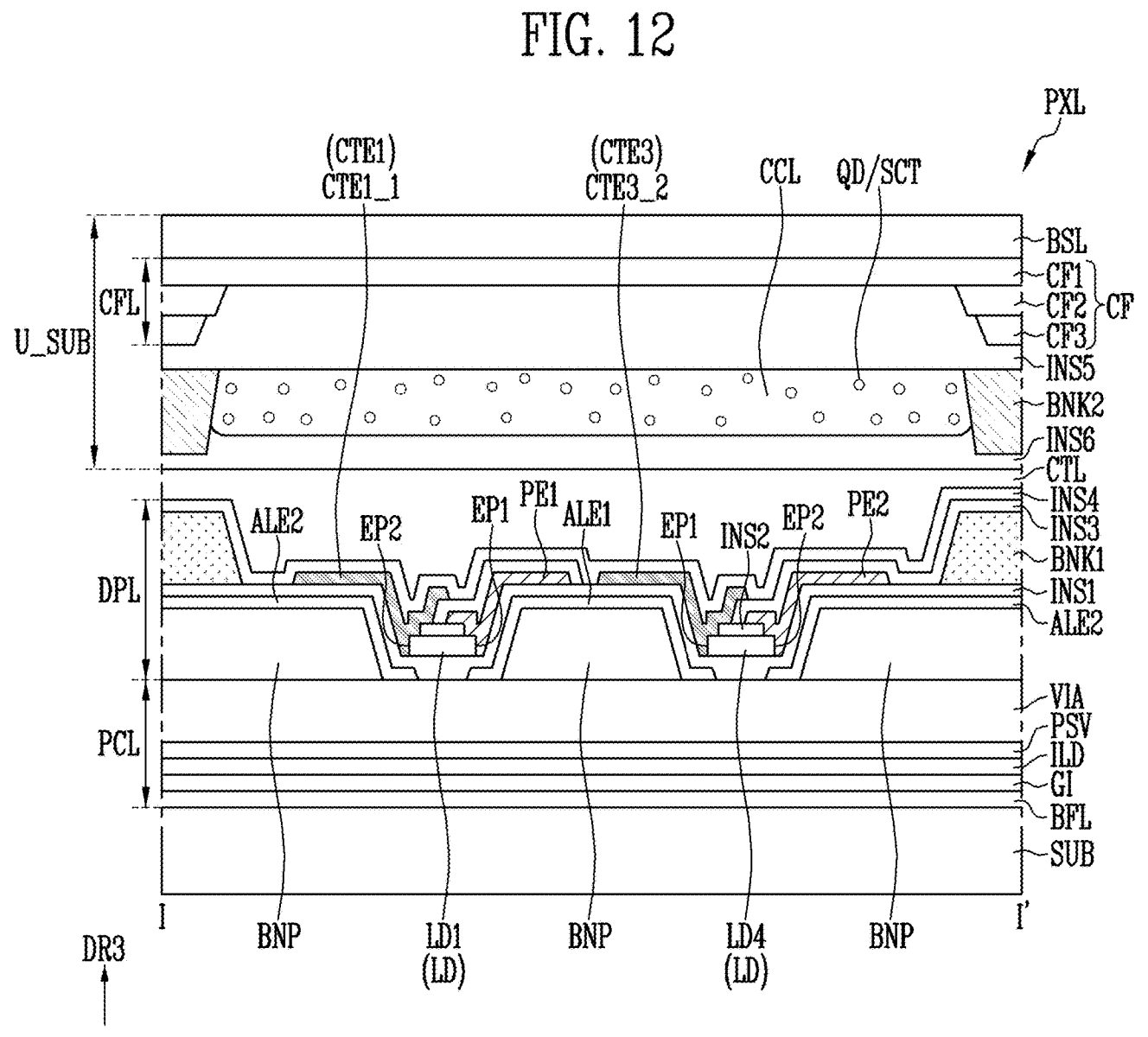

FIGS. 11 and 12 illustrate a pixel PXL in accordance with one or more embodiments of the present disclosure, and are schematic cross-sectional views corresponding to the line I-I' shown in FIG. 5.

Embodiments shown in FIGS. 11 and 12 illustrate different modified examples in relation to a position of a color conversion layer CCL. For example, one or more embodiments in which the color conversion layer CCL and a color filter layer CFL are located on the top of first and third intermediate electrodes CTE1 and CTE3 through a continuous process is disclosed in FIG. 11, and one or more embodiments in which an upper substrate U_SUB including the color conversion layer CCL and the color filter layer CFL is located on a display element layer DPL through an adhesion process using in intermediate layer CTL is disclosed in FIG. 12.

In relation to embodiments shown in FIGS. 11 and 12, portions different from those of the above-described embodiment will be mainly described to avoid redundancy.

First, referring to FIGS. 1 to 11, the pixel PXL may include a substrate SUB, a pixel circuit layer PCL, a display element layer DPL, a color filter layer CFL, and an encap layer ENC.

The display element layer DPL may include a bank pattern BNP, first and second alignment electrodes ALE1 and ALE2, a first bank BNK1, first and second sub-banks S_BNK1 and S_BNK2, light emitting elements LD, first and second electrodes PE1 and PE2, and first, second, and third intermediate electrodes CTE1, CTE2, and CTE3. In one or more embodiments, the display element layer DPL may further include a second bank BNK2 disposed on the first bank BNK1, a color conversion layer CCL disposed over the first and third intermediate electrodes CTE1 and CTE3, and a first capping layer CPL1 disposed over the color conversion layer CCL and the second bank BNK2.

The second bank BNK2 may be disposed on the first bank BNK1 in a non-emission area NEA of the pixel PXL. The second bank BNK2 may be a dam structure that surrounds an emission area EMA of the pixel PXL and defines a position at which the color conversion layer CCL is to be supplied, thereby finally defining the emission area EMA.

The second bank BNK2 may include a light blocking material. In an example, the second bank BNK2 may be a black matrix, but the present disclosure is not limited thereto. In one or more embodiments, the second bank BNK2 may include at least one light blocking material and/or at least one reflective material to allow light emitted from the color conversion layer CCL to further advance in the image display direction of the display device DD (e.g., the third direction DR3), thereby improving the light emission efficiency of the color conversion layer CCL.

The color conversion layer CCL may include color conversion particles QD corresponding to a specific color. In an example, the color conversion layer CCL may include color conversion particles QD for converting light of a first color, which is emitted from light emitting elements LD, into light of a second color (e.g., light of a specific color, or light having excellent color reproducibility).

When the pixel PXL is a red pixel (or red sub-pixel), the color conversion layer CCL of the pixel PXL may include color conversion particles QD of a red quantum dot, which convert light of the first color, which is emitted from the light emitting elements LD, into light of a second color (e.g., light of red).

When the pixel PXL is a green pixel (or green sub-pixel), the color conversion layer CCL of the pixel PXL may include color conversion particles QD of a green quantum dot, which convert light of the first color, which is emitted from the light emitting elements LD, into light of a second color (e.g., light of green).

When the pixel PXL is a blue pixel (or blue sub-pixel), the color conversion layer CCL of the pixel PXL may include color conversion particles QD of a blue quantum dot, which convert light of the first color, which is emitted from the light emitting elements LD, into light of a second color (e.g., light of blue). In one or more embodiments, when the pixel is the blue pixel (or blue sub-pixel), the pixel PXL may include a light scattering layer including light scattering particles SCT, instead of the color conversion layer CCL including the color conversion particles QD. In an example, when the light emitting elements LD emits blue series light, the pixel PXL may include the light scattering layer including the light scattering particles SCT. The above-described light scattering layer may be omitted in some embodiments. In other embodiments, when the pixel PXL is the blue pixel (or blue sub-pixel), transparent polymer may be provided instead of the color conversion layer CCL.

The first capping layer CPL1 may be disposed over the color conversion layer CCL and the second bank BNK2.

The first capping layer CPL1 may be entirely provided in the display area DA in which the pixel is located to cover the second bank BNK2 and the color conversion layer CCL.

The first capping layer CPL1 may be an inorganic layer including an inorganic material. The first capping layer CPL1 may include at least one of silicon nitride ($SiN_x$), silicon oxide ($SiO_x$), silicon oxynitride ($SiO_xN_y$), and/or metal oxide such as aluminum oxide ($AlO_x$). The first capping layer CPL1 entirely covers the second bank BNK2 and the color conversion layer CCL, thereby blocking external moisture, oxygen or the like from being introduced into the color conversion layer CCL.

In one or more embodiments, the first capping layer CPL1 may reduce a step difference occurring due to components disposed thereunder, and have a flat surface. In an example, the first capping layer CPL1 may be an organic layer including an organic material, but the present disclosure is not limited thereto. The first capping layer CPL1 may be a common layer commonly provided in the display area DA.

The color filter layer CFL may be disposed on the first capping layer CPL1.

The color filter layer CFL may include a color filter corresponding to an emission area EMA of each pixel PXL. For example, the color filter layer CFL may include a first color filter CF1 disposed on a color conversion layer CCL and the first capping layer CPL1 of one pixel PXL (hereinafter, referred to as a "first pixel"), a second color filter CF2 disposed on a color conversion layer of an adjacent pixel (hereinafter, referred to as a "second pixel") adjacent to the first pixel PXL, and a third color filter CF3 disposed on a color conversion layer of an adjacent pixel adjacent to the second pixel.

The first, second, and third color filters CF1, CF2, and CF3 may be disposed while overlapping with each other in the non-emission area NEA, to be used as a light blocking memory for blocking light interference between adjacent pixels PXL. Each of the first, second, and third color filters CF1, CF2, and CF3 may include a color filter material for allowing light of a second color, which is converted in a corresponding color conversion layer CCL, to be selectively transmitted therethrough. In an example, the first color filter CF1 may be a red color filter, the second color filter CF2 may be a green color filter, and the third color filter CF3 may be a blue color filter. However, the present disclosure is not limited thereto.

The encap layer ENC may be disposed on the color filter layer CFL.

The encap layer ENC may include a second capping layer CPL2. The second capping layer CPL2 may be an inorganic insulating layer including an inorganic material or an organic insulating layer including an organic material. The second capping layer CPL2 may entirely cover components located thereunder, thereby blocking external moisture, humidity or the like from being introduced into the color filter layer CFL and the display element layer DPL. In one or more embodiments, the second capping layer CPL2 may be used as a planarization layer for reducing a step difference generated by components of the color filter layer CFL and the display element layer DPL, which are located thereunder.

The second capping layer CPL2 may be formed as a multi-layer. For example, the second capping layer CPL2 may include at least two inorganic insulating layers and at least one organic insulating layer interposed between the at least two inorganic insulating layers. However, the material and/or structure of the second capping layer CPL2 may be variously changed. In one or more embodiments, at least one overcoat layer, at least one filler layer, and/or another substrate may be further disposed on the top of the second capping layer CPL2.

In the pixel PXL in accordance with the above-described embodiment, the color conversion layer CCL and the color filter layer CFL are disposed above the light emitting element LD through a continuous process, thereby releasing light having excellent color reproducibility through the color conversion layer CCL and the color filter layer CFL. Thus, the light emission efficiency of the pixel PXL can be improved.

In one or more embodiments, as shown in FIG. 12, the color conversion layer CCL and the color filter layer CFL may be formed on one surface of a base layer BSL through a continuous process, to constitute a separate substrate, e.g., an upper substrate U_SUB. The upper substrate U_SUB may be bonded to the display element layer DPL including the first and third intermediate electrodes CTE1 and CTE3, and the like through an intermediate layer CTL. A fourth insulating layer INS4 may be disposed over the first and third intermediate electrodes CTE1 and CTE3. The fourth insulating layer INS4 may cover the first and third intermediate electrodes CTE1 and CTE3 in a process of bonding the display element layer DPL and the upper substrate U_SUB to each other, thereby allow the first and third intermediate electrodes CTE1 and CTE3 not to be exposed to the outside. The fourth insulating layer INS4 may be an inorganic insulating layer including an inorganic material, but the present disclosure is not limited thereto.

The intermediate layer CTL may be a transparent adhesive layer (or cohesive layer), e.g., optically clear adhesive for reinforcing adhesion between the display element layer DPL and the upper substrate U_SUB, but the present disclosure is not limited thereto. In one or more embodiments, the intermediate layer CTL may be a refractive index conversion layer for converting a refractive index of light that is emitted from light emitting elements LD and then advances toward the upper substrate U_SUB, thereby improving the light emitting luminance of the pixel PXL. In one or more embodiments, the intermediate layer CTL may include a filler configured with an insulating material having insulating and adhesive properties.

The upper substrate U_SUB may include the base layer BSL, the color filter layer CFL, a fifth insulating layer INS5, a second bank BNK2, a color conversion layer CCL, and a sixth insulating layer INS6.

The base layer BSL may be a rigid substrate or a flexible substrate, and the material and property of the base layer BSL are not particularly limited. The base layer BSL may be configured with the same material as the substrate SUB, or be configured with a material different from the material of the substrate SUB.

The color filter layer CFL may be disposed on one surface of the base layer BSL to face (e.g., oppose) the display element layer DPL. A first color filter CF1 of the color filter layer CFL may be provided on the one surface of the base layer BSL to correspond to the color conversion layer CCL in the emission area EMA. First, second, and third color filters CF1, CF2, and CF3 of the color filter layer CFL may be disposed in the non-emission area NEA to overlap with each other. Therefore, the first, second, and third color filters CF1, CF2, and CF3 of the color filter layer CFL may be used as a light blocking member.

The fifth insulating layer INS5 may be disposed between the color filter layer CFL and the color conversion layer CCL.

The fifth insulating layer INS5 may be located over the color filter layer CFL, thereby covering the color filter layer CFL. Thus, the fifth insulating layer INS5 can protect the color filter layer CFL. The fifth insulating layer INS5 may be an inorganic insulating layer including an inorganic material or an organic insulating layer including an organic material.

The second bank BNK2 and the color conversion layer CCL may be located on one surface of the fifth insulating layer INS5.

The sixth insulating layer INS6 may be entirely disposed over the second bank BNK2 and the color conversion layer CCL.

The sixth insulating layer INS6 may include at least one of silicon nitride ($SiN_x$), silicon oxide ($SiO_x$), and/or silicon oxynitride ($SiO_xN_y$), or include at least one of metal oxides such as aluminum oxide ($AlO_x$). However, the present disclosure is not limited thereto. In one or more embodiments, the sixth insulating layer INS6 may be configured as an organic layer including an organic material. The sixth insulating layer INS6 may be located over the color conversion layer CCL, thereby protecting the color conversion layer CCL from external moisture, humidity, and the like. Thus, the reliability of the color conversion layer CCL can be further improved.

The above-described upper substrate U_SUB may be bonded to the display element layer DPL by using the intermediate layer CTL.

Figure 13:
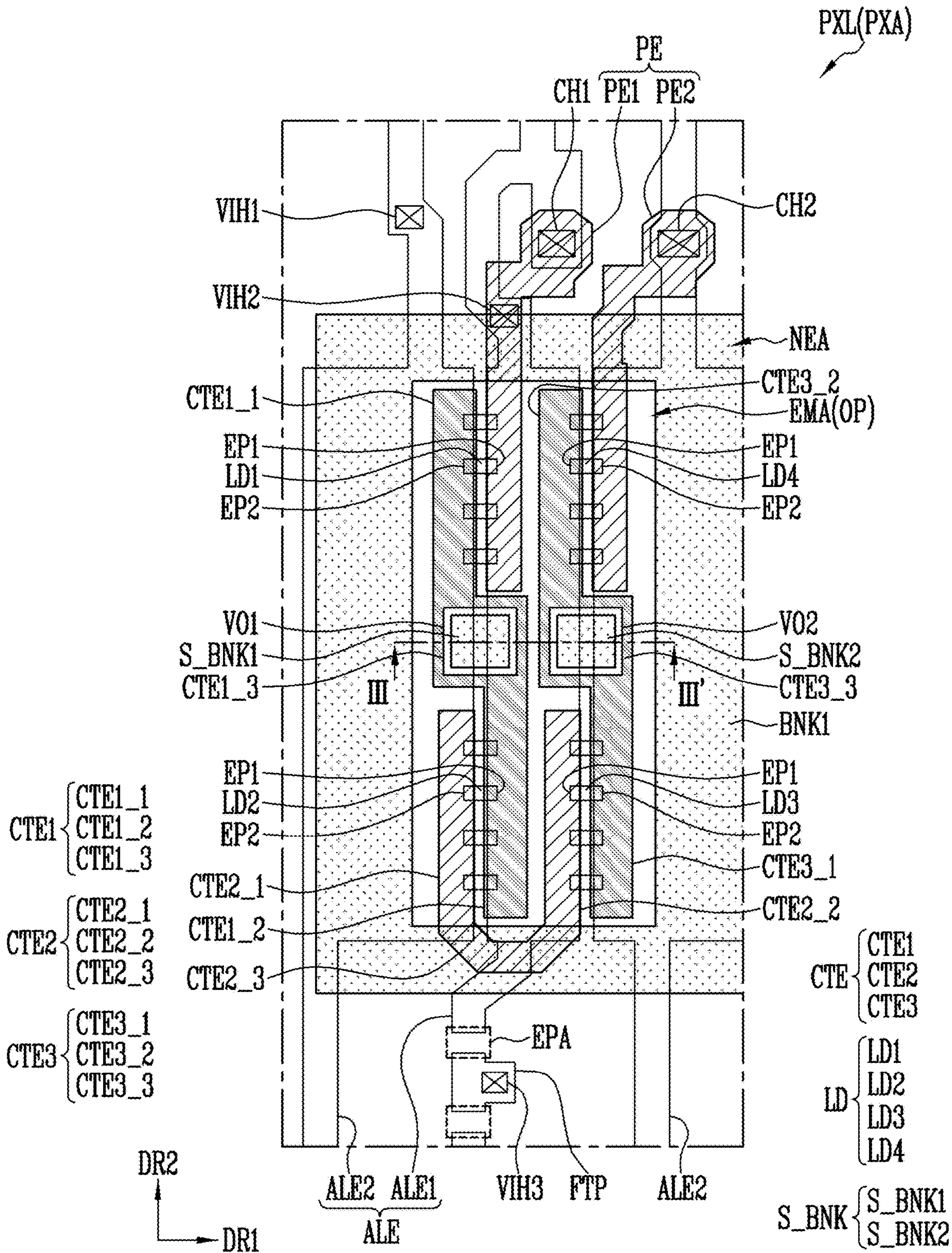
FIG. 13 is a schematic plan view illustrating a display element layer of a pixel in accordance with one or more embodiments of the present disclosure.
Figure 14:
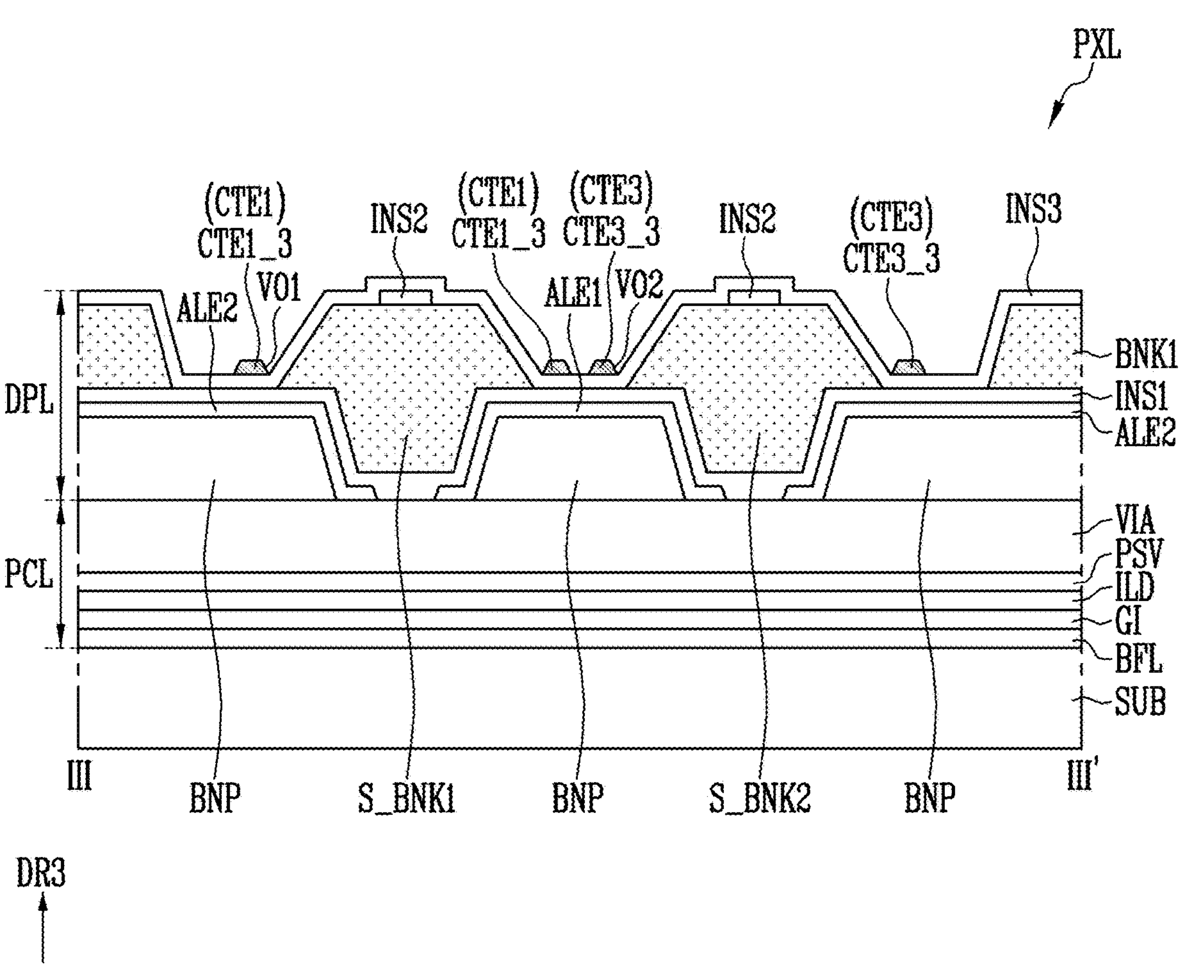
FIG. 14 is a schematic cross-sectional view taken along the line III-III' shown in FIG. 13.

FIG. 13 is a schematic plan view illustrating a display element layer of a pixel PXL in accordance with one or more embodiments of the present disclosure. FIG. 14 is a schematic cross-sectional view taken along the line III-III' shown in FIG. 13.

In relation to the embodiment shown in FIGS. 13 and 14, portions different from those of the above-described embodiment will be mainly described to avoid redundancy.

Referring to FIGS. 1 to 4, 13, and 14, a first sub-bank S_BNK1 and a second sub-bank S_BNK2, which are spaced from each other, may be located in an emission area EMA of the pixel PXL. In addition, a first intermediate electrode CTE1 having a shape detouring around the first sub-bank S_BNK1 and a third intermediate electrode CTE3 having a shape detouring around the second sub-bank S_BNK2 may be located in the emission area EMA.

In a plan view and in a sectional view, the first sub-bank S_BNK1 may be disposed in a first cavity VO1 of a third part CTE1_3 of the first intermediate electrode CTE1 to be spaced from the third part CTE1_3. As the third part CTE1_3 of the first intermediate electrode CTE1 is not located on the top of the first sub-bank S_BNK1, the first sub-bank S_BNK1 and the third part CTE1_3 may not overlap with each other. Accordingly, the first intermediate electrode CTE1 is not influenced by a profile of the first sub-bank S_BNK1, so that step coverage of the first intermediate electrode CTE1 can be improved.

In a plan view and in a sectional view, the second sub-bank S_BNK2 may be disposed in a second cavity VO2 of a ninth part CTE3_3 of the third intermediate electrode CTE3 to be spaced from the ninth part CTE3_3. As the ninth part CTE3_3 of the third intermediate electrode CTE3 is not located on the top of the second sub-bank S_BNK2, the second sub-bank S_BNK2 and the ninth part CTE3_3 may not overlap with each other. Accordingly, the third intermediate electrode CTE3 is not influenced by a profile of the second sub-bank S_BNK2, so that step coverage of the third intermediate electrode CTE3 can be improved.

Figure 15:
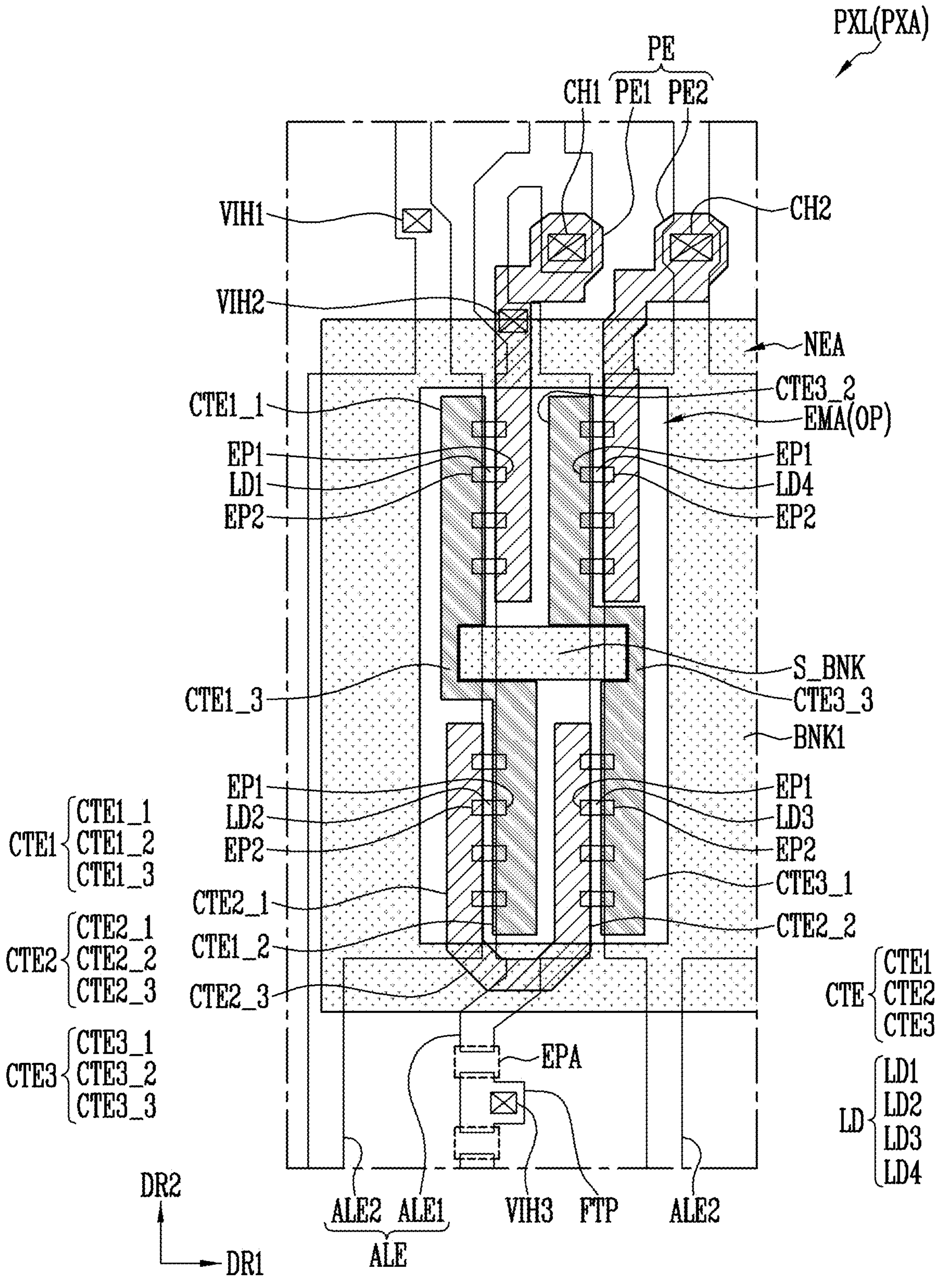
FIG. 15 is a schematic plan view illustrating a display element layer of a pixel in accordance with one or more embodiments of the present disclosure.

FIG. 15 is a schematic plan view illustrating a display element layer of a pixel PXL in accordance with one or more embodiments of the present disclosure.

In related to the embodiment shown in FIG. 15, portions different from those of the above-described embodiment will be mainly described to avoid redundancy.

Referring to FIGS. 1 to 4 and 15, a sub-bank S_BNK may be located in an emission area EMA of the pixel PXL. The sub-bank S_BNK may be located in the middle of the emission area EMA, and may be spaced from a first bank BNK1. The sub-bank S_BNK may be configured with an organic layer.

In one or more embodiments, a third part CTE1_3 of a first intermediate electrode CTE1 may have a shape detouring around an edge of a first side (e.g., a left side) of the sub-bank S_BNK. A ninth part CTE3_3 of a third intermediate electrode CTE3 may have a shape detouring around an edge of a second side (e.g., a right side) of the sub-bank S_BNK, which faces (e.g., opposes) the first side of the sub-bank S_BNK in the first direction DR1. Each of the first and third intermediate electrodes CTE1 and CTE3 and the sub-bank S_BNK may not overlap with each other. Accordingly, a disconnection of the first and third intermediate electrodes CTE1 and CTE3, or the like, which may occur as the first and third intermediate electrodes CTE1 and CTE3 and the sub-bank S_BNK overlap with each other, is prevented, so that the reliability of the first and third intermediate electrodes CTE1 and CTE3 can be improved.

The sub-bank S_BNK may overlap with one area of each of a second alignment electrode ALE2, a first alignment electrode ALE1, and another second alignment electrode ALE in the middle of the emission area EMA. As the sub-bank S_BNK is located on the second alignment electrode ALE2, the first alignment electrode ALE1, and the another second alignment electrode ALE2 in the middle of the emission area EMA, one area of the second alignment electrode ALE2, one area of the first alignment electrode ALE1, and one area of the another second alignment electrode ALE2 may be covered by the sub-bank S_BNK. When light emitting elements LD are supplied and aligned in the pixel PXL, the intensity of an electric field formed between the second alignment electrode ALE2 and the first alignment electrode ALE1 and between the first alignment electrode ALE1 and the another second alignment electrode ALE2 under the sub-bank S_BNK may be weakened due to the thickness of the sub-bank S_BNK configured with the organic layer. Accordingly, the light emitting elements LD are not aligned between the second alignment electrode ALE2 and the first alignment electrode ALE1 and between the first alignment electrode ALE1 and the another second alignment electrode ALE2, which overlap with the sub-bank S_BNK, or the number of light emitting elements LD aligned between the second alignment electrode ALE2 and the first alignment electrode ALE1 and between the first alignment electrode ALE1 and the another second alignment electrode ALE2 is significantly decreased, so that the light emitting elements LD can be aligned in only a desired area. Thus, loss of the light emitting elements LD is reduced or minimized, and the number of effective light sources provided per unit area in a desired area of the emission area EMA is further secured, so that the light emission efficiency of the pixel PXL can be improved.

Figure 16:
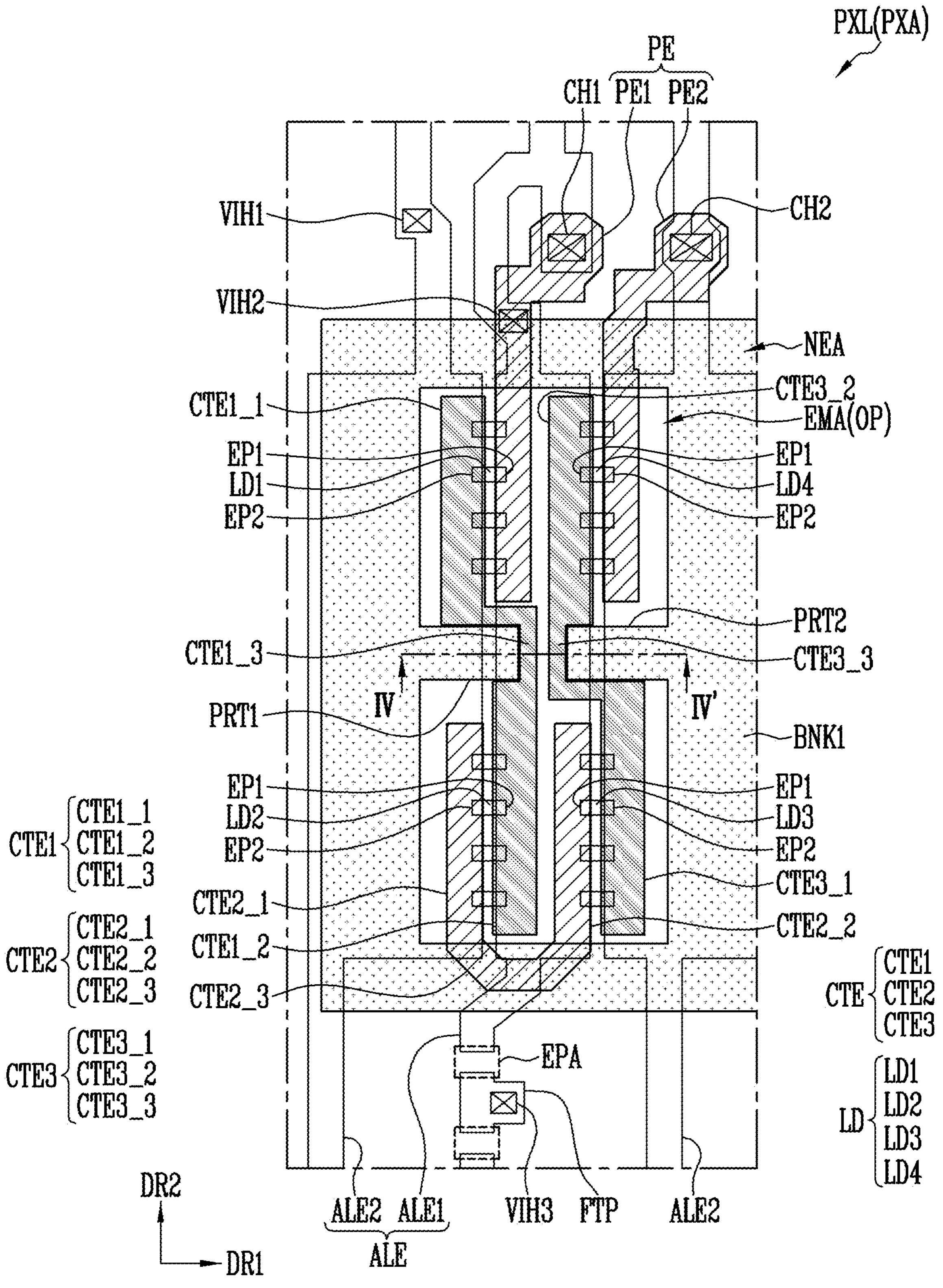
FIG. 16 is a schematic plan view illustrating a display element layer of a pixel in accordance with one or more embodiments of the present disclosure.
Figure 17:
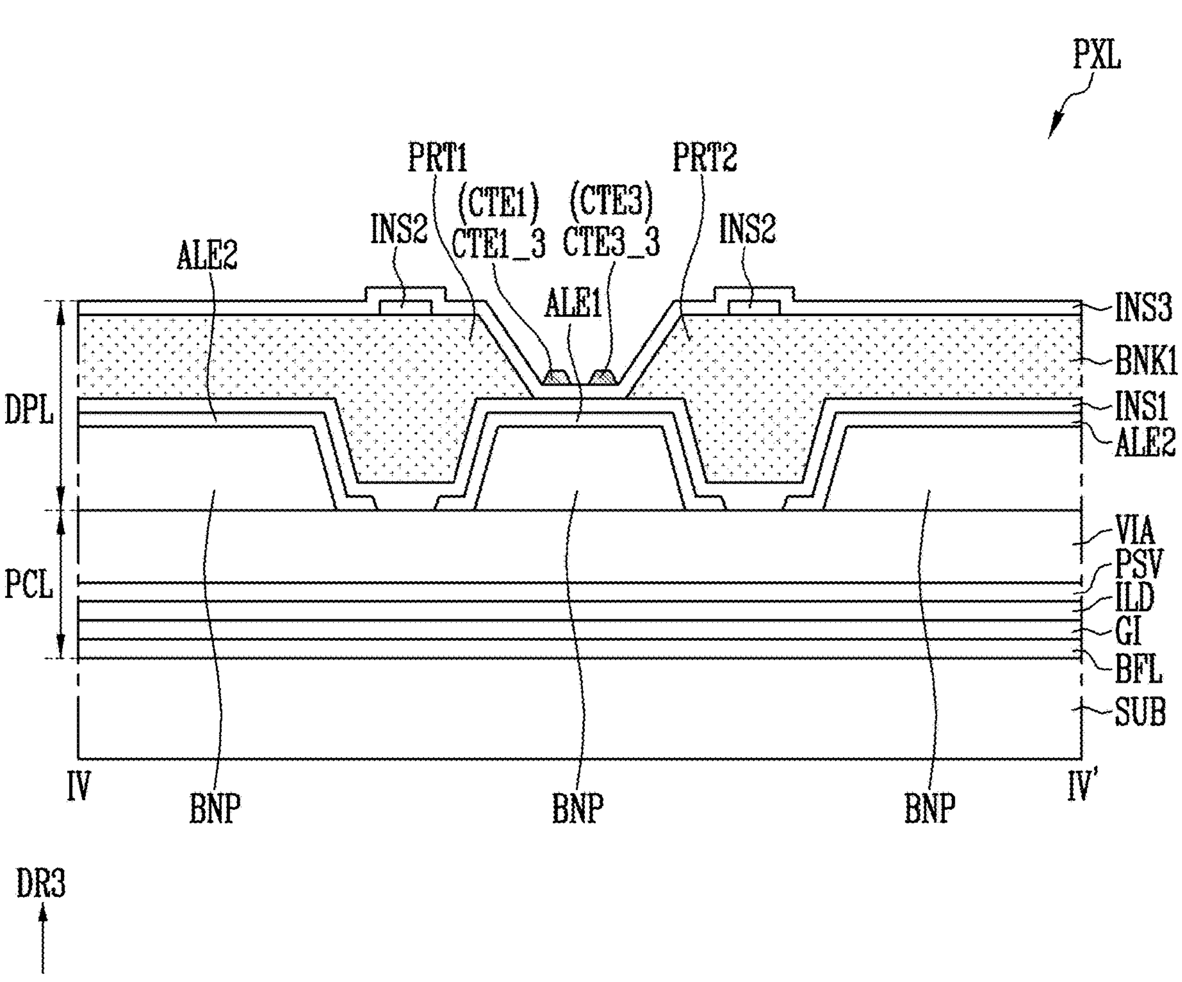
FIG. 17 is a schematic cross-sectional view taken along the line IV-IV' shown in FIG. 16.

FIG. 16 is a schematic plan view illustrating a display element layer of a pixel PXL in accordance with one or more embodiments of the present disclosure. FIG. 17 is a schematic cross-sectional view taken along the line IV-IV' shown in FIG. 16.

In relation to the embodiment shown in FIGS. 16 and 17, portions different from those of the above-described embodiment will be mainly described to avoid redundancy.

Referring to FIGS. 1 to 4, 16, and 17, a pixel area PXA in which the pixel PXL is located may include an emission area EMA and a non-emission area NEA.

Light emitting elements LD may be disposed in the emission area EMA. A first bank BNK1 may be disposed in the non-emission area NEA.

The first bank BNK1 may include a first protrusion part PRT1 and a second protrusion part PRT2, which are located in the emission area EMA while protruding (or extending) to the emission area EMA along the first direction DR1. The first and second protrusion parts PRT1 and PRT2 may correspond to one area of the first bank BNK1. The first protrusion part PRT1 may be located on one area of each of a second alignment electrode ALE2 and a first alignment electrode ALE1 in the middle of the emission area EMA, thereby encapsulating (or covering) the second alignment electrode ALE2 and the first alignment electrode ALE1. The second protrusion part PRT2 may be located on another area of the first alignment area ALE1 and one area of another second alignment electrode ALE2 in the middle of the emission area EMA, thereby encapsulating (or covering) the first alignment electrode ALE1 and the another second alignment electrode ALE2. Accordingly, light emitting elements LD are not aligned between the second alignment electrode ALE2 and the first alignment electrode ALE1 and between the first alignment electrode ALE1 and the another second alignment electrode ALE2, which are covered by the first and second protrusion parts PRT1 and PRT2 (or overlap with the first and second protrusion parts PRT1 and PRT2), or the number of light emitting elements LD aligned between the second alignment electrode ALE2 and the first alignment electrode ALE1 and between the first alignment electrode ALE1 and the another second alignment electrode ALE2 is remarkably decreased, so that the light emitting elements LD can be aligned in only a desired area.

In one or more embodiments, the first protrusion part PRT1 and the second protrusion part PRT2 may be spaced from each other in the first direction DR1, and may be located on the same line. An area between the first protrusion part PRT1 and the second protrusion part PRT2 may be used as a path through which an ink including light emitting elements LD is moved in a process of supplying (or inputting) the ink to the pixel PXL. Accordingly, the ink can be uniformly spread through the whole of the emission area EMA of the pixel PXL.

A first intermediate electrode CTE1 may include a first part CTE1_1, a second part CTE1_2, and a third part CTE1_3. The third part CTE1_3 may connect the first part CTE1_1 and the second part CTE1_2 to each other while detouring around the first protrusion part PRT1. The third part CTE1_3 may have a shape bent or curved at least once at a boundary of an area in which first light emitting elements LD1 are arranged and an area in which second light emitting elements LD2 are arranged.

A second intermediate electrode CTE2 may include a fourth part CTE2_1, a fifth part CTE2_2, and a sixth part CTE2_3. The sixth part CTE2_3 may be located on the top of the first bank BNK1, thereby connecting the fourth part CTE2_1 and the fifth part CTE2_2 to each other while overlapping with the first bank BNK1. The sixth part CTE2_3 may have a shape bent or curved at least once at a boundary of the area in which the second light emitting elements LD2 are arranged and an area in which third light emitting elements LD3 are arranged.

A third intermediate electrode CTE3 may include a seventh part CTE3_1, an eighth part CTE3_2, and a ninth part CTE3_3. The ninth part CTE3_3 may connect the seventh part CTE3_1 and the eighth part CTE3_2 to each other while detouring around the second protrusion part PRT2. The ninth part CTE3_2 may have a shape bent or curved at least once at a boundary of the area in which the third light emitting elements LD3 are arranged and an area in which fourth light emitting elements LD4 are arranged.

The third part CTE1_3 of the first intermediate electrode CTE1 and the ninth part CTE3_3 of the third intermediate electrode CTE may be disposed on a first insulating layer INS1 located between the first protrusion part PRT1 and the second protrusion part PRT2 to be spaced from each other. The first intermediate electrode CTE1 and the first protrusion part PRT1 may not overlap with each other, and the third intermediate electrode CTE3 and the second protrusion part PRT2 may not overlap with each other. Accordingly, disconnection or the like of the first and third intermediate electrodes CTE1 and CTE3, which may occur as the first and third intermediate electrodes CTE1 and CTE3 and the first and second protrusion parts PRT1 and PRT2 overlap with each other, is prevented, so that the reliability of the first and third intermediate electrodes CTE1 and CTE3 can be improved.

Figure 18:
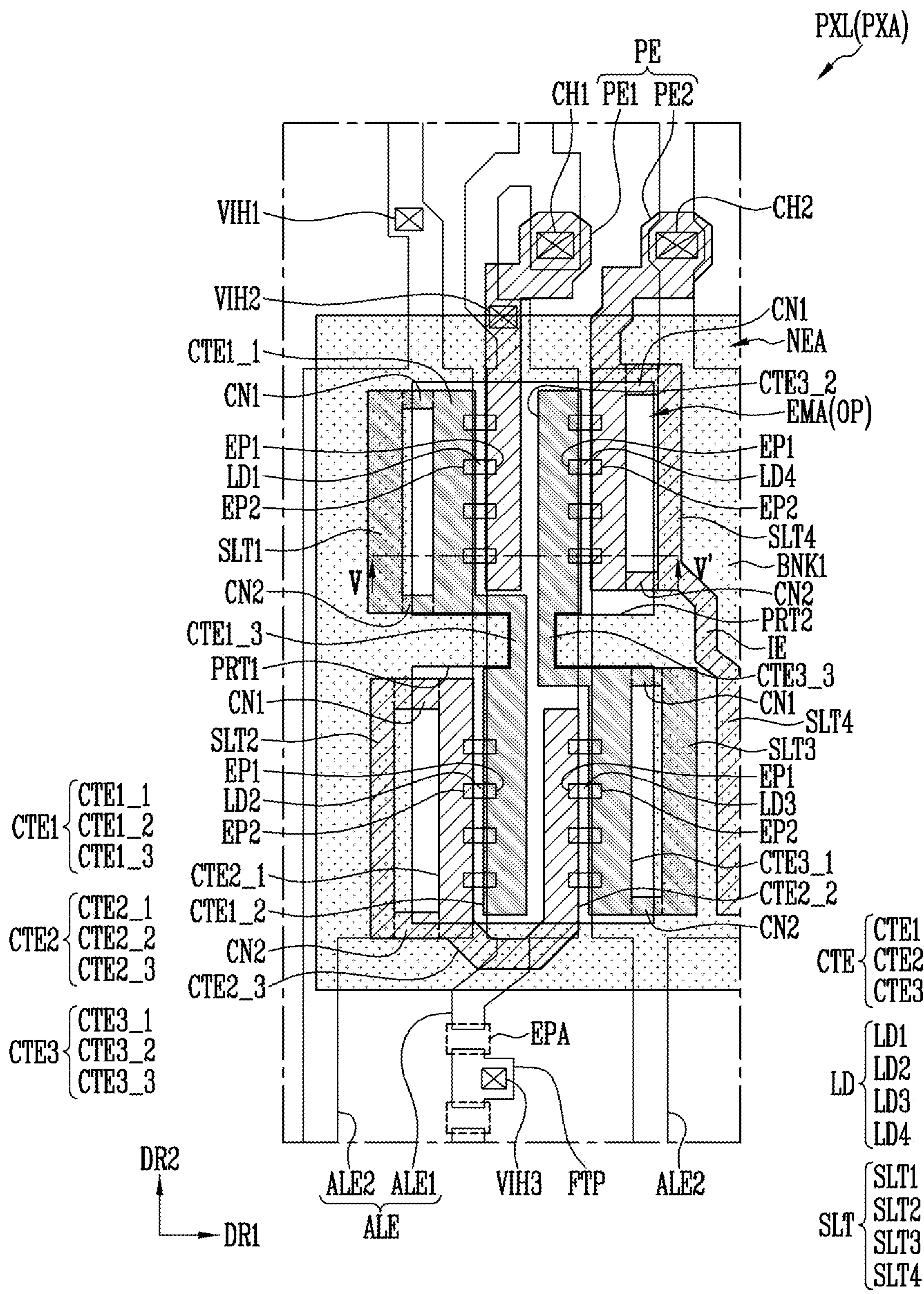
FIG. 18 is a schematic plan view illustrating a display element layer of a pixel in accordance with one or more embodiments of the present disclosure.
Figure 19:
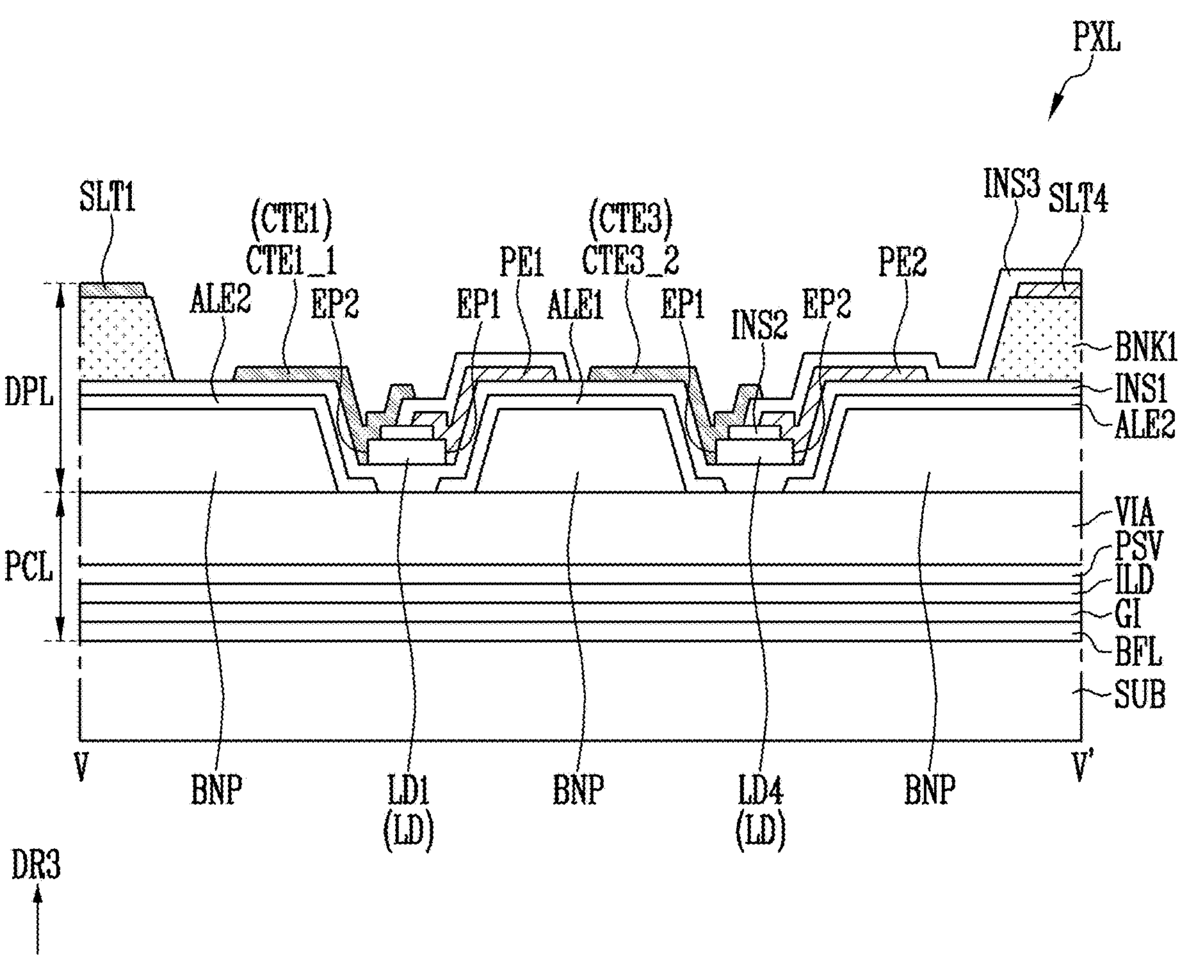
FIG. 19 is a schematic cross-sectional view taken along the line V-V' shown in FIG. 18.

FIG. 18 is a schematic plan view illustrating a display element layer of a pixel PXL in accordance with one or more embodiments of the present disclosure. FIG. 19 is a schematic cross-sectional view taken along the line V-V' shown in FIG. 18.

In relation to the embodiment shown in FIGS. 18 and 19, portions different from those of the above-described embodiment will be mainly described to avoid redundancy.

Referring to FIGS. 1 to 4, 18, and 19, the pixel PXL (or a display element layer DPL) may include sub-electrodes SLT electrically connected to intermediate electrodes CTE and a second electrode PE2.

The sub-electrode SLT may include a first sub-electrode SLT1, a second sub-electrode SLT2, a third sub-electrode SLT3, and a fourth sub-electrode SLT4. In one or more embodiments, the first sub-electrode SLT1 may be electrically connected to a first intermediate electrode CTE1, the second sub-electrode SLT2 may be electrically connected to a second intermediate electrode CTE2, the third sub-electrode SLT3 may be electrically connected to a third intermediate electrode CTE3, and the fourth sub-electrode SLT4 may be electrically connected to the second electrode PE2.

The first sub-electrode SLT1 may be formed through the same process as the first intermediate electrode CTE1, and may be integrally provided with the first intermediate electrode CTE1. However, the present disclosure is not limited thereto. In an example, the first sub-electrode SLT1 may be integrally provided with a first part CTE1_1 of the first intermediate electrode CTE1 to be electrically and/or physically connected to the first part CTE1_1.

The second sub-electrode SLT2 may be formed through the same process as the second intermediate electrode CTE2, and may be integrally provided with the second intermediate electrode CTE2. However, the present disclosure is not limited thereto. In an example, the second sub-electrode SLT2 may be integrally provided with a fourth part CTE2_1 of the second intermediate electrode CTE2 to be electrically and/or physically connected to the fourth part CTE2_1.

The third sub-electrode SLT3 may be formed through the same process as the third intermediate electrode CTE3, and may be integrally provided with the third intermediate electrode CTE3. However, the present disclosure is not limited thereto. In an example, the third sub-electrode SLT3 may be integrally provided with a seventh part CTE3_1 of the third intermediate electrode CTE3 to be electrically and/or physically connected to the seventh part CTE3_1.

The fourth sub-electrode SLT4 may be formed through the same process as the second electrode PE2, and may be integrally provided with the second electrode PE2. However, the present disclosure is not limited thereto.

Each of the first, second, third, and fourth sub-electrodes SLT1, SLT2, SLT3, and SLT4 may be electrically connected to a corresponding electrode PE or a corresponding intermediate electrode CTE through first and second connection parts CN1 and CN2. In an example, one end of each of the first, second, third, and fourth sub-electrodes SLT1, SLT2, SLT3, and SLT4 may be electrically connected to a corresponding electrode PE or a corresponding intermediate electrode CTE through the first connection part CN1, and the other end of each of the first, second, third, and fourth sub-electrodes SLT1, SLT2, SLT3, and SLT4 may be electrically connected to a corresponding electrode PE or a corresponding intermediate electrode CTE through the second connection part CN2. The first connection part CN1 and/or the second connection part CN2 may be integrally formed with the sub-electrodes SLT to be disposed in the same layer, but the present disclosure is not limited thereto.

The sub-electrodes SLT may extend along the second direction DR2, and may be spaced from a corresponding electrode PE or a corresponding intermediate electrode CTE in the first direction DR1. The first connection part CN1 and/or the second connection part CN2 may extend along the first direction between an electrode PE corresponding to a corresponding sub-electrode SLT and an intermediate electrode CTE corresponding to the corresponding sub-electrode SLT. As described above, when the sub-electrodes SLT electrically connected to a corresponding electrode PE or a corresponding intermediate electrode CTE are provided, a dark spot defect of the pixel PXL can be improved. In one or more embodiments, the sub-electrodes SLT may be located on the top of a first bank BNK1, thereby overlapping with the first bank BNK1. In an example, each of the first, second, third, and fourth sub-electrodes SLT1, SLT2, SLT3, and SLT4 may be located on the top of the first bank BNK1, thereby overlapping with the first bank BNK1.

At least one of the sub-electrodes SLT of the pixel PXL may be electrically connected to at least one of sub-electrodes SLT of an adjacent pixel PXL. In an example, the fourth sub-electrode SLT4 of the pixel PXL may be electrically connected to a fourth sub-electrode SLT4 of an adjacent pixel PXL.

In one or more embodiments, at least one of the sub-electrodes SLT of the pixel PXL may be electrically connected at least one of sub-electrodes SLT of an adjacent pixel PXL through a connection electrode IE. In an example, the fourth electrode SLT4 of the pixel PXL may be electrically connected to a fourth sub-electrode SLT4 of an adjacent pixel PXL adjacent in the first direction DR1 through the connection electrode IE.

The connection electrode IE may be disposed at a boundary of adjacent pixels PXL or between the adjacent pixels PXL, e.g., in a non-emission area NEA to be connected to at least one of sub-electrodes SLT of each of the adjacent pixels PXL. The connection electrode IE may be integrally provided with at least one of sub-electrodes SLT of pixels PXL to be disposed in the same layer. However, the present disclosure is not limited thereto.

A third part CTE1_3 of the first intermediate electrode CTE1 electrically connected to the first sub-electrode SLT1 may connect the first part CTE1_1 and a second part CTE1_2 to each other while detouring around a first protrusion part PRT1. A ninth part CTE3_3 of the third intermediate electrode CTE3 electrically connected to the third sub-electrode SLT3 may connect the seventh part CTE3_1 and an eighth part CTE3_2 to each other while detouring around a second protrusion part PRT2. The first intermediate electrode CTE1 and the protrusion part PRT1 may not overlap with each other, and the third intermediate electrode CTE3 and the second protrusion part PRT2 may not overlap with each other. Accordingly, disconnection or the like of the first and third intermediate electrodes CTE1 and CTE3, which may occur as the first and third intermediate electrodes CTE1 and CTE3 and the first and second protrusion parts PRT1 and PRT2 overlap with each other, is prevented, so that the reliability of the first and third intermediate electrodes CTE1 and CTE3 can be improved.

Figure 20:
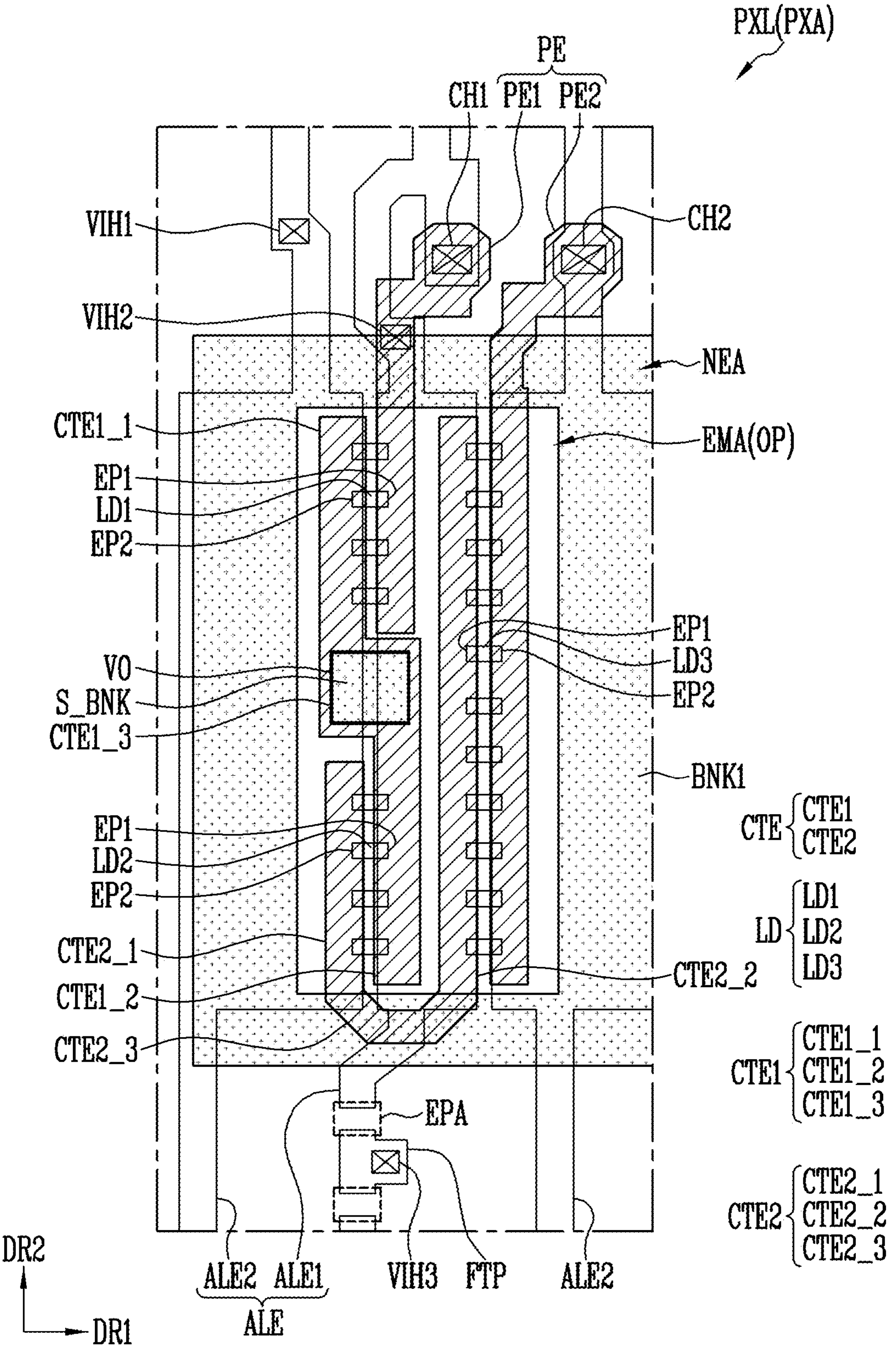
FIGS. 20 and 21 are schematic plan views illustrating a display element layer of a pixel in accordance with one or more embodiments of the present disclosure.
Figure 21:
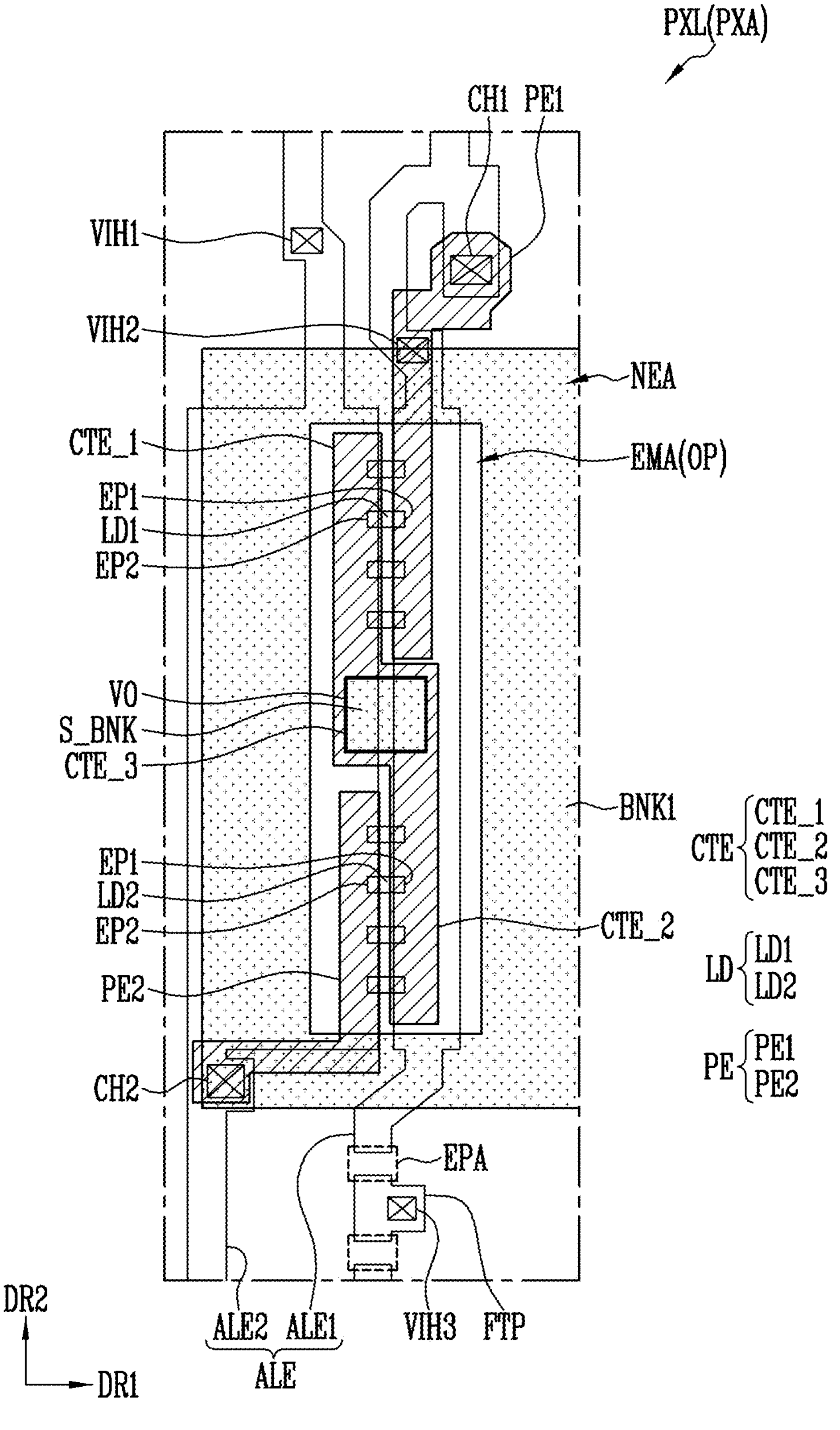

FIGS. 20 and 21 are schematic plan views illustrating a display element layer of a pixel PXL in accordance with one or more embodiments of the present disclosure.

In relation to embodiments shown in FIGS. 20 and 21, portions different from those of the above-described embodiment will be mainly described to avoid redundancy.

Referring to FIGS. 1 to 3 and 20, a pixel PXL in accordance with one or more embodiments of the present disclosure may include light emitting elements LD located in at least an emission area EMA and a first bank BNK1 located in a non-emission area NEA. Also, the pixel PXL may include a sub-bank S_BNK that is located in the emission area EMA (or an opening OP of the first bank BNK1) and is separated from the first bank BNK1.

In one or more embodiments, the light emitting elements LD may include at least one first light emitting element LD1, at least one second light emitting element LD2, and at least one third light emitting element LD3.

The first light emitting element LD1 may include a first end portion EP1 electrically connected to a first electrode PE1 and a second end portion EP2 electrically connected to a first part CTE1_1 of a first intermediate electrode CTE1. The first light emitting element LD1 along with the first electrode PE1 and the first intermediate electrode CTE1 may constitute a first serial stage of an emission component (see "EMU" shown in FIG. 4) of the pixel PXL.

The second light emitting element LD2 may include a first end portion EP1 electrically connected to a second part CTE1_2 of the first intermediate electrode CTE1 and a second end portion EP2 electrically connected to a fourth part CTE2_1 of a second intermediate electrode CTE2. The second light emitting element LD2 along with the first intermediate electrode CTE1 and the second intermediate electrode CTE2 may constitute a second serial stage of the emission component EMU.

The third light emitting element LD3 may include a first end portion EP1 electrically connected to a fifth part CTE2_2 of the second intermediate electrode CTE2 and a second end portion EP2 electrically connected to a second electrode PE2. The third light emitting element LD3 along with the second intermediate electrode CTE2 and the second electrode PE2 may constitute a third serial stage of the emission component EMU.

The above-described emission component EMU of the pixel PXL may include the first, second, and third serial stages that are consecutive and are electrically connected to each other. The first electrode PE1 may be an anode of the emission component EMU, and the second electrode PE2 may be a cathode of the emission component EMU.

The first intermediate electrode CTE1 may electrically connect the second end portion EP2 of the first light emitting element LD1 to the first end portion EP1 of the second light emitting element LD2 in the emission area EMA. The first intermediate electrode CTE1 may have a structure bent or curved at a boundary of an area in which the first light emitting element LD1 is arranged and an area in which the second light emitting element LD2 is arranged. The first intermediate electrode CTE1 may include the first part CTE1_1 electrically connected to the second end portion EP2 of the first light emitting element LD1 while facing (e.g., opposing) the first electrode PE1, the second part CTE1_2 electrically connected to the first end portion EP1 of the second light emitting element LD2 while facing (e.g., opposing) the second intermediate electrode CTE2, and a third part CTE1_3 connecting the first part CTE1_1 and the second part CTE1_2 to each other. The third part CTE1_3 may have a shape including a cavity VO surrounding the sub-bank S_BNK.

The second intermediate electrode CTE2 may electrically connect the second end portion EP2 of the second light emitting element LD2 to the first end portion EP1 of the third light emitting element LD3 in the emission area EMA. The second intermediate electrode CTE2 may have a structure bent or curved at a boundary of the area in which the second light emitting element LD2 is arranged and an area in which the third light emitting element LD3 is arranged. The second intermediate electrode CTE2 may include the fourth part CTE2_1 electrically connected to the second end portion of the second light emitting element LD2 while facing (e.g., opposing) the second part CTE1_2 of the first intermediate electrode CTE1, the fifth part CTE2_2 electrically connected to the first end portion EP1 of the third light emitting element LD3 while facing (e.g., opposing) the second electrode PE2, and a sixth part CTE2_3 connecting the fourth part CTE2_1 and the fifth part CTE2_2 to each other.

Electrodes, e.g., the first electrode PE1, the first intermediate electrode CTE1, the second intermediate electrode CTE2, and the second electrode PE2, which are disposed on first and second end portions EP1 and EP2 of each of the first, second, and third light emitting elements LD1, LD2, and LD3, may be disposed in the same layer and may be concurrently (e.g., simultaneously) formed. However, the present disclosure is not limited thereto. In one or more embodiments, the electrodes disposed on the first and second end portions EP1 and EP2 of each light emitting element LD may be formed through different processes to be disposed in different layers.

In one or more embodiments, the sub-bank S_BNK may be disposed in the emission area EMA. The sub-bank S_BNK may be disposed to correspond to an area in which the third part CTE1_3 is located (e.g., a boundary part between the area in which the first light emitting element LD1 is arranged and the area in which the second light emitting element LD2 is arranged) in the emission area EMA. In an example, the sub-bank S_BNK may be located to correspond to the cavity VO of the third part CTE1_3. In a plan view, the sub-bank S_BNK may be located in the cavity VO, and the third part CTE1_3 of the first intermediate electrode CTE1 may surround an edge of the sub-bank S_BNK. The first intermediate electrode CTE1 may be provided in a shape detouring around the sub-bank S_BNK.

As described above, as the sub-bank S_BNK that is not connected to the first bank BNK1 and has an isolated island shape is located in the emission area EMA, a portion at which ink is not discharged in the emission area EMA is reduced, thereby reducing or minimizing a dark spot defect or the like.

Referring to FIGS. 1 to 3 and 21, a pixel PXL in accordance with one or more embodiments of the present disclosure may include light emitting elements LD located in at least an emission area EMA and a first bank BNK1 located in a non-emission area NEA. Also, the pixel PXL may include a sub-bank S_BNK that is located in the emission area EMA (or an opening OP of the first bank BNK1) and is separated from the first bank BNK1.

The light emitting elements LD may be disposed between alignment electrodes ALE in at least the emission area EMA. In an example, the light emitting elements LD may be disposed between a first alignment electrode ALE1 and a second alignment electrode ALE2. In one or more embodiments, the light emitting elements LD may include at least one first light emitting element LD1 and at least one second light emitting element LD2, which are disposed between the first alignment electrode ALE1 and the second alignment electrode ALE2.

The first light emitting element LD1 may be aligned between an upper end area of the first alignment electrode ALE1 and the second alignment electrode ALE2 to be electrically connected to a first electrode PE1 and an intermediate electrode CTE. The first light emitting element LD1 may include a first end portion EP1 electrically connected to the first electrode PE1 and a second end portion EP2 electrically connected to a first part CTE_1 of the intermediate electrode CTE. The first light emitting element LD1 along with the first electrode PE1 and the first part CTE_1 of the intermediate electrode CTE may constitute a first serial stage of an emission component (see "EMU" shown in FIG. 4) of the pixel PXL.

The second light emitting element LD2 may be aligned between a lower end area of the first alignment electrode ALE1 and the second alignment electrode ALE2 to be electrically connected to the intermediate electrode CTE and a second electrode PE2. The second light emitting element LD2 may include a first end portion EP1 electrically connected to a second part CTE_2 of the intermediate electrode CTE and a second end portion EP2 electrically connected to the second electrode PE2. The second light emitting element LD2 along with the intermediate electrode CTE and the second electrode PE2 may constitute a second serial stage of the emission component EMU.

The above-described emission component EMU of the pixel PXL may include first and second serial stages that are consecutive and are electrically connected to each other. The first electrode PE1 may be an anode of the emission component EMU, and the second electrode PE2 may be a cathode of the emission component EMU.

The intermediate electrode CTE may electrically connect the second end portion EP2 of the first light emitting element LD1 to the first end portion EP1 of the second light emitting element LD2 in the emission area EMA. The intermediate electrode CTE may have a structure bent or curved at a boundary of an area in which the first light emitting element LD1 is arranged and an area in which the second light emitting element LD2 is arranged. The intermediate electrode CTE may include the first part CTE_1 electrically connected to the second end portion EP2 of the first light emitting element LD1 while facing (e.g., opposing) the first electrode PE1, the second part CTE_2 electrically connected to the first end portion EP1 of the second light emitting element LD2 while facing (e.g., opposing) the second electrode PE2, and a third part CTE_3 connecting the first part CTE_1 and the second part CTE_2 to each other. The third part CTE_3 may have a shape including a cavity VO surrounding the sub-bank S_BNK.

Electrodes, e.g., the first electrode PE1, the intermediate electrode CTE, and the second electrode PE2, which are disposed on first and second end portions EP1 and EP2 of each of the first and second light emitting elements LD1 and LD2, may be disposed in the same layer and may be concurrently (e.g., simultaneously) formed. However, the present disclosure is not limited thereto. In one or more embodiments, the electrodes disposed on the first and second end portions EP1 and EP2 of each light emitting element LD may be formed through different processes to be disposed in different layers.

In one or more embodiments, the sub-bank S_BNK may be disposed in the emission area EMA. The sub-bank S_BNK may be located in an area in which the third part CTE_3 of the intermediate electrode CTE in the emission area EMA (e.g., a boundary part between the area in which the first light emitting element LD1 is arranged and the area in which the second light emitting element LD2 is arranged). In an example, the sub-bank S_BNK may be located to correspond to the cavity VO of the third part CTE_3 of the intermediate electrode CTE. In a plan view, the sub-bank S_BNK may be disposed in the cavity VO, and the third part CTE_3 of the intermediate electrode CTE may surround an edge of the sub-bank S_BNK. The intermediate electrode CTE may be provided in a shape detouring around the sub-bank S_BNK.

As described above, as the sub-bank S_BNK that is not connected to the first bank BNK1 and has an isolated island shape is located in the emission area EMA (or the opening OP of the first bank BNK1), a portion at which an ink is not discharged in the emission area EMA is reduced, thereby reducing or minimizing a dark spot defect or the like.

In accordance with the present disclosure, a sub-bank having an isolated island shape and an intermediate electrode detouring around the sub-bank are disposed in an emission area of each pixel. Thus, an ink can be uniformly supplied through the whole of the emission area, and a defect in which the intermediate electrode is cut off by the sub-bank can be prevented. Accordingly, the reliability of the pixel and the display device having the same can be improved.

Example embodiments have been disclosed herein, and although specific terms are employed, they are used and are to be interpreted in a generic and descriptive sense only and not for purpose of limitation. In one or more embodiments, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the scope of the present disclosure as set forth in the following claims.

What is claimed is:

1. A pixel comprising:

an emission area and a non-emission area;

a first bank located in the non-emission area, the first bank including an opening corresponding to the emission area;

a first electrode, a second electrode, and an intermediate electrode that are spaced from each other;

light emitting elements in the emission area, each of the light emitting elements comprising one end portion electrically connected to one of the first electrode, the second electrode, or the intermediate electrode and an other end portion electrically connected to another one of the first electrode, the second electrode, or the intermediate electrode; and a sub-bank located in the opening of the first bank, the sub-bank being spaced from the first bank, wherein the intermediate electrode is around at least a portion of the sub-bank.

2. The pixel of claim 1, wherein the intermediate electrode detours around the sub-bank.

3. The pixel of claim 2, wherein the first bank and the sub-bank comprise a same material.

4. The pixel of claim 2, wherein the intermediate electrode includes a cavity corresponding to the sub-bank, and entirely surrounds the sub-bank.

5. The pixel of claim 4, wherein, in a plan view, the sub-bank is located in the cavity, and is in contact with at least a portion of the intermediate electrode.

6. The pixel of claim 4, wherein the intermediate electrode is spaced from the sub-bank and does not overlap with the sub-bank.

7. The pixel of claim 2, wherein the intermediate electrode comprises a first intermediate electrode, a second intermediate electrode, and a third intermediate electrode that are spaced from each other, and wherein the light emitting elements comprise:

a first light emitting element comprising a first end portion electrically connected to the first electrode and a second end portion electrically connected to the first intermediate electrode;

a second light emitting element comprising a first end portion electrically connected to the first intermediate electrode and a second end portion electrically connected to the second intermediate electrode;

a third light emitting element comprising a first end portion electrically connected to the second intermediate electrode and a second end portion electrically connected to the third intermediate electrode; and a fourth light emitting element comprising a first end portion electrically connected to the third intermediate electrode and a second end portion electrically connected to the second electrode.

8. The pixel of claim 7, wherein the first intermediate electrode comprises a first part facing the first electrode, a second part facing the second intermediate electrode, and a third part connecting the first part and the second part to each other, in a plan view, wherein the second intermediate electrode comprises a fourth part facing the second part of the first intermediate electrode, a fifth part facing the third intermediate electrode, and a sixth part connecting the fourth part and the fifth part to each other, in the plan view, wherein the third intermediate electrode comprises a seventh part facing the fifth part of the second intermediate electrode, an eighth part facing the second electrode, and a ninth part connecting the seventh part and the eighth part to each other, in the plan view, and wherein each of the third part of the first intermediate electrode and the ninth part of the third intermediate electrode detour around the sub-bank.

9. The pixel of claim 8, wherein the sub-bank comprises a first sub-bank that corresponds to the third part of the first intermediate electrode and a second sub-bank that corresponds to the ninth part of the third intermediate electrode, and wherein the first sub-bank and the second sub-bank are spaced from each other, and have a shape isolated in the emission area.

10. The pixel of claim 9, wherein the third part of the first intermediate electrode includes a first cavity corresponding to the first sub-bank, and the ninth part of the third intermediate electrode includes a second cavity corresponding to the second sub-bank.

11. The pixel of claim 8, wherein the sub-bank corresponds to the third part of the first intermediate electrode and the ninth part of the third intermediate electrode, and wherein, in the plan view, the third part of the first intermediate electrode detours around one edge of the sub-bank, and the ninth part of the third intermediate electrode detours around an other edge of the sub-bank.

12. The pixel of claim 8, further comprising:

a first alignment electrode overlapping the first electrode, the second part of the first intermediate electrode, one area of the third part of the first intermediate electrode, the fifth part of the second intermediate electrode, the eighth part of the third intermediate electrode, and one area of the ninth part of the third intermediate electrode;

a second alignment electrode overlapping the first part of the first intermediate electrode, another area of the third part of the first intermediate electrode, and the fourth part of the second intermediate electrode; and another second alignment electrode overlapping the seventh part of the third intermediate electrode, another area of the ninth part of the third intermediate electrode, and the second electrode.

13. The pixel of claim 2, further comprising:

a color conversion layer on the first and second electrodes and the intermediate electrode, wherein the color conversion layer in the emission area corresponds to the light emitting element and comprises color conversion particles;

a second bank on the first bank in the non-emission area, the second bank surrounding the color conversion layer; and a color filter layer on the color conversion layer and configured to allow light emitted from the color conversion layer to be selectively transmitted therethrough.

14. A pixel comprising:

an emission area and a non-emission area;

a first bank located in the non-emission area;

a protrusion part integrally formed with the first bank, the protrusion part protruding to the emission area from the first bank;

a first electrode, a second electrode, and an intermediate electrode that are spaced from each other; and light emitting elements, each of the light emitting elements comprising one end portion electrically connected to one of the first electrode, the second electrode, or the intermediate electrode and an other end portion electrically connected to another one of the first electrode, the second electrode, or the intermediate electrode, wherein the intermediate electrode surrounds at least a portion of the protrusion part.

15. The pixel of claim 14, wherein the intermediate electrode detours around the protrusion part.

16. The pixel of claim 15, wherein the protrusion part comprises a first protrusion part protruding to the emission area from one side of the first bank and a second protrusion part protruding to the emission area from an other side facing the one side of the first bank, and wherein the first protrusion part and the second protrusion part are spaced from each other.

17. The pixel of claim 16, wherein the intermediate electrode comprises a first intermediate electrode, a second intermediate electrode, and a third intermediate electrode that are spaced from each other, wherein the first intermediate electrode comprises a first part spaced from the first electrode, a second part spaced from the second intermediate electrode, and a third part connecting the first part and the second part to each other, in a plan view, wherein the second intermediate electrode comprises a fourth part spaced from the second part of the first intermediate electrode, a fifth part spaced from the third intermediate electrode, and a sixth part connecting the fourth part and the fifth part to each other, in the plan view, wherein the third intermediate electrode comprises a seventh part spaced from the fifth part of the second intermediate electrode, an eighth part spaced from the second electrode, and a ninth part connecting the seventh part and the eighth part to each other, in the plan view, and wherein the third part of the first intermediate electrode detours around the first protrusion part, and the ninth part of the third intermediate electrode detours around the second protrusion part.

18. The pixel of claim 17, wherein the light emitting elements comprise:

a first light emitting element comprising a first end portion electrically connected to the first electrode and a second end portion electrically connected to the first part of the first intermediate electrode;

a second light emitting element comprising a first end portion electrically connected to the second part of the first intermediate electrode and a second end portion electrically connected to the fourth part of the second intermediate electrode;

a third light emitting element comprising a first end portion electrically connected to the fifth part of the second intermediate electrode and a second end portion electrically connected to the seventh part of the third intermediate electrode; and a fourth light emitting element comprising a first end portion electrically connected to the eighth part of the third intermediate electrode and a second end portion electrically connected to the second electrode.

19. The pixel of claim 18, further comprising:

a first sub-electrode at a same layer as the first part of the first intermediate electrode and electrically connected to the first part;

a second sub-electrode at a same layer as the fourth part of the second intermediate electrode and electrically connected to the fourth part;

a third sub-electrode at a same layer as the seventh part of the third intermediate electrode and electrically connected to the seventh part; and a fourth sub-electrode at a same layer as the second electrode and electrically connected to the second electrode, wherein the first, second, third, and fourth sub-electrodes overlap with the first bank.

20. A display device comprising:

a plurality of pixels on a substrate, wherein each of the plurality of pixels comprises:

an emission area and a non-emission area;

a first bank located in the non-emission area, the first bank including an opening corresponding to the emission area;

a first electrode, a second electrode, and an intermediate electrode that are spaced from each other;

light emitting elements in the emission area, each of the light emitting elements comprising one end portion electrically connected to one of the first electrode, the second electrode, and the intermediate electrode and an other end portion electrically connected to another one of the first electrode, the second electrode, and the intermediate electrode; and a sub-bank located in the opening of the first bank and spaced from the first bank, and wherein the intermediate electrode detours around the sub-bank.

* * * * *